(12) United States Patent
Shimizu et al.

(10) Patent No.: US 10,366,949 B2
(45) Date of Patent: Jul. 30, 2019

(54) WIRING SUBSTRATE AND SEMICONDUCTOR DEVICE

(71) Applicant: Shinko Electric Industries Co., Ltd., Nagano-shi, Nagano-ken (JP)

(72) Inventors: Noriyoshi Shimizu, Nagano (JP); Yusuke Gozu, Nagano (JP); Jun Furuichi, Nagano (JP); Akio Rokugawa, Nagano (JP); Takashi Ito, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 0 days.

(21) Appl. No.: 15/866,686

(22) Filed: Jan. 10, 2018

(65) Prior Publication Data

US 2018/0166372 A1 Jun. 14, 2018

Related U.S. Application Data

(62) Division of application No. 14/791,670, filed on Jul. 6, 2015, now Pat. No. 9,875,957.

(30) Foreign Application Priority Data

Jul. 16, 2014 (JP) .................................. 2014-146231
Nov. 11, 2014 (JP) .................................. 2014-228803

(51) Int. Cl.
  *H01L 23/498* (2006.01)
  *H05K 1/11* (2006.01)
  (Continued)

(52) U.S. Cl.
  CPC .. *H01L 23/49822* (2013.01); *H01L 23/49811* (2013.01); *H01L 23/49827* (2013.01);
  (Continued)

(58) Field of Classification Search
  CPC ......... H01L 23/49822; H01L 23/49811; H01L 23/49827; H01L 23/49816;
  (Continued)

(56) References Cited

U.S. PATENT DOCUMENTS 6,217,987 B1 * 4/2001 Ono ........................ G03F 7/032
                                                     174/250
8,863,377 B2   10/2014 Harazono
(Continued)

FOREIGN PATENT DOCUMENTS

JP   2003-023252   1/2003
JP   2003-023253   1/2003

*Primary Examiner* — Steven T Sawyer
*Assistant Examiner* — Paresh H Paghadal
(74) *Attorney, Agent, or Firm* — Fish & Richardson P.C.

(57) ABSTRACT

A wiring substrate includes a first wiring structure and a second wiring structure. The first wiring structure includes a first insulating layer, which covers a first wiring layer, and a via wiring. A first through hole of the first insulating layer is filled with the via wiring. The second wiring structure includes a second wiring layer and a second insulating layer. The second wiring layer is formed on an upper surface of the first insulating layer and an upper end surface of the via wiring. The second wiring layer partially includes a roughened surface. The second insulating layer is stacked on the upper surface of the first insulating layer and covers the second wiring layer. The second wiring structure has a higher wiring density than the first wiring structure. The roughened surface of the second wiring layer has a smaller surface roughness than the first wiring layer.

12 Claims, 39 Drawing Sheets

(51) Int. Cl.
*H01L 23/00* (2006.01)
*H05K 3/46* (2006.01)
*H05K 1/09* (2006.01)
*H01L 23/538* (2006.01)
*H01L 25/065* (2006.01)
*H01L 25/10* (2006.01)
*H05K 3/00* (2006.01)
*H05K 3/38* (2006.01)

(52) U.S. Cl.
CPC .............. *H01L 24/32* (2013.01); *H05K 1/111* (2013.01); *H05K 1/112* (2013.01); *H05K 1/115* (2013.01); *H05K 3/4644* (2013.01); H01L 23/49816 (2013.01); H01L 23/49833 (2013.01); H01L 23/49894 (2013.01); H01L 23/5389 (2013.01); H01L 24/13 (2013.01); H01L 24/16 (2013.01); H01L 24/29 (2013.01); H01L 24/81 (2013.01); H01L 24/83 (2013.01); H01L 24/92 (2013.01); H01L 25/0655 (2013.01); H01L 25/105 (2013.01); H01L 2224/131 (2013.01); H01L 2224/13111 (2013.01); H01L 2224/13116 (2013.01); H01L 2224/13144 (2013.01); H01L 2224/16227 (2013.01); H01L 2224/16237 (2013.01); H01L 2224/16238 (2013.01); H01L 2224/26175 (2013.01); H01L 2224/2919 (2013.01); H01L 2224/32225 (2013.01); H01L 2224/32237 (2013.01); H01L 2224/73204 (2013.01); H01L 2224/8149 (2013.01); H01L 2224/81191 (2013.01); H01L 2224/81444 (2013.01); H01L 2224/81447 (2013.01); H01L 2224/81801 (2013.01); H01L 2224/83104 (2013.01); H01L 2224/83855 (2013.01); H01L 2224/92125 (2013.01); H01L 2225/1023 (2013.01); H01L 2225/1041 (2013.01); H01L 2225/1058 (2013.01); H01L 2924/15311 (2013.01); H01L 2924/3511 (2013.01); H05K 1/095 (2013.01); H05K 1/114 (2013.01); H05K 3/0073 (2013.01); H05K 3/383 (2013.01); H05K 2201/0195 (2013.01); H05K 2201/09845 (2013.01); H05K 2203/0392 (2013.01)

(58) Field of Classification Search
CPC ......... H01L 23/49833; H01L 23/49894; H01L 23/5389; H01L 24/13; H01L 24/16; H01L 24/29; H01L 24/32; H01L 24/81; H01L 24/83; H01L 24/92; H01L 2224/131; H01L 2224/13111; H01L 2224/13116; H01L 2224/13144; H01L 2224/16227; H01L 2224/16237; H01L 2224/16238; H01L 2224/26175; H01L 2224/2919; H01L 2225/1023; H01L 2225/1041; H01L 2225/1058; H01L 2224/32225; H01L 2224/32237; H01L 2224/73204; H01L 2224/81191; H01L 2224/81444; H01L 2224/81447; H01L 2224/8149; H01L 2224/81801; H01L 2224/83104; H01L 2224/83855; H01L 2224/92125; H05K 2201/0195; H05K 2201/09845; H05K 3/0073; H05K 3/383; H05K 1/095; H05K 1/111; H05K 1/112; H05K 1/115; H05K 1/0303

See application file for complete search history.

(56) References Cited

U.S. PATENT DOCUMENTS

| | | | |
|---|---|---|---|
| 2004/0007313 A1* | 1/2004 | Day | H05K 1/0242 |
| | | | 156/153 |
| 2004/0235287 A1* | 11/2004 | Inoue | H01L 21/4846 |
| | | | 438/612 |
| 2006/0278963 A1* | 12/2006 | Harada | H05K 1/0265 |
| | | | 257/668 |
| 2011/0198114 A1 | 8/2011 | Maeda | |
| 2011/0314666 A1* | 12/2011 | Harazono | H05K 3/4644 |
| | | | 29/832 |
| 2012/0247814 A1* | 10/2012 | Shimizu | H01L 21/4857 |
| | | | 174/251 |
| 2012/0300425 A1* | 11/2012 | Nakashima | H01L 23/49838 |
| | | | 361/761 |

* cited by examiner

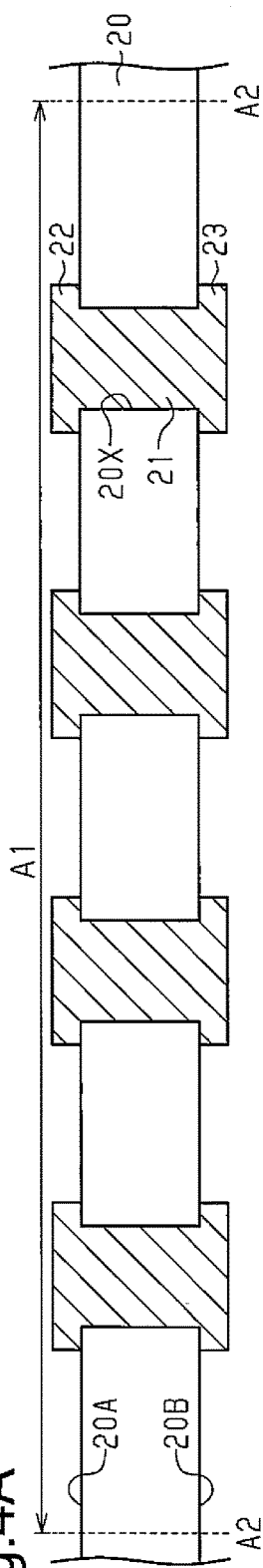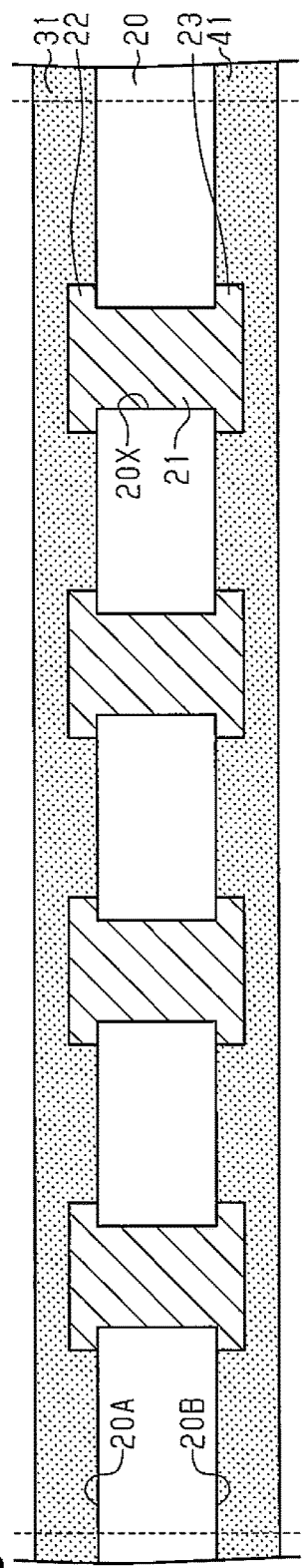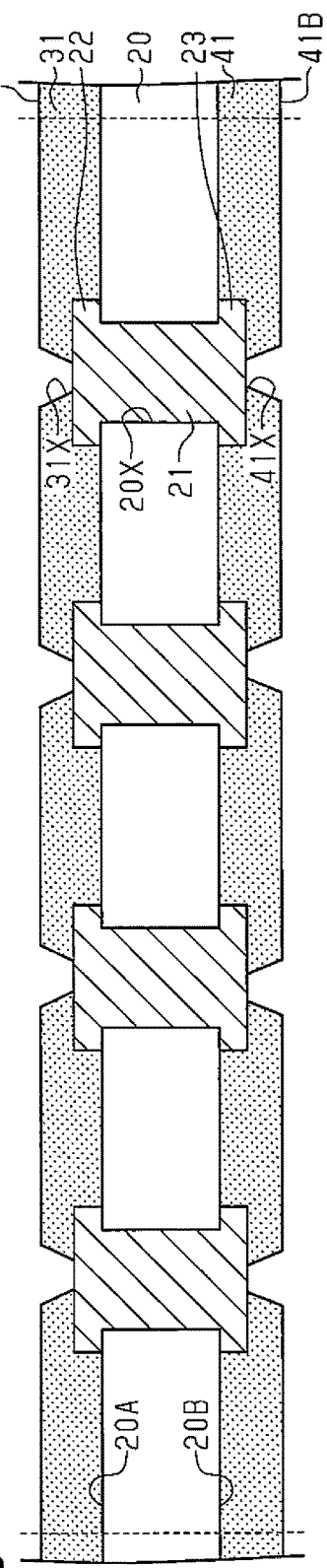

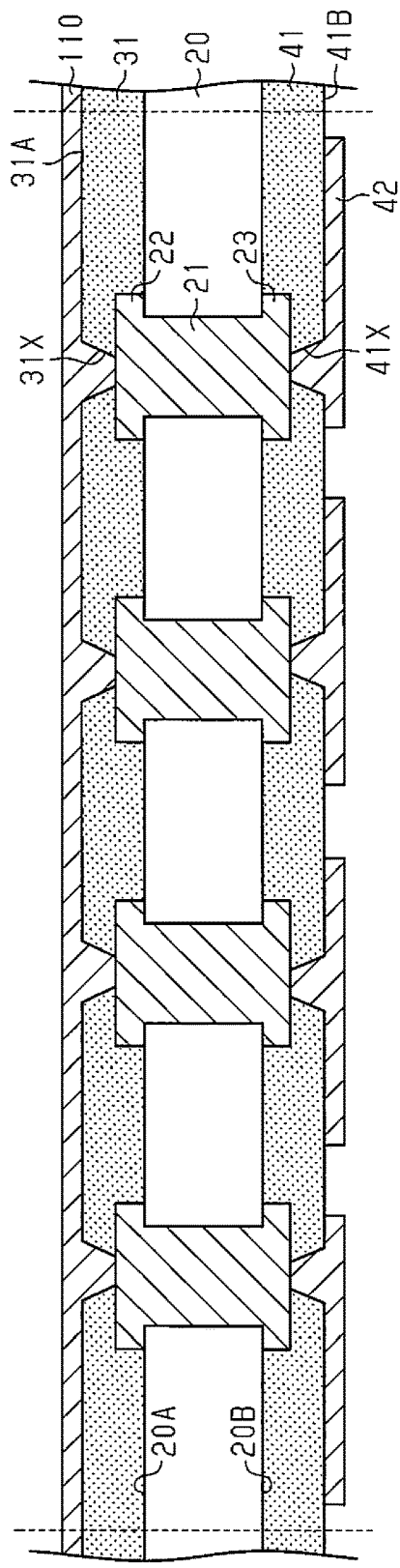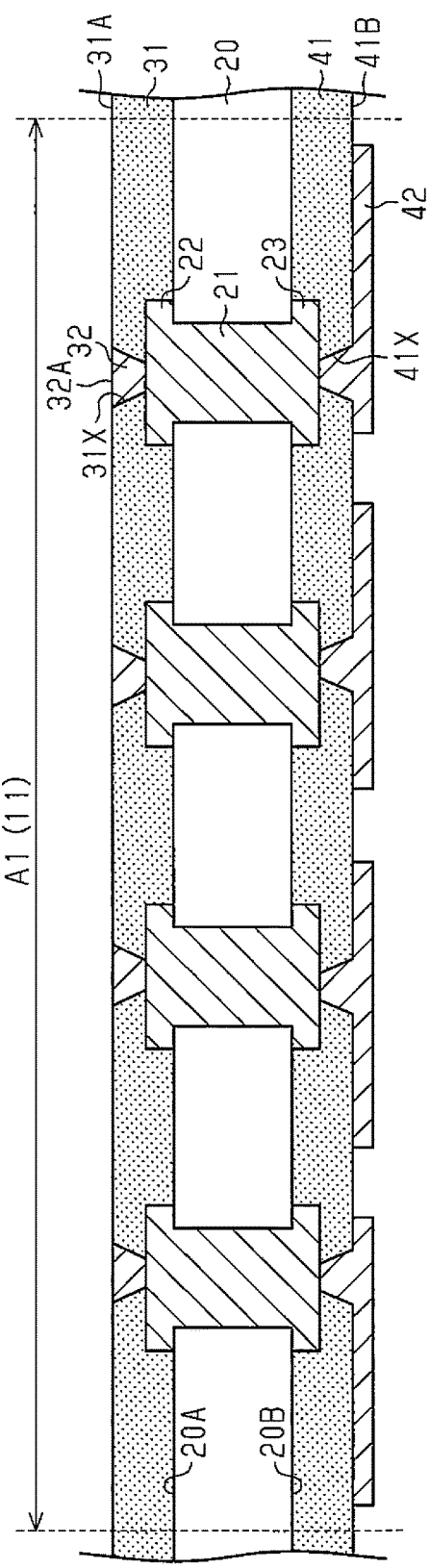

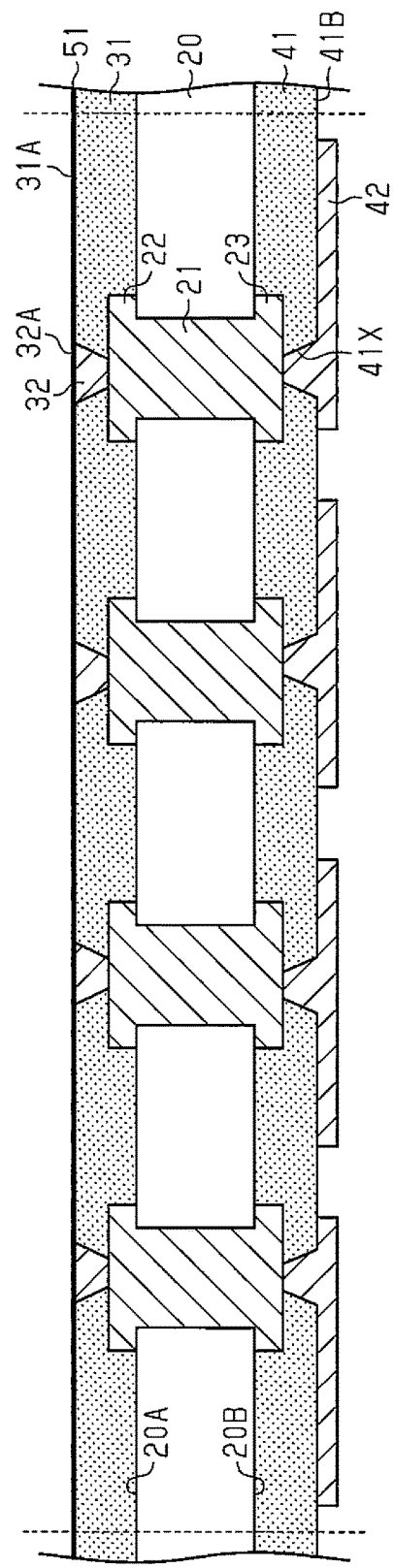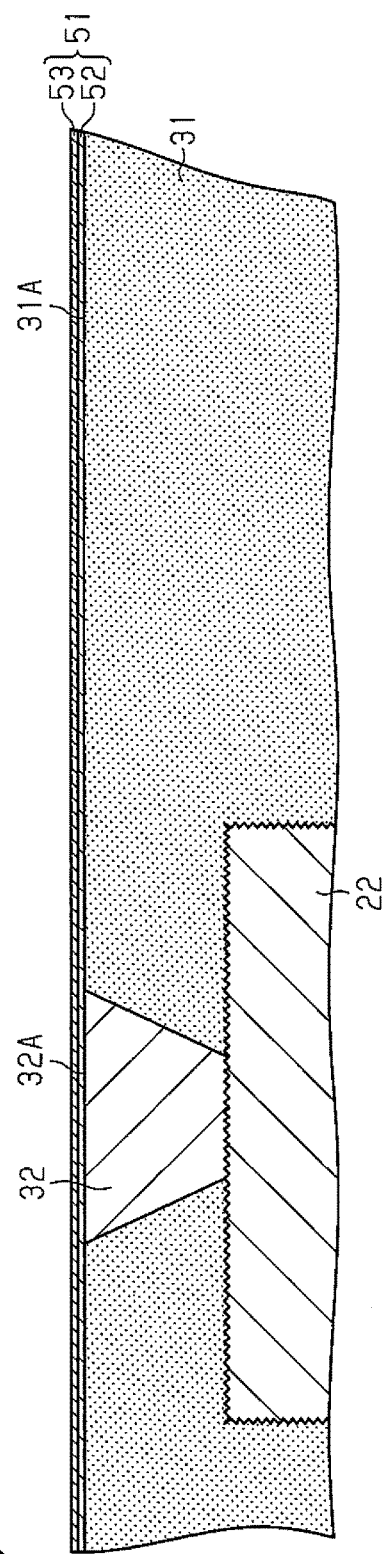

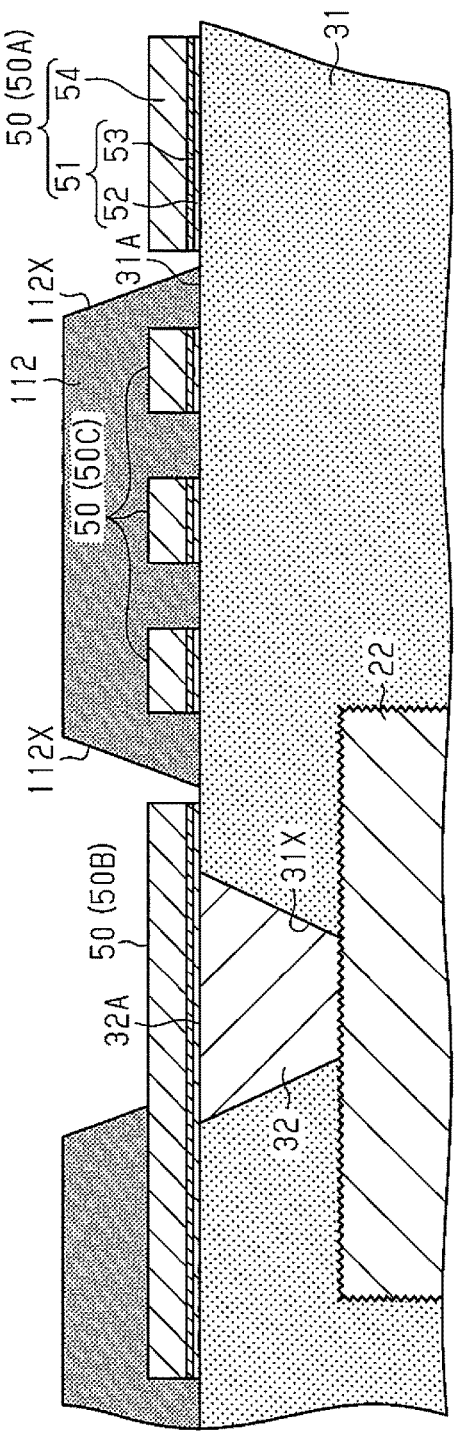
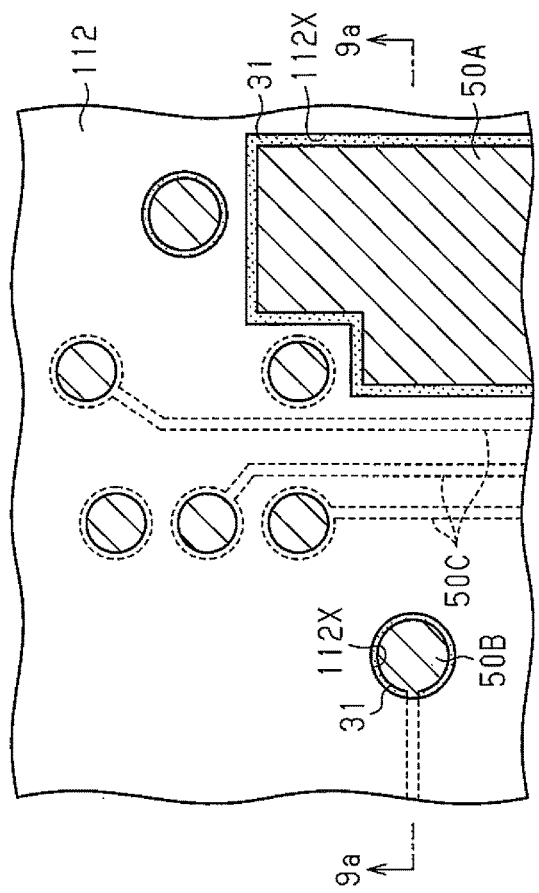

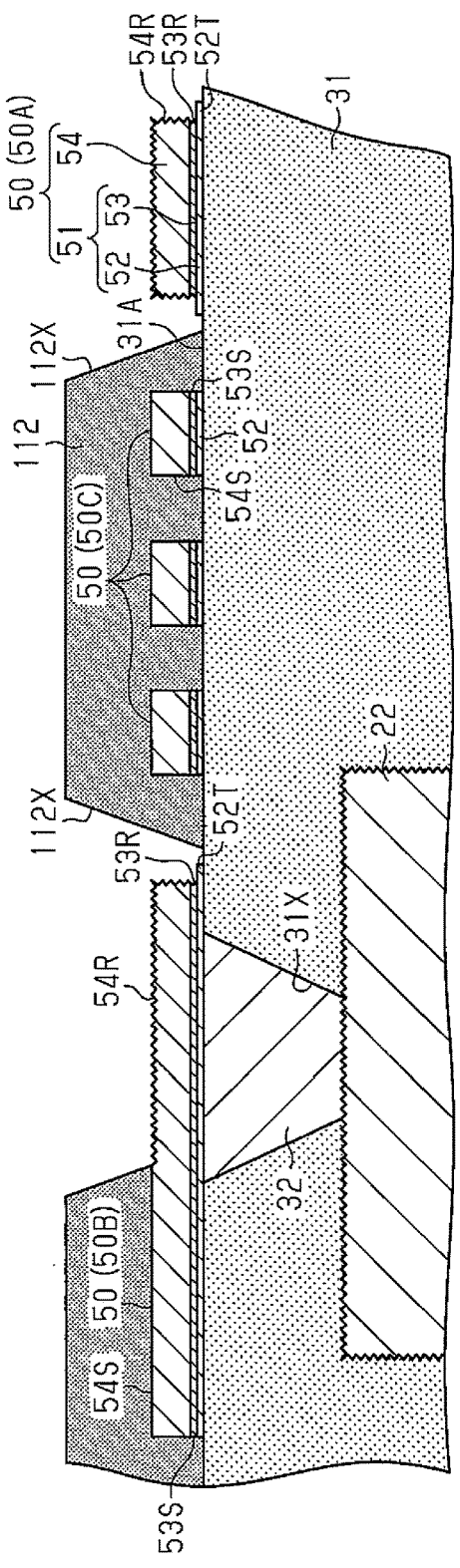
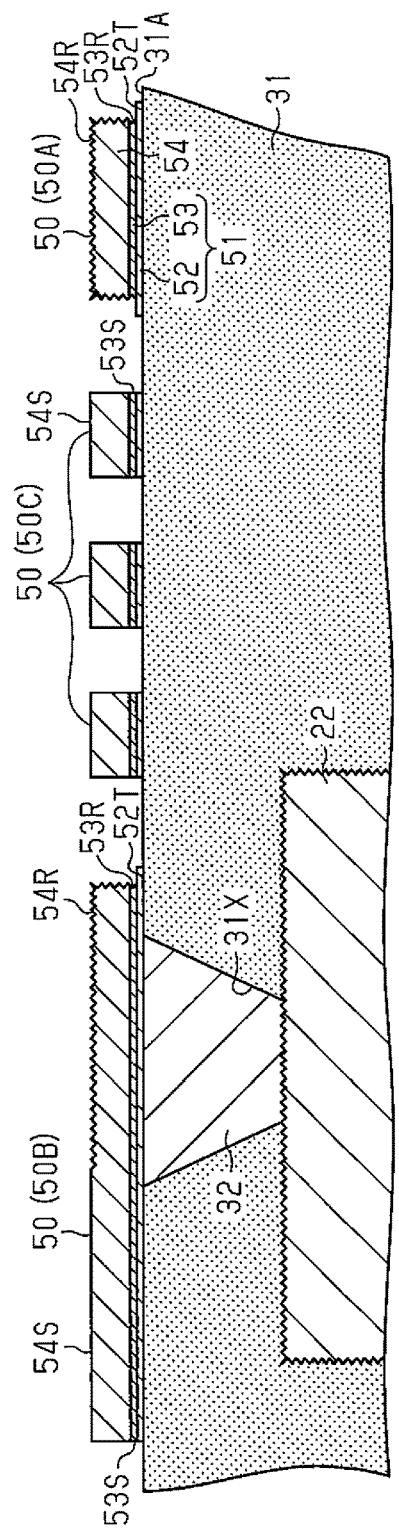
Fig.10A
Fig.10B

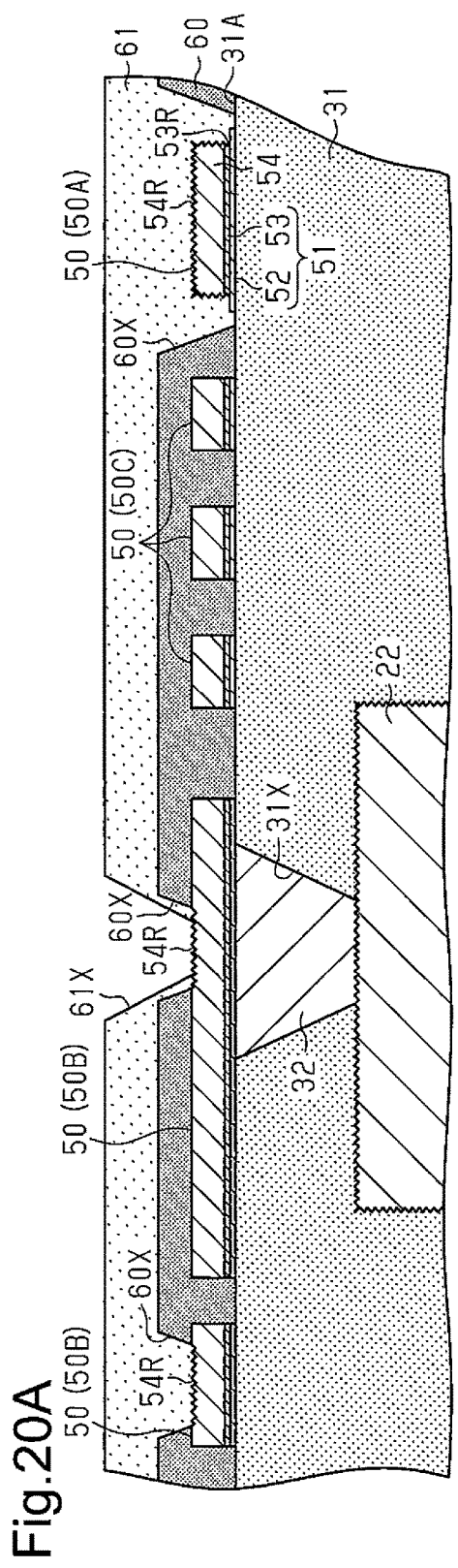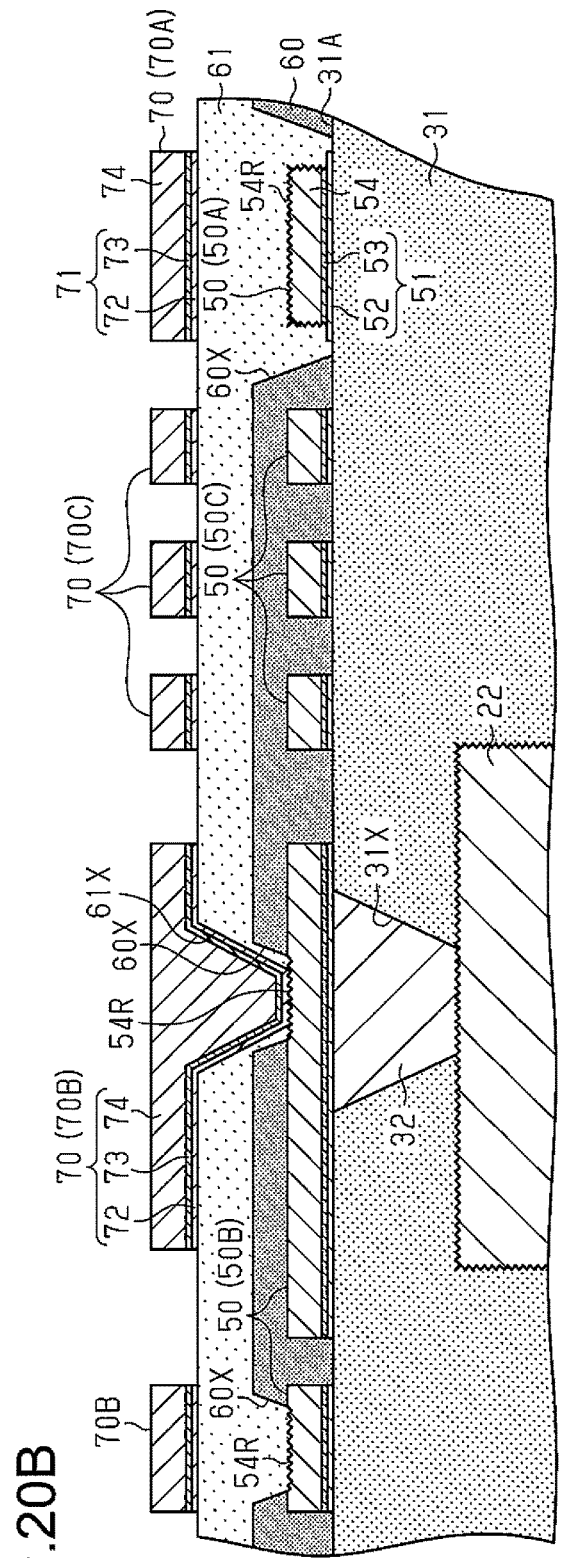

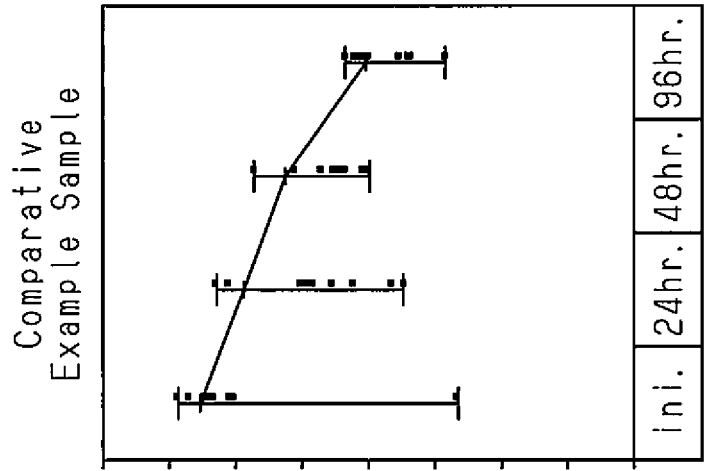
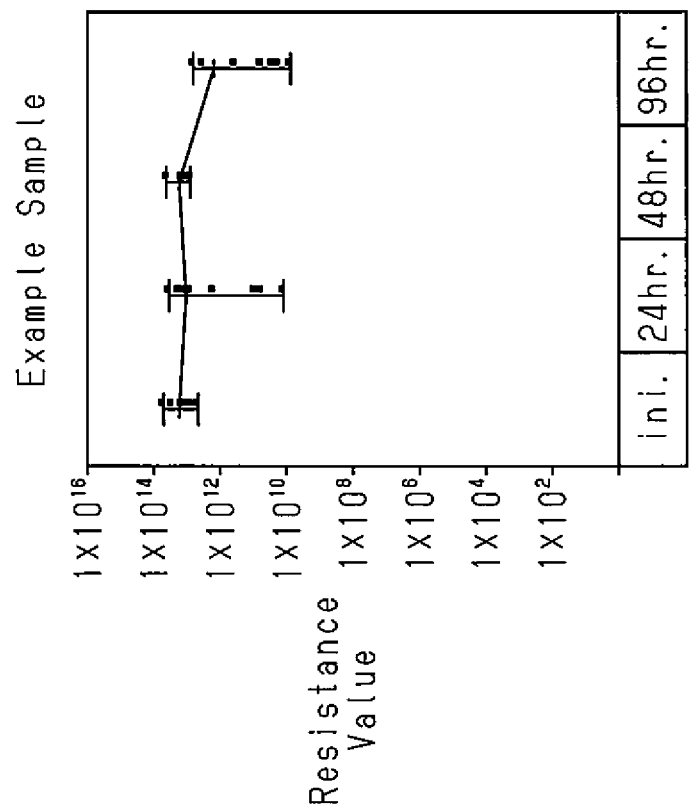

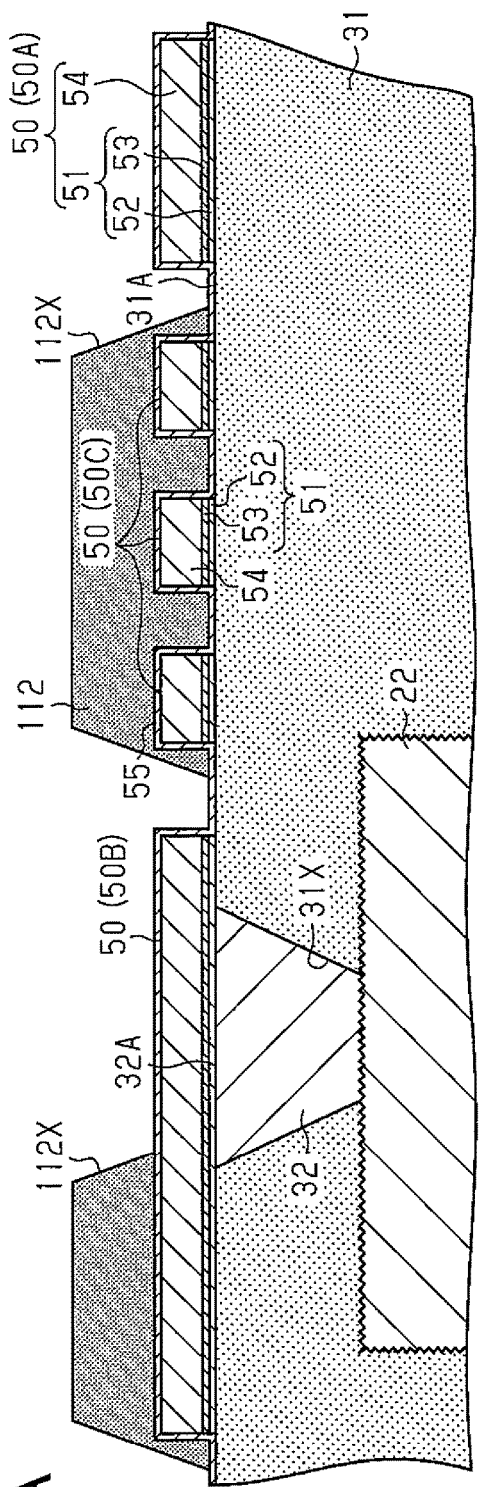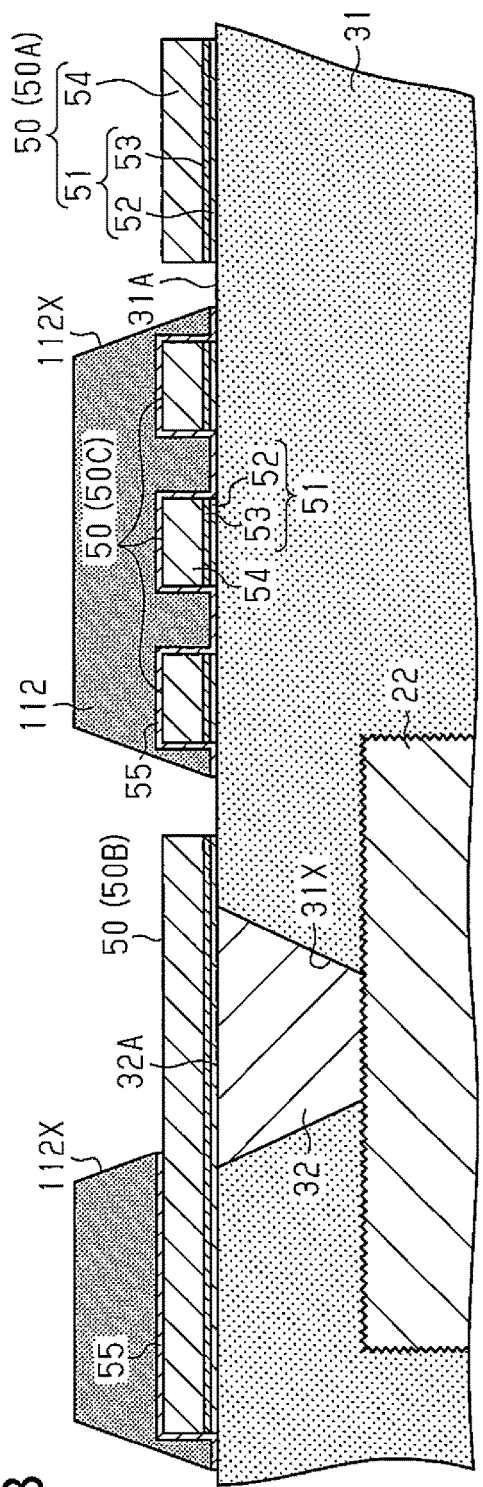

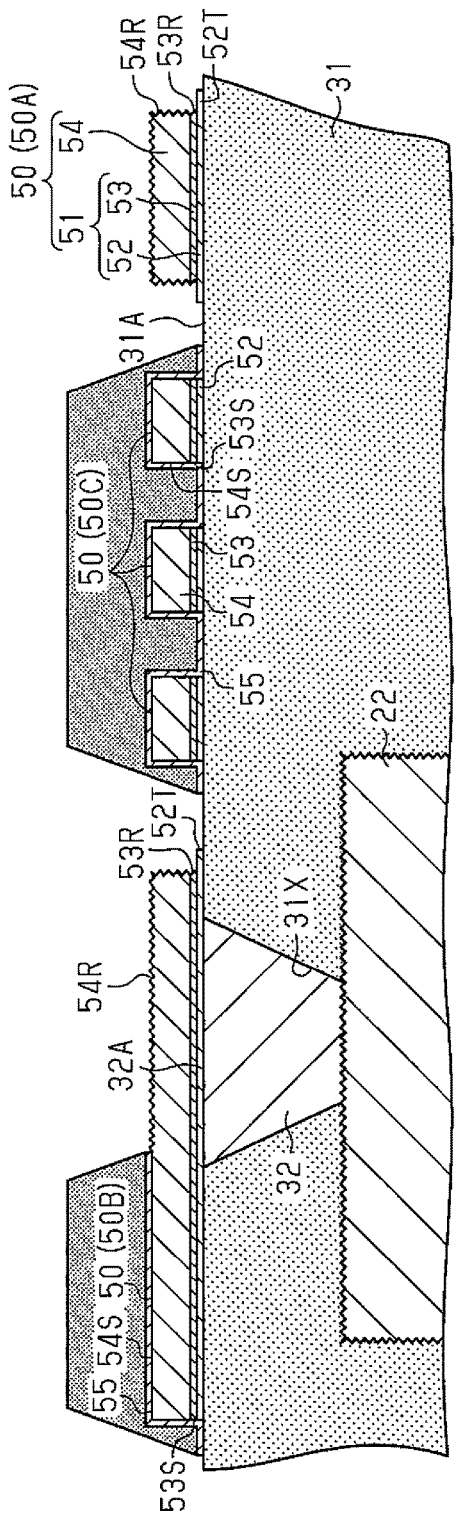
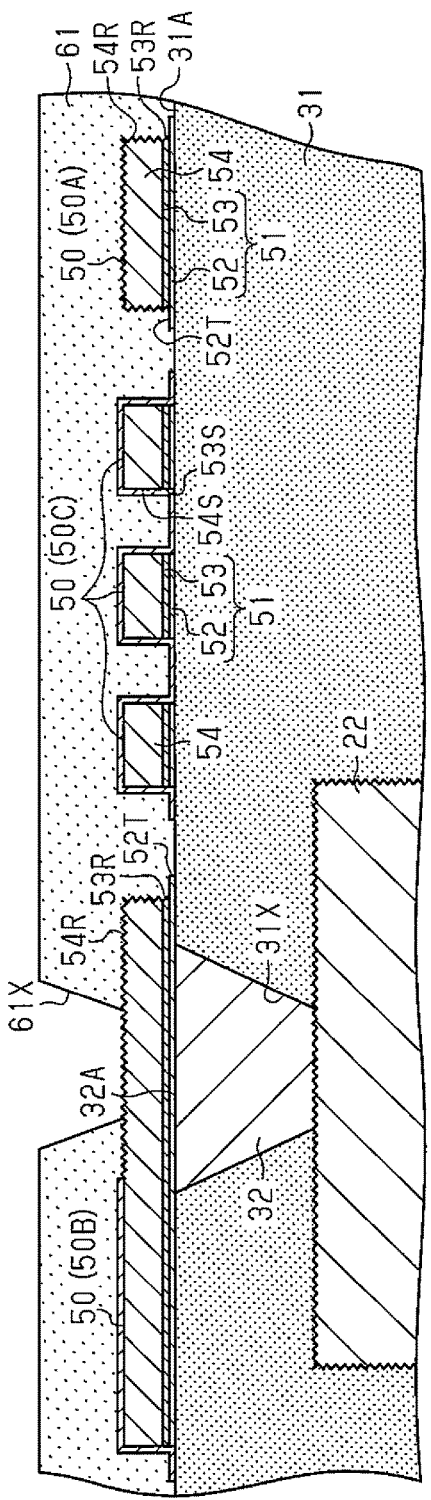
Fig.27A
Fig.27B

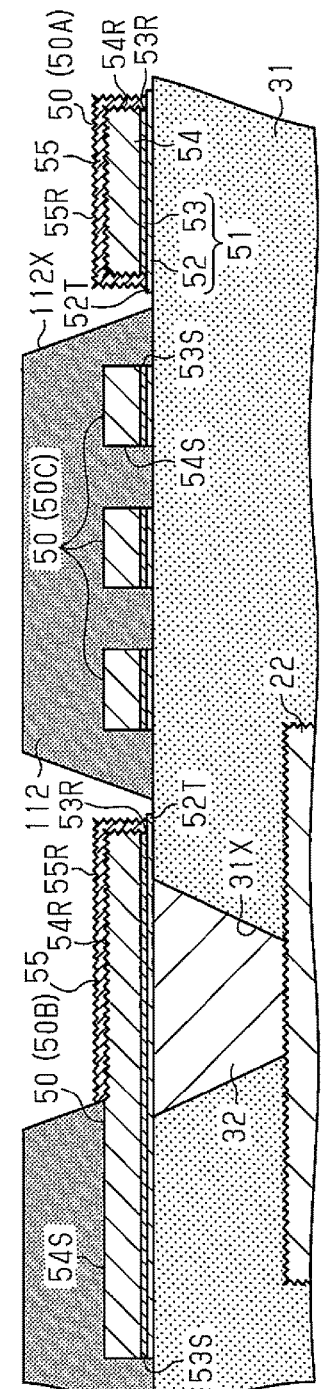
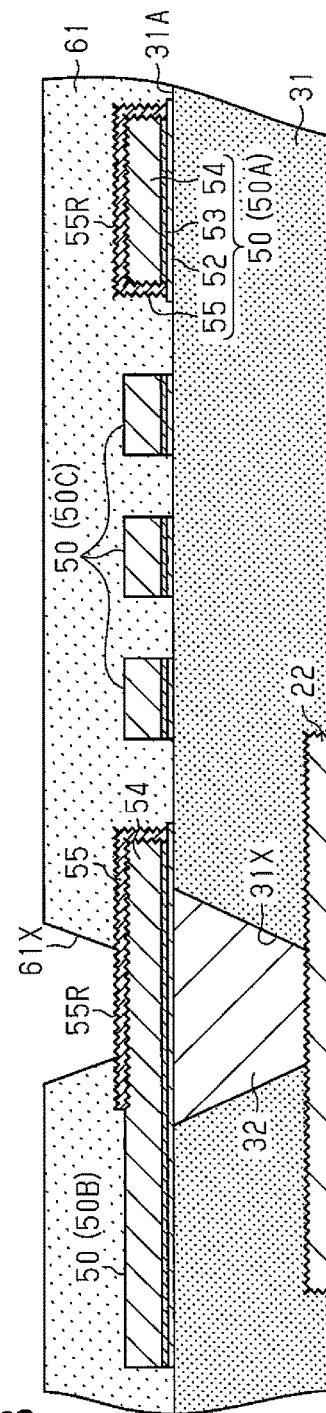
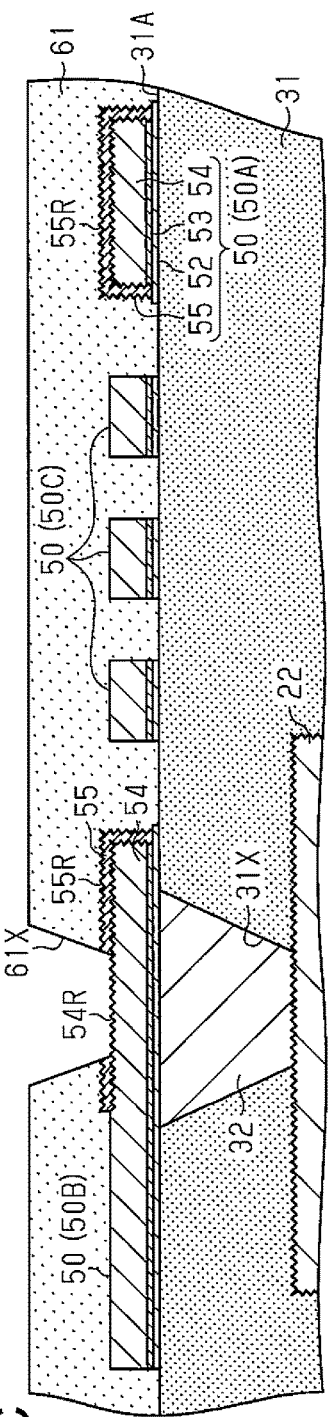
Fig. 31A
Fig. 31B
Fig. 31C

WIRING SUBSTRATE AND SEMICONDUCTOR DEVICE

CROSS-REFERENCE TO RELATED APPLICATIONS

This application is a divisional application of U.S. patent application Ser. No. 14/791,670, filed on Jul. 6, 2015, which is based upon and claims the benefit of priority from prior Japanese Patent Applications No. 2014-146231, filed on Jul. 16, 2014, and No. 2014-228803, filed on Nov. 11, 2014, the entire contents of each of which are incorporated herein by reference.

FIELD

This disclosure relates to a wiring substrate, a semiconductor device, and a method for manufacturing the wiring substrate.

Electronic components such as semiconductor elements are mounted on a wiring substrate. Such a wiring substrate undergoes a build-up process to increase the density of wiring patterns. Japanese Laid-Open Patent Publication Nos. 2003-023252 and 2003-023253 each describe a wiring substrate including a core substrate. The build-up process stacks wiring layers and insulating layers on the upper and lower surfaces of the core substrate. In this type of wiring substrate, a roughening process is performed on the wiring layer to increase the adhesion between a wiring layer and an insulating layer that covers the wiring layer.

SUMMARY

When wiring layers are further miniaturized, the roughening process greatly changes the shape of the wiring layers. Thus, the wiring layer may not obtain the desired planar shape. Furthermore, when the roughening process is performed on a miniaturized wiring layer, that is, a thin wiring layer including narrow wirings, many voids are formed in the wiring layer. This increases the resistance of the wiring layer and lowers the reliability of the electrical properties.

One aspect of this disclosure is a wiring substrate including a first wiring structure and a second wiring structure stacked on the first wiring structure. The first wiring structure includes a first wiring layer, a first insulating layer, and a via wiring. The first insulating layer covers the first wiring layer. The first insulating layer includes a first through hole that extends through the first insulating layer in a thicknesswise direction to expose an upper surface of the first wiring layer. The via wiring includes an upper end surface exposed from an upper surface of the first insulating layer. The first through hole of the first insulating layer is filled with the via wiring. The second wiring structure includes a second wiring layer and a second insulating layer. The second wiring layer is formed on the upper surface of the first insulating layer and the upper end surface of the via wiring. The second wiring layer partially includes a roughened surface. The second insulating layer is stacked on the upper surface of the first insulating layer and covers the second wiring layer. The second wiring structure has a higher wiring density than the first wiring structure. The roughened surface of the second wiring layer has a smaller surface roughness than the first wiring layer.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 4A to 4C, 5A, 5B, 6A, 6B, 7A, 7B, 8A, 8B, 9A, 10A, 10B, 11A, 11B, 12A, 12B, and 13 to 16 are schematic cross-sectional views illustrating a method for manufacturing the wiring substrate illustrated in FIG. 1, and FIG. 9B is a plan view of the structure illustrated in FIG. 9A, wherein FIG. 6B is a partially enlarged cross-sectional view of the structure illustrated in FIG. 6A, FIG. 7B is a partially enlarged cross-sectional view of the structure illustrated in FIG. 7A, FIG. 9A is a partially enlarged cross-sectional view of the structure illustrated in FIG. 8B (cross-sectional view taken along line 9a-9a in FIG. 9B), FIG. 11B is a partially enlarged cross-sectional view of the structure illustrated in FIG. 11A, and FIG. 12B is a partially enlarged cross-sectional view of the structure illustrated in FIG. 12A;

FIGS. 20A and 20B are enlarged cross-sectional views illustrating a method for manufacturing a modified example of a wiring substrate;

FIGS. 24A and 24B are graphs illustrating a measurement result of an insulating resistance between the wirings after a HAST test;

FIGS. 25A, 25B, 26A, 26B, 27A, 27B, and 28 are enlarged cross-sectional views illustrating a method for manufacturing a wiring substrate in a fourth embodiment;

FIGS. 31A to 31C are enlarged cross-sectional views illustrating a method for manufacturing the wiring substrate in the modified example;

DETAILED DESCRIPTION OF THE EMBODIMENTS

Figure 1:
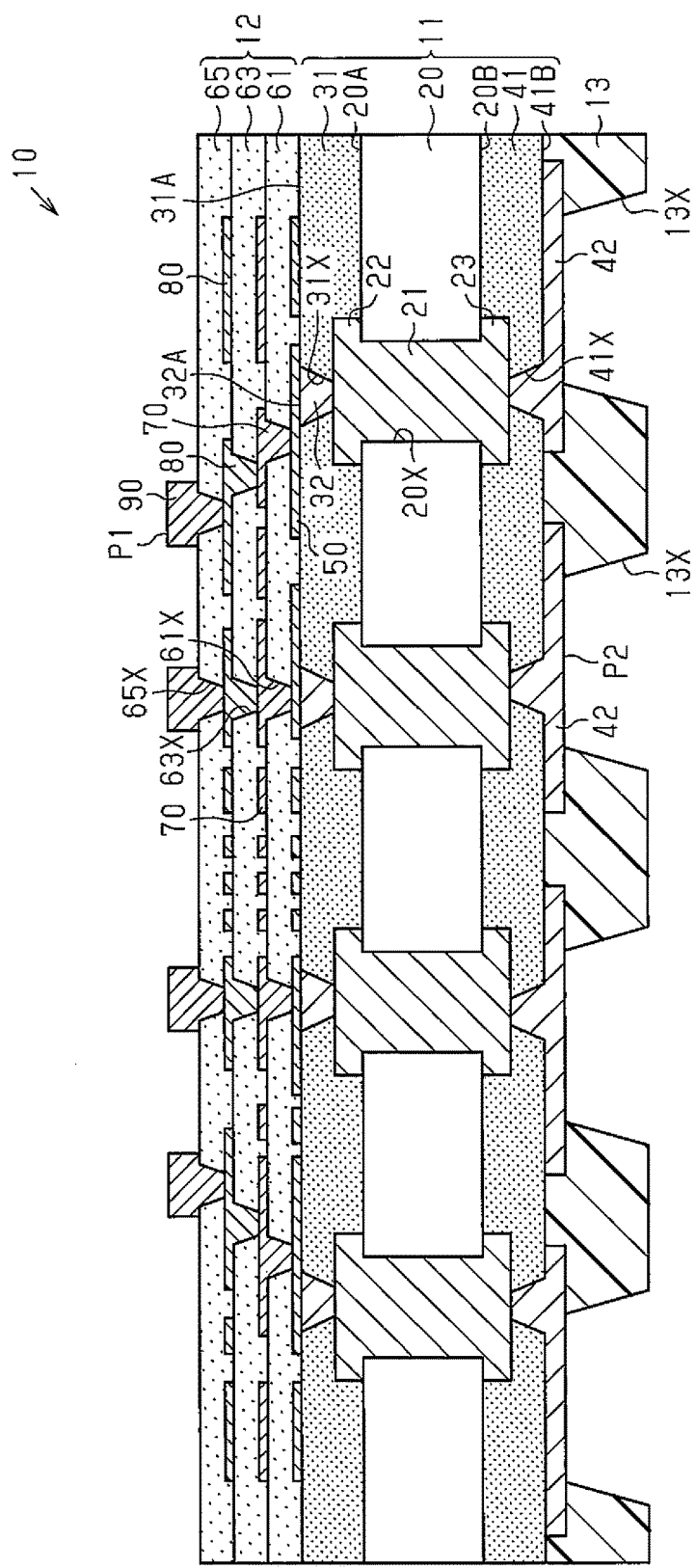
FIG. 1 is a schematic cross-sectional view illustrating a wiring substrate in a first embodiment.

Embodiments will now be described with reference to the drawings. In the drawings, elements are illustrated for simplicity and clarity and have not necessarily been drawn to scale. To facilitate understanding, hatching lines may not be illustrated or be replaced by shading in the cross-sectional drawings.

First Embodiment

A first embodiment will now be described with reference to FIGS. 1 to 16. As illustrated in FIG. 1, a wiring substrate 10 includes a wiring structure 11, a wiring structure 12, and a solder resist layer 13. The wiring structure 12 is stacked on one of an upper surface and a lower surface of the wiring structure 11 (here, upper surface of wiring structure 11), and the solder resist layer 13 is stacked on the other one of the upper surface and the lower surface of the wiring structure 11 (here, lower surface of wiring structure 11). The wiring substrate 10 may have any planar shape and size. For example, the wiring substrate 10 may have a square planar shape having the dimensions of approximately 20 mm×20 mm to 40 mm×40 mm.

First, the wiring structure 11 will be described.

The wiring structure 11 includes a low density wiring layer having a lower wiring density than the wiring structure 12. The wiring structure 11 includes a core substrate 20, an insulating layer 31 stacked on an upper surface 20A of the core substrate 20, and an insulating layer 41 stacked on a lower surface 20B of the core substrate 20.

A non-photosensitive insulative resin, the main component of which is a thermosetting resin, for example, may be used as the material of the core substrate 20 and the insulating layers 31, 41. Alternatively, for example, an insulative resin obtained by mixing a reinforcement material in a thermosetting resin may be used as the material of the core substrate 20 and the insulating layers 31, 41. For example, a glass epoxy resin may be used as the material of the core substrate 20 and the insulating layers 31, 41. The glass epoxy resin is formed by impregnating a glass cloth (glass woven cloth), which is a reinforcement material, with a thermosetting insulative resin, of which the main component is an epoxy-based resin, curing the resin. The reinforcement material is not limited to the glass cloth. For example, a glass unwoven cloth, an aramid woven cloth, an aramid unwoven cloth, a liquid crystal polymer (LCP) woven cloth, an LCP unwoven cloth, or the like may be used as the reinforcement material. The thermosetting insulative resin is not limited to the epoxy resin. For example, the insulative resin such as polyimide resin, cyanate resin, and the like can be used. The core substrate 20 and the insulating layers 31, 41 may contain, for example, a filler such as silica, alumina, or the like.

The core substrate 20 is arranged near the center of the wiring structure 11 in a thickness-wise direction. The core substrate 20 has a thickness of, for example, approximately 60 to 1000 µm. Through holes 20X are formed at certain locations (four locations in FIG. 1) in the core substrate 20. Each through hole 20X extends through the core substrate 20 from the upper surface 20A to the lower surface 20B. A through electrode 21 that extends through the core substrate 20 in the thickness-wise direction is formed in each through hole 20X. In the present example, the through hole 20X is filled with the through electrode 21. Although not illustrated in the drawings, the through hole 20X and the through electrode 21 are, for example, formed to have a circular shape in a plan view, and have diameters of, for example, approximately 50 to 200 µm. The through holes 20X (through electrodes 21) are arranged at a pitch of, for example, approximately 100 to 500 µm. Copper (Cu) and copper alloy, for example, may be used as the material of the through electrode 21.

A wiring layer 22 is formed on the upper surface 20A of the core substrate 20, and a wiring layer 23 is formed on the lower surface 20B of the core substrate 20. The wiring layers 22, 23 are electrically connected to each other by the through electrodes 21. Copper and copper alloy, for example, may be used as the material of the wiring layers 22, 23. Each of the wiring layers 22, 23 has a thickness of, for example, approximately 15 to 35 µm. Each of the wiring layers 22, 23 is formed with a line and space (L/S) of, for example, approximately 20 µm/20 µm. The line and space (L/S) is defined by the wiring width (line L)/wiring distance (space S).

Figure 2:
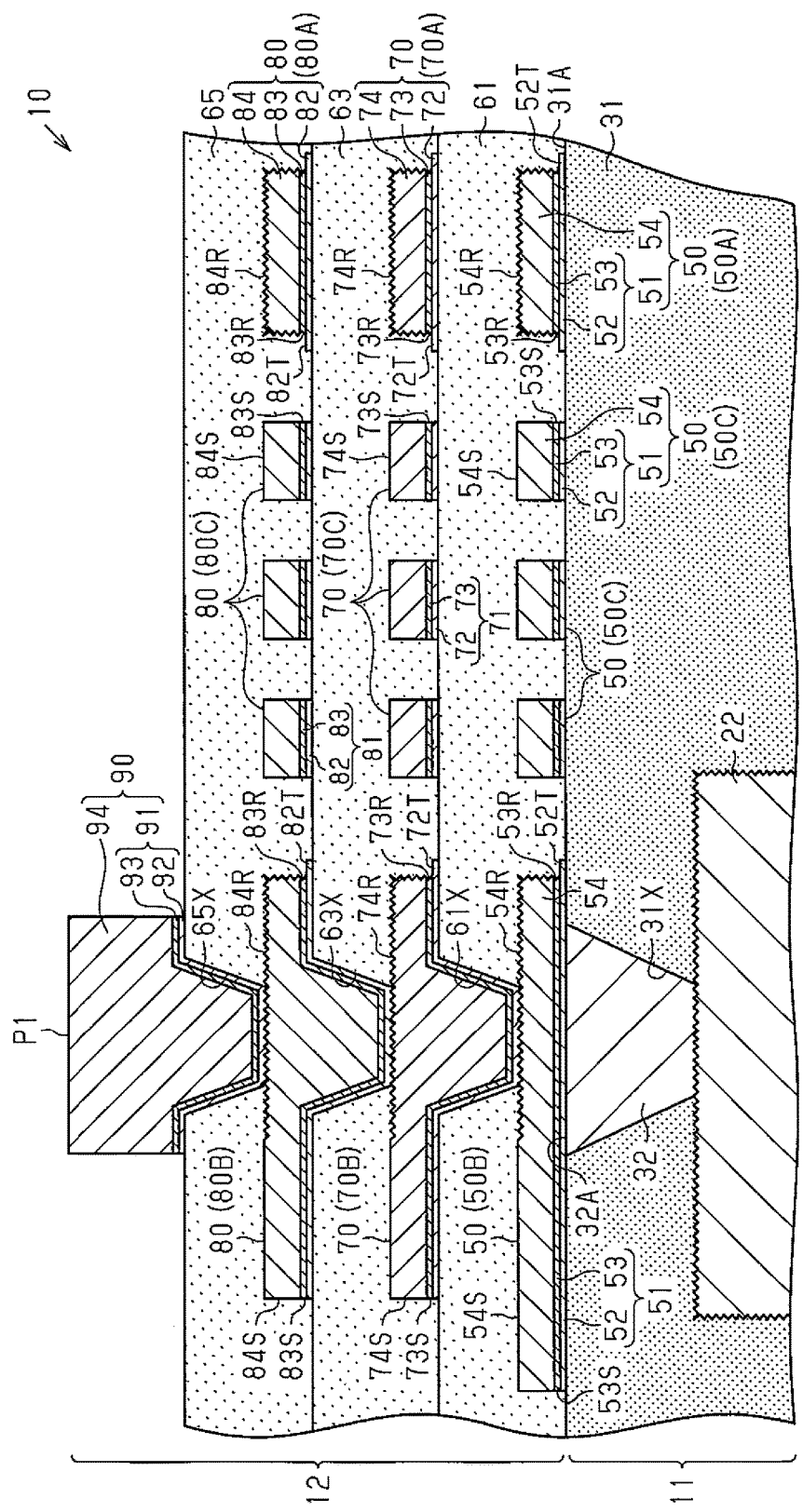
FIG. 2 is a partially enlarged cross-sectional view of the wiring substrate illustrated in FIG. 1.

As illustrated in FIG. 2, the surface (upper surface and side surface) of the wiring layer 22 is a roughened surface. The wiring layer 22 has, for example, a surface roughness Ra that is larger than or equal to 200 nm. The surface roughness Ra is referred to as an arithmetic average roughness, and is obtained from an arithmetic average of the absolute values of a height, which changes within a measurement region, from a surface, which is an average line. Like the wiring layer 22, the surface (lower surface and side surface) of the wiring layer 23 illustrated in FIG. 1 is also a roughened surface.

As illustrated in FIG. 1, an insulating layer 31, and via wirings 32 formed in the insulating layer 31 are stacked on the upper surface 20A of the core substrate 20.

The insulating layer 31 covers the wiring layer 22. The insulating layer 31 is, for example, thinner than the core substrate 20. For example, the insulating layer has a thickness of approximately 40 to 75 µm. The insulating layer 31 is, for example, an insulating layer containing a reinforcement material and has high mechanical strength (rigidity, hardness, etc.). A non-photosensitive insulative resin, the main component of which is a thermosetting resin, that does not contain a reinforcement material, for example, may be used as the material of the insulating layer 31.

Through holes 31X are formed in the insulating layer 31. Each through hole 31X, which opens at a certain location in an upper surface 31A of the insulating layer 31, extends through the insulating layer 31 in the thickness-wise direction to expose a portion of the upper surface of the wiring layer 22. The through hole 31X is tapered so that the diameter decreases from the upper side (side closer to wiring structure 12) toward the lower side (side closer to core substrate 20) in FIG. 1. For example, the through hole 31X has the shape of an inverted truncated cone in which the lower open end has a smaller diameter than the upper open end. The diameter of the upper open end of the through hole 31X is smaller than the diameter of the through electrode 21. For example, the diameter of the upper open end of the through hole 31X is approximately 50 to 70 µm.

The upper surface 31A of the insulating layer 31 is a smooth surface (low roughness surface) including few irregularities. For example, the upper surface 31A of the insulating layer 31 is a polished surface. The surface roughness of the upper surface 31A of the insulating layer 31 is, for example, smaller than the wall side surface of each through hole 31X and smaller than the lower surface 41B of the insulating layer 41. The upper surface 31A of the insulating layer 31 has, for example, a surface roughness Ra of approximately 15 nm to 40 nm. The wall surface of the through hole 31X and the lower surface 41B of the insulating layer 41 each have a surface roughness Ra of, for example, approximately 300 to 400 nm.

The via wiring 32 electrically connected to the wiring layer 22 is formed in each through hole 31X. The via wiring 32 extends through the insulating layer 31 in the thicknesswise direction. In the present example, the through hole 31X is filled by the via wiring 32. Like the through hole 31X, the via wiring 32 is tapered so that the diameter decreases from the upper side (side closer to wiring structure 12) toward the lower side (side closer to core substrate 20) in FIG. 1. For example, the via wiring 32 has the shape of a generally inverted truncated cone in which an upper end surface 32A has a larger diameter than a lower end surface. The diameter of the upper end surface 32A of the via wiring 32 is, for example, approximately 50 to 70 µm.

The upper end surface 32A of the via wiring 32 is exposed from the upper surface 31A of the insulating layer 31. For example, the upper end surface 32A of the via wiring 32 is substantially flush with the upper surface 31A of the insulating layer 31. Like the upper surface 31A of the insulating layer 31, the upper end surface 32A of the via wiring 32 is a smooth surface (low roughness surface) and includes few irregularities. For example, the upper end surface 32A of the via wiring 32 is a polished surface. The upper end surface 32A of the via wiring 32 has, for example, a surface roughness Ra of approximately 15 to 40 nm. Copper and copper alloy, for example, may be used as the material of the via wiring 32.

An insulating layer 41 and a wiring layer 42 are sequentially stacked on the lower surface 20B of the core substrate 20. The insulating layer 41 covers the wiring layer 23. The insulating layer 41 is thinner than, for example, the core substrate 20. For example, the insulating layer 41 has a thickness of approximately 40 to 75 µm. The insulating layer 41 is, for example, an insulating layer containing a reinforcement material and has a high mechanical strength. A non-photosensitive insulative resin, the main component of which is a thermosetting resin, that does not contain the reinforcement material, for example, may be used as the material of the insulating layer 41.

The wiring layer 42 is formed on the lower surface 41B of the insulating layer 41. The wiring layer 42 is electrically connected to the wiring layer 23. The wiring layer 42 includes via wirings, which fill the through holes 41X, and a wiring pattern, which is formed on the lower surface 41B of the insulating layer 41. For example, the wiring layer 42 has a thickness of approximately 15 to 35 µm and is formed with a line and space (L/S) of approximately 20 µm/20 µm. Copper and copper alloy, for example, may be used as the material of the wiring layer 42.

The wiring structure 12 will now be described.

The wiring structure 12 is stacked on the upper surface 31A of the insulating layer 31 (uppermost insulating layer) of the wiring structure 11. The wiring structure 12 includes a high density wiring layers having higher wiring densities than the wiring structure 11.

The wiring structure 12 has a structure in which a wiring layer 50, an insulating layer 61, a wiring layer 70, an insulating layer 63, a wiring layer 80, an insulating layer 65, and a wiring layer 90 are sequentially stacked on the insulating layer 31. The thickness of the wiring structure 12, that is, the total thickness of every one of the insulating layers 61, 63, 65 in the wiring structure 12 (i.e., thickness from the upper surface 31A of the insulating layer 31 to the upper surface of the insulating layer 65) is, for example, approximately 20 to 40 µm.

A photosensitive insulative resin, the main component of which is a phenol-based resin, a polyimide-based resin, or the like, for example, may be used as the material of the insulating layers 61, 63, 65. Further, for example, a photosensitive insulative resin, the main component of which is a silicone-based resin, an epoxy-based resin, a cycloolefin-based resin, a benzocyclobutene-based resin, or the like, may be used as the material of the insulating layers 61, 63, 65. The insulating layers 61, 63, 65 may contain a filler such as silica, alumina, or the like, for example.

The wiring layers 50, 70, 80, 90 are each finer than the wiring layers of the wiring structure 11. For example, each of the wiring layers 50, 70, 80, 90 is formed with a line and space (L/S) that is less than 10 µm/10 µm. Each of the wiring layers 50, 70, 80, 90 is thinner than the wiring layer of the wiring structure 11. For example, each of the wiring layers 50, 70, 80 has a thickness of approximately 1 to 3 µm. The wiring layer 90 has a thickness of, for example, approximately 10 to 15 µm. Furthermore, each insulating layer 61, 63, 65 is thinner than the insulating layer of the wiring structure 11. For example, each of the insulating layers 61, 63, 65 has a thickness of approximately 3 to 10 µm.

Each of the wiring layers 50, 70, 80, 90 has a smaller surface roughness than each of the wiring layers 22, 23, 42 of the wiring structure 11. For example, each of the wiring layer 50, 70, 80, 90 has a surface roughness Ra of approximately 1 to 30 nm. Each of the wiring layers 22, 23, 42 of the wiring structure 11 has, for example, the surface roughness Ra of approximately 200 to 1000 nm.

As illustrated in FIG. 2, the wiring layer 50 is stacked on the upper surface 31A of the insulating layer 31 so as to be connected to the upper end surface 32A of the via wiring 32. That is, the wiring layer 50 and the via wiring 32 are electrically connected when a portion of the lower surface of the wiring layer 50 contacts the upper end surface 32A of the via wiring 32. The wiring layer 50 and the via wiring 32 are electrically connected but are not integrally formed.

The wiring layer 50 includes a seed layer 51 formed on the upper end surface 32A of the via wiring 32 and a metal layer 54 formed on the seed layer 51. The metal layer 54 is connected to the via wiring 32 by the seed layer 51.

The seed layer 51 has a double-layer structure including a metal film 52 and a metal film 53. The metal film 52 covers the upper end surface 32A of the via wiring 32 and the upper surface 31A of the insulating layer 31. The metal film 53 covers the upper surface of the metal film 52. A metal film (sputter film) formed through a sputtering process, for example, may be used as the metal films 52, 53. The metal film 52, for example, functions as a metal barrier film that limits diffusion of copper from the metal film 53 and the metal layer 54 (e.g., Cu layer) to the insulating layer 31. A metal having a higher adhesiveness to the insulating layer 31 than the metal film 53 (e.g., copper) is preferable as the material of the metal film 52. A metal having a higher corrosion resistance than the metal film 53 (e.g., copper) is preferable as the material of the metal film 52. For example, titanium (Ti), titanium nitride (TiN), tantalum nitride (TaN), tantalum (Ta), chromium (Cr), or nickel copper alloy (NiCu) may be used as the material of the metal film 52. Copper and copper alloy, for example, may be used as the material of the metal film 53. The metal film 52 has a thickness of, for example, approximately 20 to 50 nm, and the metal film 53 has a thickness of, for example, approximately 100 to 300 nm.

The metal layer 54 covers the entire upper surface of the metal film 53. For example, copper or copper alloy may be used as the material of the metal layer 54.

The wiring layer 50 includes wiring patterns 50A to 50C on the same plane, for example. In the wiring pattern 50A, the surfaces (upper surface and side surface) of the metal layer 54 are entirely formed by a roughened surface 54R, and the surface (side surface) of the metal film 53 is entirely formed by a roughened surface 53R. In the wiring pattern 50A, part of the peripheral portion of the metal film 52 projects out of the roughened surfaces 53R, 54R. In other words, the metal film 52 of the wiring pattern 50A includes a projection 52T that projects out of the roughened surfaces 53R, 54R. Therefore, an upper surface of the projection 52T is exposed from the roughened surfaces 53R, 54R. The width of the projection 52T, that is, the projection amount of the peripheral portion of the metal film 52 is, for example, approximately 0.1 to 0.5 μm.

In the wiring pattern 50B, the metal layer 54 includes a roughened surface 54R and a smooth surface 54S having a smaller roughness than the roughened surface 54R. In other words, the surfaces (upper surface and side surface) of the metal layer 54 are partially formed by the roughened surface 54R, and the surface of the metal layer 54 excluding the roughened surface 54R is formed by the smooth surface 54S. In the wiring pattern 50B, the side surface of the metal film 53 includes the roughened surface 53R, which is continuous with the roughened surface 54R, and a smooth surface 53S, which is continuous with the smooth surface 54S. In the wiring pattern 50B, the metal film 52 immediately below the roughened surface 53R includes the projection 52T that projects out of the roughened surfaces 53R, 54R. In the wiring pattern 50B, the side surface of the metal film 52 that is located immediately below the side surface of the metal film 53 and the side surface of the metal layer 54, which are formed by the smooth surfaces 53S, 54S, is substantially flush with the smooth surfaces 53S, 54S in a plan view. In the present example, the surface of the metal layer 54 of the wiring pattern 50B that functions as a land is formed by the roughened surface 54R.

In the wiring pattern 50C, the entire surface (upper surface and side surface) of the metal layer 54 is formed by the smooth surface 54S, and the entire surface (side surface) of the metal film 53 is formed by the smooth surface 53S. In the wiring pattern 50C, the side surface of the metal film 52 is substantially flush with the side surface of the metal film 53 and the side surface of the metal layer 54.

In the wiring layer 50, when the side surface of the metal film 53 and the side surface of the metal layer 54 are the roughened surfaces 53R, 54R, the projection 52T, which projects out of the roughened surfaces 53R, 54R, is formed by the peripheral portion of the metal film 52. When the side surface of the metal film 53 and the side surface of the metal layer 54 are smooth surfaces 53S, 54S, the side surface of the metal film 52 is substantially flush with the smooth surfaces 53S, 54S in a plan view.

The roughened surface 54R is formed in the metal layer 54 that has a relatively large surface area (e.g., area of upper surface) in the wiring layer 50. The roughened surface 53R is formed by the metal film 53 that is located immediately below the roughened surface 54R. For example, the metal layer 54 of the wiring pattern 50A, which serves as a solid pattern such as a plane layer (e.g., power supply plane and GND plane) or the like, and the metal layer 54 of the wiring pattern 50B, which serves as a land, have a relatively large surface area. In contrast, the smooth surface 54S is formed in the metal layer 54 that has a relatively small surface area in the wiring layer 50. The smooth surface 53S is formed in the metal film 53 that is located immediately below the smooth surface 54S. For example, the metal layer 54 of the fine wiring pattern 50C with a small line and space (e.g., about L/S=2 μm/2 μm) has a relatively small surface area. The roughened surfaces 53R, 54R have a surface roughness that is larger than the smooth surfaces 53S, 54S and smaller than the wiring layers 22, 23, 42 of the wiring structure 11. For example, the roughened surfaces 53R, 54R have a surface roughness Ra of approximately 100 to 150 nm, and the smooth surfaces 53S, 54S have a surface roughness Ra of approximately 1 to 50 nm. As described above, the wiring layers 22, 23, 42 have, for example, a surface roughness Ra of approximately 200 to 1000 nm.

The insulating layer 61 is formed on the upper surface 31A of the insulating layer 31 to cover the wiring layer 50 (wiring patterns 50A to 50C). Through holes 61X are formed at certain locations in the insulating layer 61. The through holes 61X extend through the insulating layer 61 in the thickness-wise direction and expose portions of the upper surface of the wiring layer 50.

The wiring layer 70 is stacked on the upper surface of the insulating layer 61. The wiring layer 70 is electrically connected to the wiring layer 50. The wiring layer 70 includes via wirings, which fill the through holes 61X, and wiring patterns, which are formed on the upper surface of the insulating layer 61.

The wiring layer 70 includes a seed layer 71 and a metal layer 74. The seed layer 71 has a double-layer structure including a metal film 72 (metal barrier film), which continuously covers the inner surface of the through hole 61X and the upper surface of the insulating layer 61, and a metal film 73, which covers the upper surface of the metal film 72. The metal layer 74 covers the upper surface of the seed layer 71 (metal film 73). A material similar to that of the metal films 52, 53 and the metal layer 54, for example, may be used as the material of the metal films 72, 73 and the metal layer 74.

The wiring layer 70 includes wiring patterns 70A to 70C formed in the same manner as the wiring patterns 50A to 50C. In the wiring pattern 70A, the surfaces (upper surface and side surface) of the metal layer 74 are entirely formed by a roughened surface 74R, and the surface (side surface) of the metal film 73 is entirely formed by a roughened surface 73R. In the wiring pattern 70A, the projection 72T that projects out of the roughened surfaces 73R, 74R is formed by the peripheral portion of the metal film 72.

In the wiring pattern 70B, the roughened surface 74R and a smooth surface 74S form the surface (upper surface and side surface) of the metal layer 74, and the roughened surface 73R and a smooth surface 73S form the side surface of the metal film 73. Furthermore, the projection 72T that projects out of the roughened surfaces 73R, 74R is formed in the metal film 72 immediately below the roughened surface 73R. In the wiring pattern 70B, the side surface of the metal film 72 that is located immediately below the side surface of the metal film 73 and the side surface of the metal layer 74, which form the smooth surfaces 73S, 74S, is substantially flush with the smooth surfaces 73S, 74S in a plan view.

In the wiring pattern 70C, the entire surface (upper surface and side surface) of the metal layer 74 is formed by the smooth surface 74S, and the entire surface (side surface) of the metal film 73 is formed by the smooth surface 73S. The roughened surfaces 73R, 74R has a surface roughness that is larger than the smooth surfaces 73S, 74S and smaller than the wiring layers 22, 23, 42 of the wiring structure 11.

The insulating layer 63 is formed on the upper surface of the insulating layer 61 to cover the wiring layer 70 (wiring patterns 70A to 70C). Through holes 63X are formed at certain locations in the insulating layer 63. The through holes 63X extend through the insulating layer 63 in the thickness-wise direction and exposes portions of the upper surface of the wiring layer 70.

The wiring layer 80 is stacked on the upper surface of the insulating layer 63. The wiring layer 80 is electrically connected to the wiring layer 70. The wiring layer 80 includes via wirings that fill the through holes 63X and wiring patterns formed on the upper surface of the insulating layer 63.

The wiring layer 80 includes a seed layer 81 and a metal layer 84. The seed layer 81 has a double-layer structure including a metal film 82 (metal barrier film) that continuously covers the inner surface of the through hole 63X and the upper surface of the insulating layer 63, and a metal film 83 that covers the upper surface of the metal film 82. The metal layer 84 covers the upper surface of the seed layer 81 (metal film 83). A material similar to that of the metal films 52, 53 and the metal layer 54, for example, may be used as the material of the metal films 82, 83 and the metal layer 84.

The wiring layer 80 includes wiring patterns 80A to 80C formed in the same manner as the wiring patterns 50A to 50C. In the wiring pattern 80A, the surfaces (upper surface and side surface) of the metal layer 84 are entirely formed by a roughened surface 84R, and the surface (side surface) of the metal film 83 is entirely formed by a roughened surface 83R. In the wiring pattern 80A, a projection 82T that projects out of the roughened surfaces 83R, 84R is formed by the peripheral portion of the metal film 82.

In the wiring pattern 80B, the roughened surface 84R and a smooth surface 84S formed the surface (upper surface and side surface) of the metal layer 84, and the roughened surface 83R and a smooth surface 83S form the side surface of the metal film 83. Furthermore, the projection 82T that projects out of the roughened surfaces 83R, 84R is formed in the metal film 82 immediately below the roughened surface 83R. In the wiring pattern 80B, the side surface of the metal film 82 that is located immediately below the side surface of the metal film 83 and the side surface of the metal layer 84, which are formed by the smooth surfaces 83S, 84S, is substantially flush with the smooth surfaces 83S, 84S in a plan view.

In the wiring pattern 80C, the entire surface (upper surface and side surface) of the metal layer 84 is formed by the smooth surface 84S, and the entire surface (side surface) of the metal film 83 is formed by the smooth surface 83S. The roughened surfaces 83R, 84R have a surface roughness that is larger than the smooth surfaces 83S, 84S and smaller than the wiring layers 22, 23, 42 of the wiring structure 11.

The insulating layer 65 is formed on the upper surface of the insulating layer 63 to cover the wiring layer 80 (wiring patterns 80A to 80C). Through holes 65X are formed at certain locations in the insulating layer 65. The through holes 65X extend through the insulating layer 65 in the thickness-wise direction and expose portions of the upper surface of the wiring layer 80.

Each of the through holes 61X, 63X, 65X is tapered so that the diameter decreases from the upper side toward the lower side (side closer to the insulating layer 31) in FIG. 2. For example, each of the through holes 61X, 63X, 65X has the shape of a generally truncated cone in which the upper open end has a larger diameter than the lower open end. The upper open end of each of the through hole 61X, 63X, 65X has a diameter of, for example, approximately 10 to 20 μm.

The wiring layer 90 is stacked on the upper surface of the insulating layer 65. The wiring layer 90 is electrically connected to the wiring layer 80. The wiring layer 90 includes via wirings that fill the through holes 65X and pads P1 that project from the upper surface of the insulating layer 65.

The wiring layer 90 includes a seed layer 91 and a metal layer 94. The seed layer 91 has a double-layer structure including a metal film 92 (metal barrier film) that continuously covers the inner surface of the through hole 65X and the upper surface of the insulating layer 65 around the through hole 65X, and a metal film 93 that covers the upper surface of the metal film 92. The metal layer 94 covers the upper surface of the seed layer 91 (metal film 93). A material similar to that of the metal films 52, 53 and the metal layer 54, for example, may be used as the material of the metal films 92, 93 and the metal layer 94.

Each pad P1 may have any planar shape and size. For example, the pad P1 may have a circular planar shape in which the diameter is approximately 20 to 30 μm. The pads P1 are arranged at a pitch of, for example, approximately 40 to 60 μm. The pads P1 function as electronic component mounting pads electrically connected to an electronic component such as a semiconductor chip or the like.

A surface-processed layer may be formed on the surface (both of upper surfaces and side surfaces or only upper surfaces) of the pads P1 when necessary. Examples of the surface-processed layer include a gold (Au) layer, a nickel (Ni) layer/Au layer (metal layer in which Ni layer and Au layer are stacked in this order), an Ni layer/palladium (Pd) layer/Au layer (metal layer in which Ni layer, Pd layer, and Au layer are stacked in this order), or the like. An electroless plating metal layer formed by an electroless plating process, for example, may be used as the Ni layer, the Au layer, or the Pd layer. The Ni layer is a metal layer formed from an Ni or Ni alloy, the Au layer is a metal layer formed from an Au or Au alloy, and the Pd layer is a metal layer formed from a Pd or Pd alloy. An oxidation resistant process such as Organic Solderability Preservative (OSP) process or the like may be performed on the surface (both of upper surfaces and side surfaces or only upper surfaces) of the pads P1 to form an OSP film that functions as the surface-processed layer.

As illustrated in FIG. 1, the solder resist layer 13 is the outermost insulating layer (lowermost insulating layer herein) of the wiring substrate 10. The solder resist layer 13 is formed on the lower surface of the wiring structure 11 (lower surface 41B of the lowermost insulating layer 41 of the wiring structure 11) to cover the lowermost wiring layer 42.

The solder resist layer 13 includes openings 13X exposing portions of the lowermost wiring layer 42 as external connection pads P2. An external connection terminal such as a solder ball, a lead pin, or the like used when mounting the wiring substrate 10 on a mounting substrate, such as a motherboard or the like, is connected to the external connection pad P2. The surface-processed layer may be formed on the wiring layer 42 exposed from the openings 13X when necessary. Examples of the surface-processed layer include an Au layer, an Ni/Au layer, an Ni layer/Pd layer/Au layer, or the like. An anti-oxidation process such as an OSP process or the like may be performed on the lower surface of the external connection pad P2 to form the OSP film that functions as the surface-processed layer. The wiring layer 42 exposed from the opening 13X may be used as the external connection terminal. Alternatively, if the surface-processed layer is formed on the wiring layer 42, the surface-processed layer may be used as the external connection terminal.

The external connection pads P2 and the openings 13X may each have any planar shape and size. For example, the external connection pads P2 and the openings 13X may have circular planar shapes having a diameter of approximately 200 to 300 μm. A photosensitive insulative resin, the main component of which is a phenol-based resin, a polyimide-based resin, or the like, for example, may be used as the material of the solder resist layer 13. A photosensitive insulative resin, of which the main component is a silicone-based resin, an epoxy-based resin, a cycloolefin-based resin, a benzocyclobutene-based resin, or the like, may also be used as the material of the solder resist layer 13. The solder resist layer 13 may contain, for example, a filler such as silica, alumina, or the like.

The thickness of the solder resist layer 13, that is, the thickness from the lower surface 41B of the insulating layer 41 to the lower surface of the solder resist layer 13 is set to be greater than or equal to the thickness of the wiring structure 12. The warpage amount of the wiring substrate 10 can be reduced by setting the thickness of the solder resist layer 13 in such a manner. The solder resist layer 13 has a thickness of, for example, approximately 20 to 40 μm.

Figure 3:
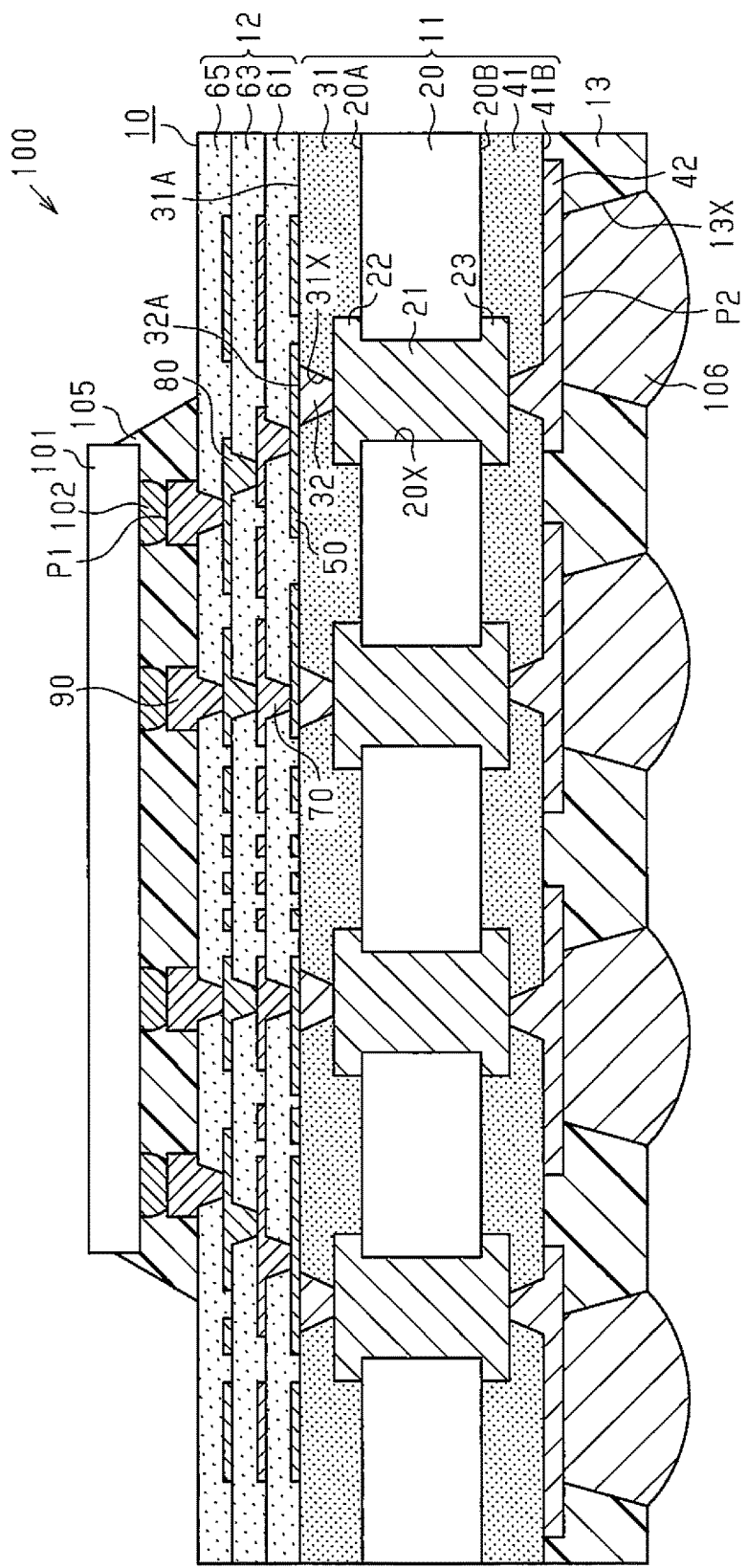
FIG. 3 is a schematic cross-sectional view illustrating a semiconductor device including the wiring substrate illustrated in FIG. 1.

The structure of a semiconductor device 100 will now be described with reference to FIG. 3.

The semiconductor device 100 includes the wiring substrate 10, at least one semiconductor chip 101, an underfill resin 105, and external connection terminals 106.

The semiconductor chip 101 is flip-chip mounted on the wiring substrate 10. Bumps 102, which are arranged on a circuit formation surface (lower surface) of the semiconductor chip 101, are joined with the pads P1 of the wiring substrate 10. The bumps 102 electrically connect the semiconductor chip 101 to the wiring layer 90.

The semiconductor chip 101 may be, for example, a logic chip such as a central processing unit (CPU) chip, a graphics processing unit (GPU) chip, or the like. The semiconductor chip 101 may also be a memory chip such as a Dynamic Random Access Memory (DRAM) chip, a Static Random Access Memory (SRAM) chip, a flash memory chip, or the like. A plurality of semiconductor chips 101 such as a logic chip and a memory chip may be mounted on the wiring substrate 10.

The semiconductor chip 101 may have, for example, dimensions that are approximately 3 mm×3 mm to 12 mm×12 mm in a plan view. Furthermore, the semiconductor chip 101 has, for example, a thickness of approximately 50 to 100 μm.

Each bump 102 may be, for example, a gold bump or a solder bump. For example, an alloy containing lead (Pb), an alloy of tin (Sn) and Au, an alloy of Sn and Cu, an alloy of Sn and silver (Ag), an alloy of Sn, Ag, Cu, and the like may be used as the material of the solder bump.

A gap between the wiring substrate 10 and the semiconductor chip 101 is filled with the underfill resin 105. An insulative resin such as an epoxy-based resin, for example, may be used as the material of the underfill resin 105.

The external connection terminals 106 are formed on the external connection pads P2 of the wiring substrate 10. The external connection terminals 106 are, for example, used for electrical connection with pads of a mounting substrate such as a motherboard (not illustrated). Solder ball or lead pins, for example, may be used as the external connection terminals 106. In the present example, solder balls are used as the external connection terminals 106.

In the present embodiment, the wiring structure 11 is one example of a first wiring structure, and the wiring structure 12 is one example of a second wiring structure. The wiring layer 22 is one example of a first wiring layer, the insulating layer 31 is one example of a first insulating layer, and each through hole 31X is one example of a first through hole. Furthermore, the wiring layer 50 is one example of a second wiring layer, the wiring pattern 50C is one example of a first wiring pattern, the wiring pattern 50A is one example of a second wiring pattern, and the wiring pattern 50B is one example of a third wiring pattern. The insulating layer 61 is one example of a second insulating layer.

A method for manufacturing the wiring substrate 10 will now be described. Here, a method for manufacturing a batch of wiring substrates 10 in a large substrate (batch wiring substrate) and then singulating the wiring substrates 10 from the large substrate will be described.

First, in the step illustrated in FIG. 4A, the through holes 20X are formed in, for example, a copper clad laminate (CCL), which is prepared as the core substrate 20. Next, the through electrodes 21 are formed in the through holes 20X by electrolytic plating, paste fillings, or the like. Thereafter, the wiring layer 22 is formed on the upper surface 20A of the core substrate 20, and the wiring layer 23 is formed on the lower surface 20B of the core substrate 20 using, for example, a subtractive process. A large substrate, from which a number of wiring substrates 10 can be acquired, is used as the core substrate 20. That is, the core substrate 20 includes a plurality of regions A1, and a structure corresponding to the wiring substrate 10 is acquired from each region A1. After the structure corresponding to the wiring substrate 10 is formed in each region A1, the core substrate 20 is cut with a slicer or the like along a cutting line A2 to acquire the wiring substrates 10.

A roughening process is then performed on the wiring layers 22, 23. The roughening process increases the adhesion of the insulating layers 31, 41 with the wiring layers 22, 23, which are formed in subsequent steps. The roughening process may be, for example, a blackening process, an etching process, a plating process, a blasting process, or the like.

Next, in the step illustrated in FIG. 4B, the insulating layer 31, which covers the upper surface 20A of the core substrate 20 and the wiring layer 22, and the insulating layer 41, which covers the lower surface 20B of the core substrate 20 and the wiring layer 23, are formed. When using a resin film as the insulating layers 31, 41, for example, the resin film is laminated on the upper surface 20A and the lower surface 20B of the core substrate 20. The resin film is thermally processed at a temperature (e.g., approximately 130° C. to 200° C.) higher than or equal to the curing temperature while pressed. This cures the resin film and forms the insulating layers 31, 41. In this case, the resin film is laminated in a vacuum atmosphere to prevent the formation of voids in the insulating layers 31, 41. A thermosetting resin film, of which the main component is an epoxy-based resin, for example, may be used as the resin film. When using a liquid or paste of an insulative resin as the insulating layers 31, 41, the liquid or paste insulative resin is applied to the upper surface 20A and the lower surface 20B of the core substrate 20 through a spin coating process or the like. The applied insulative resin is then thermally processed at a temperature that is higher than or equal to the curing temperature to cure the insulative resin. This forms the insulating layers 31, 41. A thermosetting resin, the main component of which is an epoxy-based resin, for example, may be used as the liquid or paste insulative resin.

In the step illustrated in FIG. 4C, the through holes 31X, which expose portions of the upper surface of the wiring layer 22, are formed in predetermined locations of the insulating layer 31. Furthermore, the through holes 41X, which expose portions of the lower surface of the wiring layer 23, are formed in predetermined locations of the insulating layer 41. The through holes 31X, 41X may be formed by undergoing laser processing with, for example, a $CO_2$ laser, a UV-YAG laser, or the like. When the through holes 31X, 41X are formed by undergoing laser processing, a desmear process may be performed to remove resin smears from the exposed surfaces of the wiring layers 22, 23 at the bottom of the through holes 31X, 41X. The desmear process roughens the wall surfaces of the through holes 31X and the upper surface 31A of the insulating layer 31. The desmear process also roughens the wall surfaces of the through holes 41X and the lower surface 41B of the insulating layer 41.

In the step illustrated in FIG. 5A, the wiring layer 42 is formed. The wiring layer 42 includes via wirings, which fill the through holes 41X of the insulating layer 41, and wiring patterns, which are electrically connected to the wiring layer 23 by the via wirings and stacked on the lower surface 41B of the insulating layer 41. The wiring layer 42 may be formed, for example, through various types of wiring formation processes such as semi-additive process and a subtractive process. Alternatively, the wiring layer 42 may be patterned, for example, though a process similar to that performed when forming a conductive layer 110, which is described below.

Further, in the step illustrated in FIG. 5A, the conductive layer 110 is formed, for example, through electrolytic plating. For example, the wall surfaces of the through holes 31X, the entire surface of the insulating layer 31, and the surface of the wiring layer 22 exposed from the through holes 31X are covered by a seed layer (not illustrated). Then, electrolytic plating is performed using the seed layer as a power supplying layer. In the present example, the seed layer is formed by an electroless copper plating, and electrolytic copper plating is performed using the seed layer as a power supplying layer. This fills the through holes 31X with the conductive layer 110 that covers the entire upper surface 31A of the insulating layer 31.

Then, for example, Chemical Mechanical Polishing (CMP) or the like is performed to polish the conductive layer 110 projecting from the upper surface 31A of the insulating layer 31 and a portion of the upper surface 31A of the insulating layer 31, which is the roughened surface. As illustrated in FIG. 5B, this forms the via wirings 32 that fill the through holes 31X. The upper end surface 32A of each via wiring 32 is substantially flush with the upper surface 31A of the insulating layer 31. The upper surface 31A of the insulating layer 31 is polished and smoothened. For example, the upper surface 31A of the insulating layer 31 prior to the polishing has a surface roughness Ra of approximately 300 to 400 nm, whereas the upper surface 31A of the insulating layer 31 subsequent to the polishing has a surface roughness Ra of approximately 15 to 40 nm. In other words, the upper surface 31A of the insulating layer 31 is smoothened until the surface roughness Ra becomes approximately 15 to 40 nm. The wall surfaces of the through holes 31X and the lower surface 41B of the insulating layer 41 remain rough. Thus, the upper surface 31A of the insulating layer 31 has a smaller surface roughness than the wall surfaces of the through holes 31X and the lower surface 41B of the insulating layer 41. Furthermore, since the upper surface 31A of the insulating layer 31 is smoothened, the upper surface 31A of the insulating layer 31 does not have, for example, irregularities (undulations) caused by steps formed between the wiring layer 22 and the upper surface 20A of the core substrate 20. In this manner, the polishing step forms polished surfaces with the upper surface 31A of the insulating layer 31 and the upper end surface 32A of each via wiring 32.

The structure corresponding to the wiring structure 11 is manufactured in each region A1 through the manufacturing steps described above.

In the step illustrated in FIG. 6A, the seed layer 51 is formed to cover the entire upper surface 31A of the insulating layer 31 and the entire upper end surface 32A of each via wiring 32. The seed layer 51 can be formed, for example, through a sputtering process. Since the upper surface 31A of the insulating layer 31 is a smooth surface, the seed layer 51 can be uniformly formed on the upper surface 31A through sputtering. This allows the seed layer 51 to have a smooth upper surface. Thus, the seed layer 51 may be thin compared to when forming the seed layer 51 on a rough surface through sputtering. Furthermore, since the upper surface 31A of the insulating layer 31 is a smooth surface, a fine wiring layer (high density wirings) may easily be formed on the upper surface 31A.

As illustrated in FIG. 6B, the seed layer 51 has a double-layer structure of the metal film 52 (metal barrier film) and the metal film 53. First, the metal film 52 that covers the upper surface 31A of the insulating layer 31 and the upper end surface 32A of each via wiring 32 is formed by sputtering titanium. Thereafter, the metal film 53 is formed on the metal film 52 by sputtering copper. This forms the seed layer 51 having a double-layer structure.

A plasma process such as $O_2$ plasma ashing or the like may be performed on the upper surface 31A of the insulating layer 31 before forming the seed layer 51. The upper surface 31A of the insulating layer 31 may be roughened by performing a plasma process. The roughening of the upper surface 31A of the insulating layer 31 increases the adhesion of the seed layer 51 and the insulating layer 31. However, to form fine wirings on the upper surface 31A by reducing the roughness and increasing the smoothness of the upper surface 31A of the insulating layer 31, the plasma process roughens the upper surface 31A of the insulating layer 31 so as not to adversely affect the formation of fine wirings in a subsequent step.

Figure 7A:
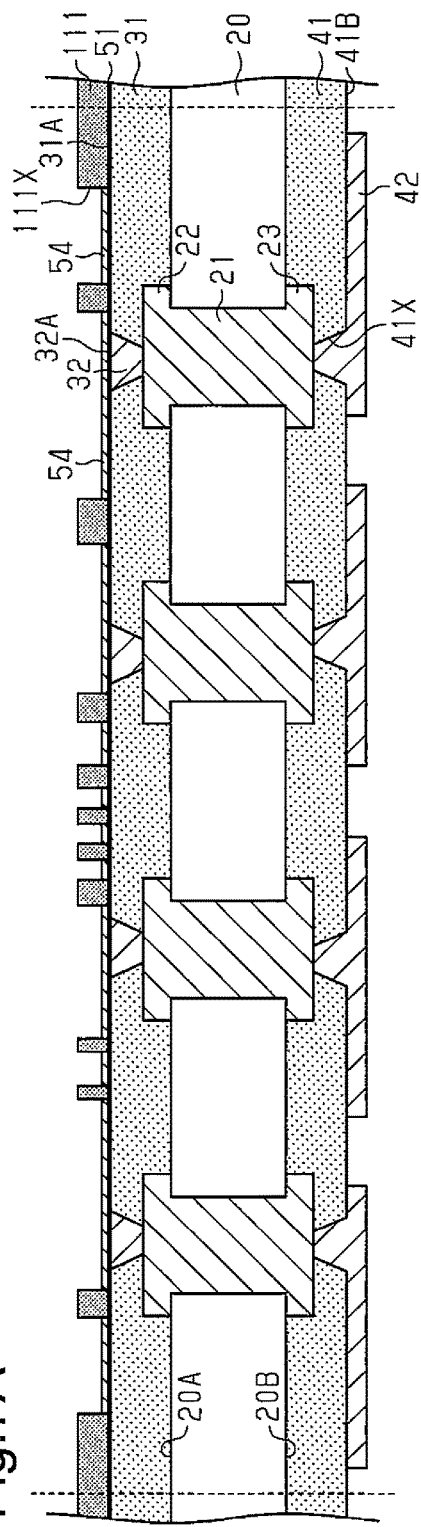

In the step illustrated in FIG. 7A, a resist layer 111 is formed on the seed layer 51. The resist layer 111 includes opening patterns 111X at predetermined locations. Each opening pattern 111X exposes the seed layer 51 at a portion corresponding to a formation region of the wiring layer 50 (see FIG. 1). A material having plating resistance against a plating process performed in the next step, for example, may be used as the material of the resist layer 111. For example, a photosensitive dry film resist, a liquid photoresist, or the like may be used as the material of the resist layer 111. A novolac-based resin, acryl-based resin, or the like, for example, may be used as the material of the resist. For example, when using the photosensitive dry film resist, a dry film is laminated to the upper surface of the seed layer 51 by undergoing thermo-compression bonding, and the dry film is patterned through a photolithography process. This forms the resist layer 111 including the opening patterns 111X. When using a liquid photoresist, the resist layer 111 may also be formed through similar steps. The smooth upper surface of the seed layer 51 reduces patterning defects in the resist layer 111 formed on the seed layer 51. Therefore, the opening patterns 111X can be formed with high accuracy in the resist layer 111.

Figure 7B:
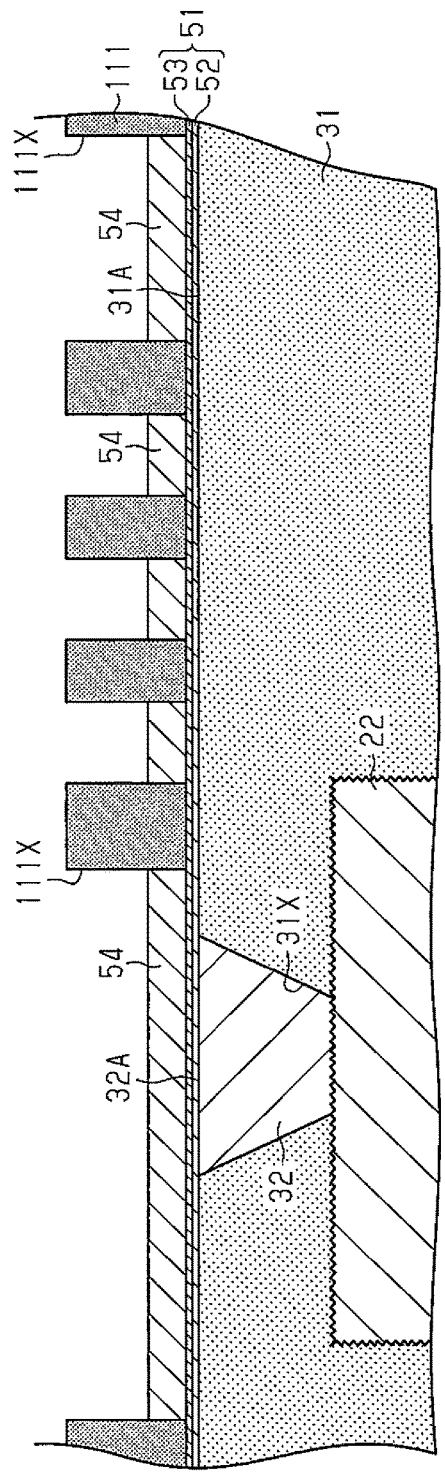

Next, electrolytic plating, which uses the resist layer 111 as a plating mask and the seed layer 51 as a plating power supplying layer, is performed to form the metal layer 54 on the upper surface of the seed layer 51 exposed from the opening pattern 111X. In the present example, an electrolytic copper plating layer is formed as the metal layer 54 on the upper surface of the seed layer 51 by performing the electrolytic copper plating. Thus, as illustrated in FIG. 7B, the seed layer 51, which has the double-layer structure of the metal film 52 and the metal film 53, and the metal layer 54 are sequentially stacked on the upper surface 31A of the insulating layer 31 in correspondence with the location of each opening pattern 111X.

Figure 8A:
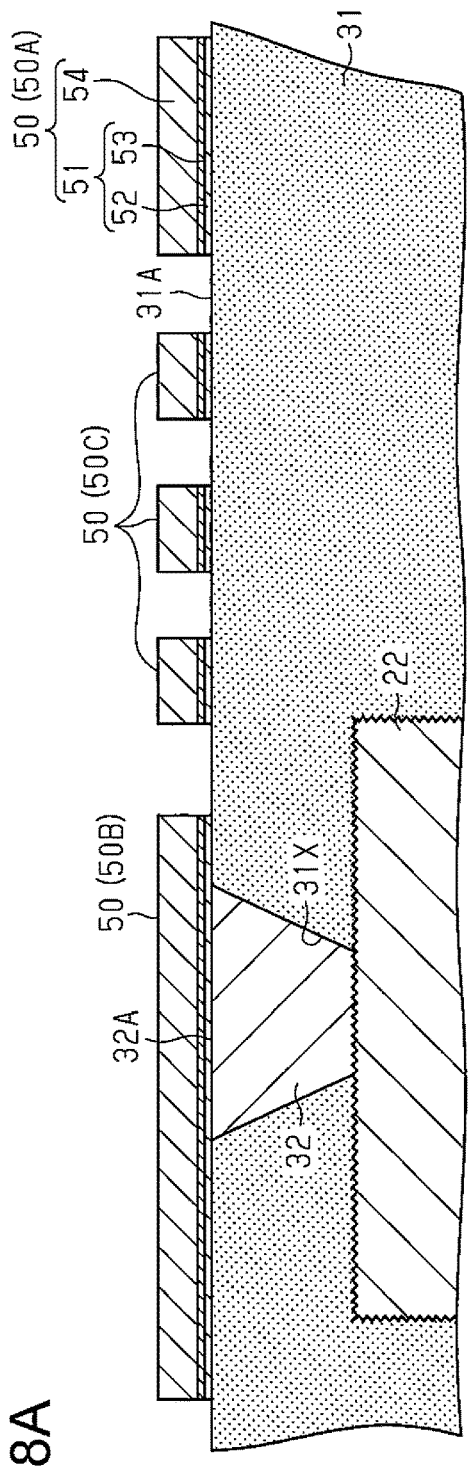

The resist layer 111 is then removed by an alkaline defoliation solution. Furthermore, the unnecessary metal film 53 is etched and removed using the metal layer 54 as an etching mask. The etchant in the etching process may be, for example, an ammonium persulfate aqueous solution or a mixed solution of hydrogen peroxide solution and sulfuric acid. Thereafter, the unnecessary metal film 52 (Ti film herein) is etched and removed using both of the metal layer 54 and the metal film 53 (Cu film herein) as etching masks. When etching the metal film 52, for example, dry etching, which uses mixed gas in which $O_2$, $N_2$, or the like are added to $CF_4$, or wet etching, which uses a mixed solution of hydrogen peroxide solution and phosphoric acid as an etchant, may be performed. As illustrated in FIG. 8A, the removal of the unnecessary metal films 52, 53 forms the wiring layer 50 on the upper end surface 32A of each via wiring 32 and the upper surface 31A of the insulating layer 31. The wiring layer 50 is formed through a semi-additive process in such a manner. The wiring layer 50 includes the seed layer 51 and the metal layer 54, which is arranged on the seed layer 51. The seed layer 51 includes the metal film 52, which is stacked on the upper end surface 32A of each via wiring 32 and the upper surface 31A of the insulating layer 31, and the metal film 53, which is stacked on the metal film 52. In the present example, the wiring layer 50 includes the wiring pattern 50A, which is a solid pattern, the wiring pattern 50B, which includes a land, and a fine wiring pattern 50C. In the wiring layer 50 (wiring patterns 50A to 50C) illustrated in FIG. 8A, the side surface of the metal film 52, the side surface of the metal film 53, and the side surface of the metal layer 54 are substantially flush with one another in a plan view.

Figure 8B:
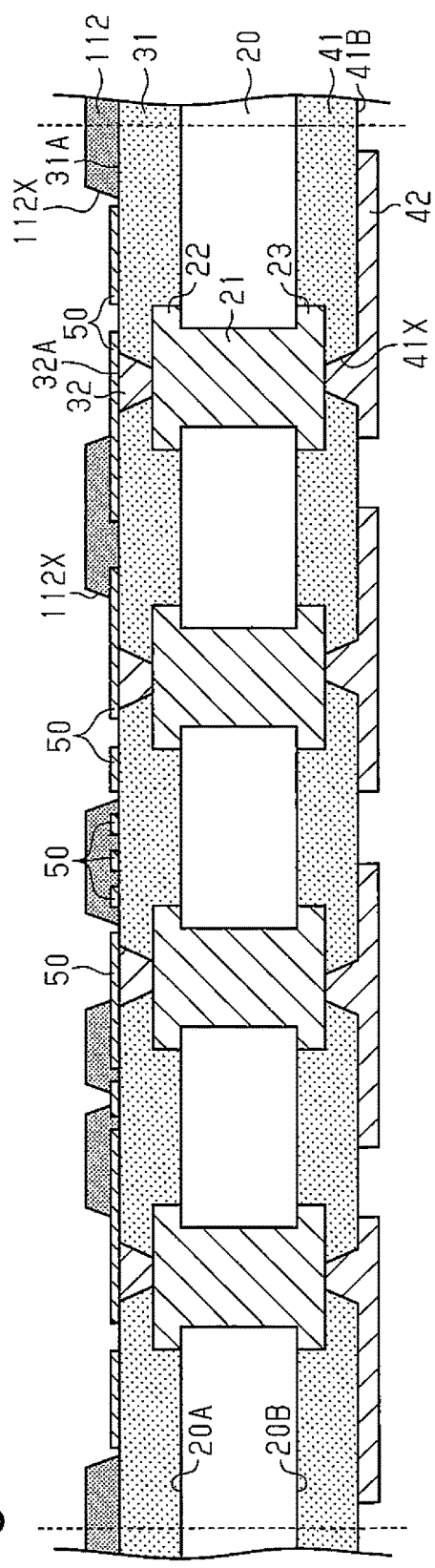

In the step illustrated in FIG. 8B, a resist layer 112 is formed on the upper surface 31A of the insulating layer 31. The resist layer 112 includes opening patterns 112X at predetermined locations. The opening patterns 112X partially or entirely expose a wiring pattern having a large upper surface area in the wiring layer 50. For example, as illustrated in FIGS. 9A and 9B, the opening patterns 112X expose the entire surface of the wiring pattern 50A, which is the solid pattern, and the land of the wiring pattern 50B. In other words, the resist layer 112 covers the fine wirings of the wiring pattern 50B, excluding the land, and the entire surface of the wiring pattern 50C. As illustrated in FIG. 9B, the resist layer 112 covers the outer edge of the land formed at the end of the wiring pattern 50C. In other words, the entire side surface of the land formed at the end of the wiring pattern 50C is covered by the resist layer 112. The entire surface of the land formed at the end of the wiring pattern 50C may be covered by the resist layer 112.

A photosensitive dry film resist, a liquid photoresist, or the like may be used as the material of the resist layer 112. For example, a novolac-based resin, an acryl-based resin, or the like may be used as the material of the resist. The resist layer 112 may be formed, for example, through a method similar to the resist layer 111.

In the step illustrated in FIG. 10A, the roughening process is selectively performed on the Cu layer (metal layer 54 and metal film 53) of the wiring layer 50 (wiring patterns 50A, 50B) using the resist layer 112 as a mask. The roughening process forms the roughened surface 54R having fine irregularities with the upper surface and the side surface of the metal layer 54 exposed from the opening patterns 112X of the resist layer 112. Furthermore, the roughening process forms the roughened surface 53R having fine irregularities with the side surface of the metal film 53 exposed from the opening pattern 112X. For example, the surfaces of the metal layer 54 and the metal film 53 prior to the roughening (when covered by the resist layer 112) have a surface roughness Ra of approximately 1 to 50 nm, whereas the surfaces of the metal layer 54 and the metal film 53 subsequent to the roughening have a surface roughness Ra of approximately 100 to 150 nm. In other words, the surfaces of the metal layer 54 and the metal film 53 exposed from each opening pattern 112X are roughened until the surface roughness Ra of becomes approximately 100 to 150 nm. However, the roughened surfaces 53R, 54R have a smaller surface roughness than the wiring layer 22. Thus, the roughening process is performed so that the metal layer 54 and the metal film 53 exposed from the opening pattern 112X have a smaller surface roughness than the wiring layer 22 and a larger surface roughness than the surface (i.e., smooth surface 54S) of the metal layer 54 and the side surface (i.e., smooth surface 53S) of the metal film 53, which are covered by the resist layer 112.

The roughening process can be performed by an etching process or a blackening process, for example. When performing the roughening process with an etching process, for example, the etchant conditions and the like are set so that the surface of the metal film 52 (e.g., Ti film) is not roughened, that is, so that the metal film 53 and the metal layer 54 (e.g., Cu layer) are selectively etched with respect to the metal film 52. Thus, the metal film 52 is unaffected by the roughening process, and the surface of the metal film 52 is not roughened. When surfaces of the metal film 53 and the metal layer 54 are partially etched by the roughening process, the planar shapes of the metal film 53 and the metal layer 54 become small. This exposes the peripheral portion of the metal film 52 exposed from the metal film 53 and the metal layer 54. In other words, the roughening process is performed on the metal film 53 and the metal layer 54 so that the projection 52T that projects out of the metal film 53 and the metal layer 54 is formed by the peripheral portion of the metal film 52. The etchant used in the roughening process (etching process) includes, for example, an aqueous ferric chloride solution, a cupric chloride aqueous solution, an ammonium persulfate solution, a copper ammonium chloride aqueous solution, or the like.

In the step illustrated in FIG. 10B, the resist layer 112 illustrated in FIG. 10A is, for example, removed by an alkaline defoliation solution.

Figure 11A:
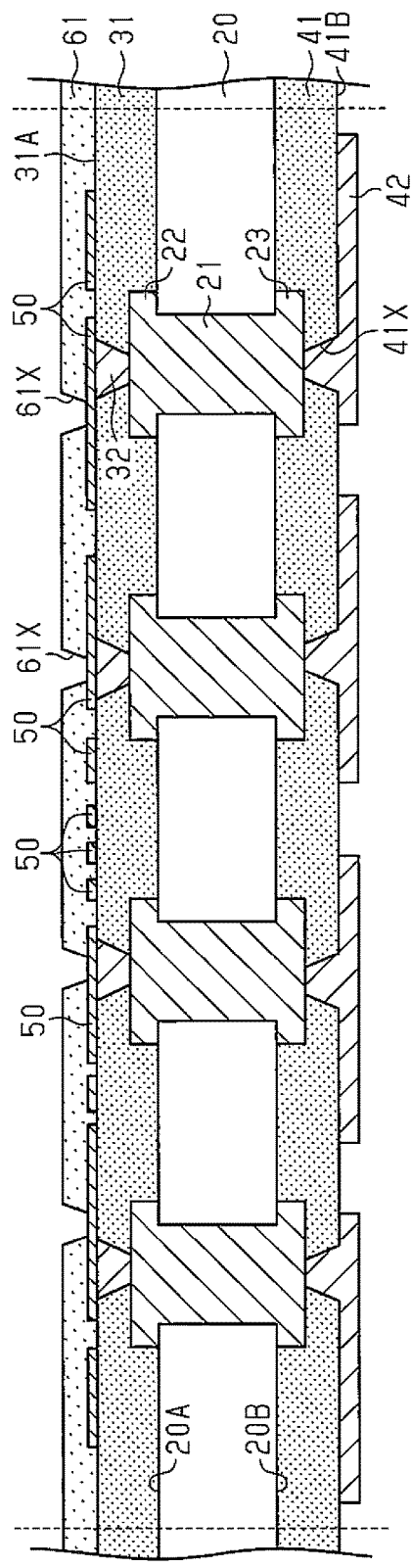
Figure 11B:
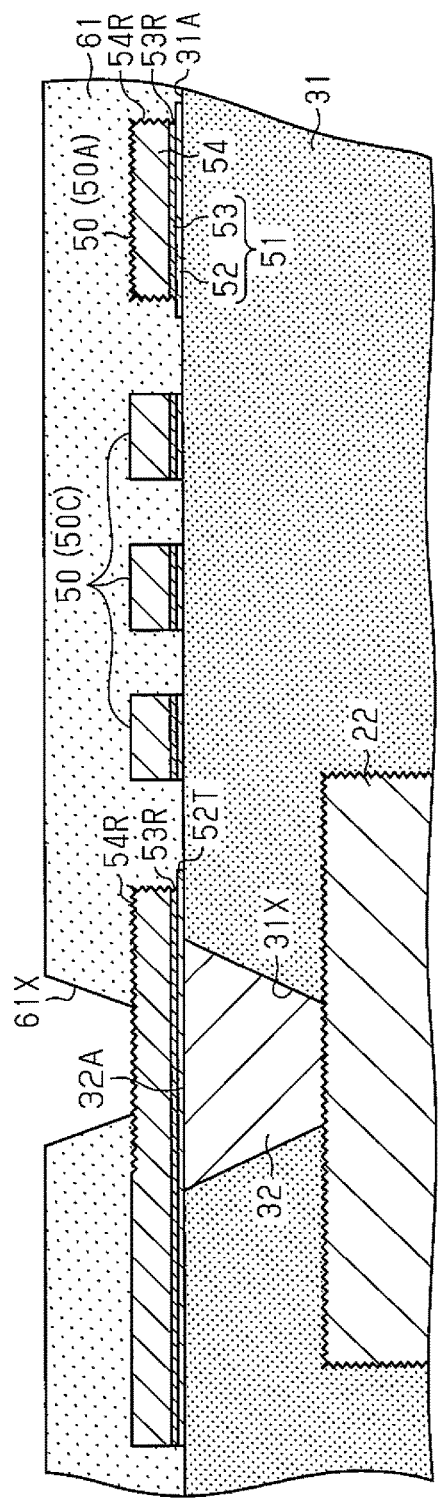

In the steps illustrated in FIGS. 11A and 11B, the insulating layer 61 is formed on the upper surface 31A of the insulating layer 31. The insulating layer 61 includes the through holes 61X exposing portions of the upper surface of the wiring layer 50. In this case, as illustrated in FIG. 11B, the roughened surfaces 54R, 53R are formed by portions of the surface of the wiring layer 50. This increases the adhesion of the insulating layer 61 and the wiring layer 50 as compared to when the entire surface of the wiring layer 50 is a smooth surface.

For example, when using a resin film as the insulating layer 61, the resin film is laminated to the upper surface 31A of the insulating layer 31 through thermo-compression bonding, and the resin film is patterned in a photolithography process to form the insulating layer 61. In this case, the resin film is laminated in a vacuum atmosphere to prevent the formation of voids in the insulating layer 61. A film of photosensitive resin such as a phenol-based resin, a polyimide-based resin, and the like, for example, may be used as the resin film. When using a liquid or paste of insulative resin as the insulating layer 61, the liquid or paste insulative resin is applied to the upper surface 31A of the insulating layer 31 through a spin coating process or the like, and the insulative resin is patterned in photolithography process to form the insulating layer 61. A photosensitive resin such as a phenol-based resin, a polyimide-based resin, or the like, for example, may be used as the liquid or paste insulative resin.

The upper surface of the insulating layer 61, which is formed from such a photosensitive resin, has, for example, a surface roughness Ra of approximately 2 to 10 nm. In other words, the surface roughness of the upper surface of the insulating layer 61 is smaller than the wall surface of each through hole 31X and also smaller than the upper surface 31A (polished surface) of the insulating layer 31.

Figure 12A:
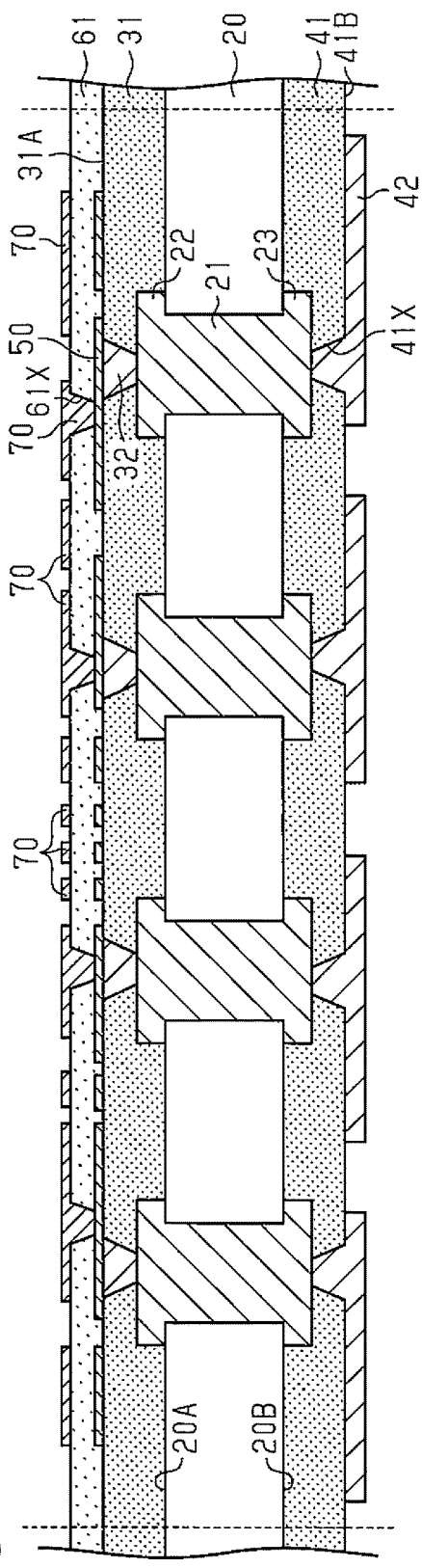
Figure 12B:
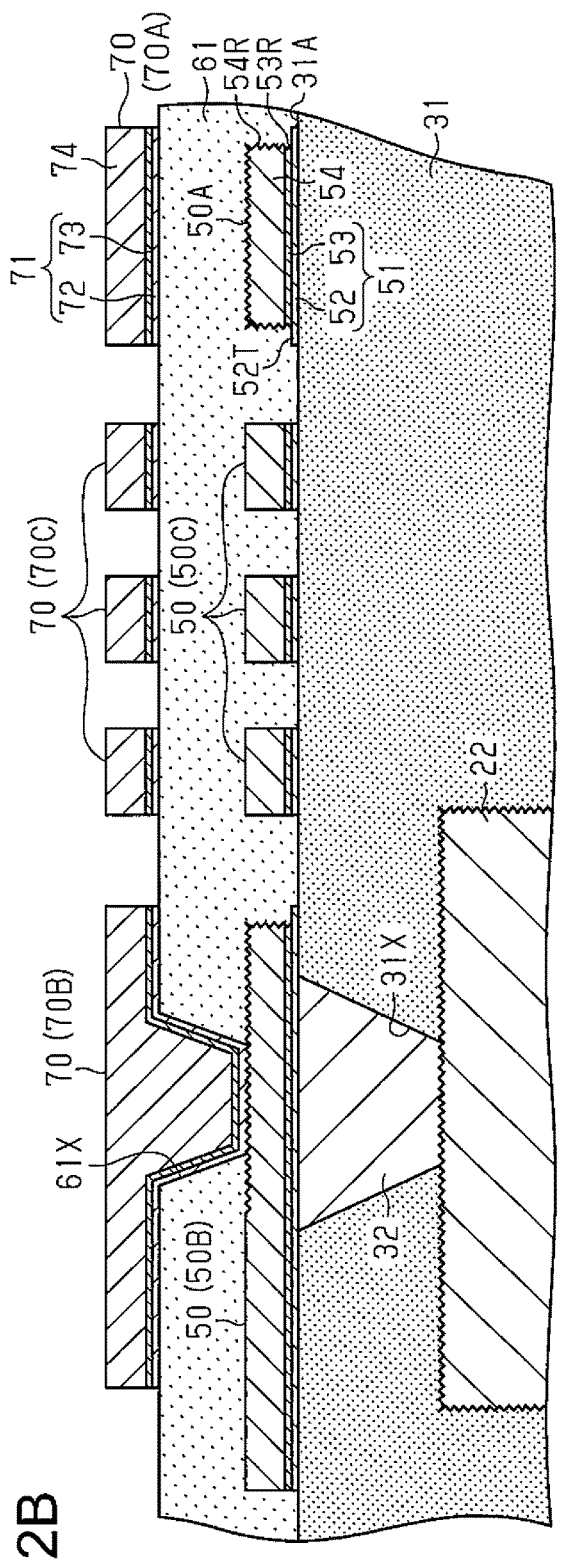

In the same manner as the steps illustrated in FIGS. 6A to 8B, in the steps illustrated in FIGS. 12A and 12B, the wiring layer 70 is formed, for example, through a semi-additive process. The wiring layer 70 includes via wiring, which fill the through holes 61X, and wiring patterns, which are electrically connected to the wiring layer 50 by the via wirings and stacked on the upper surface of the insulating layer 61. In this case, as illustrated in FIG. 12B, the wiring layer 70 includes the seed layer 71, which has a double-layer structure of the metal film 72 (metal barrier film) and the metal film 73, and the metal layer 74 (electrolytic copper plating layer), which is formed on the seed layer 71. In the wiring layer 70 (wiring patterns 70A to 70C) illustrated in FIG. 12B, the side surface of the metal film 72, the side surface of the metal film 73, and the side surface of the metal layer 74 are substantially flush with one another in a plan view.

Figure 13:
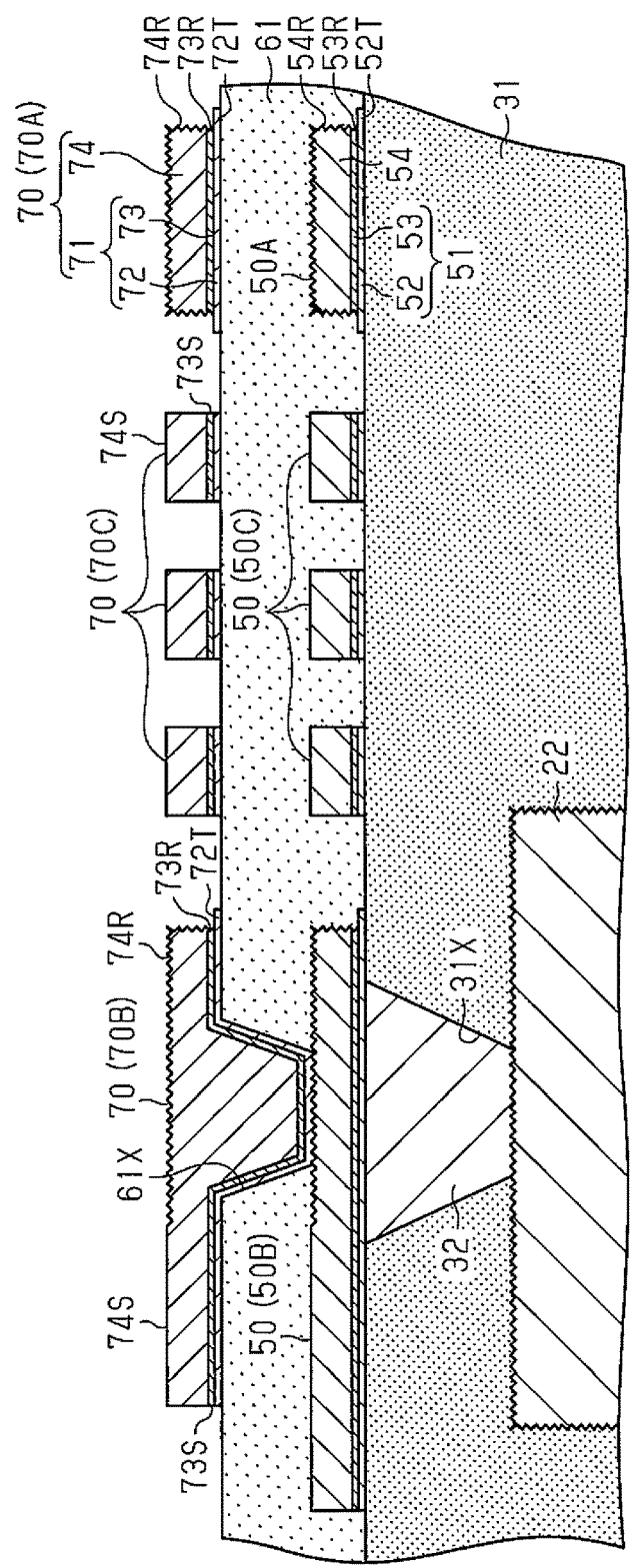

In the same manner as the steps illustrated in FIGS. 9A to 10B, in the step illustrated in FIG. 13, the roughening process is selectively performed on a certain location of the wiring layer 70. In the present example, the roughening process is performed on the metal film 73 and the metal layer 74 of the wiring patterns 70A, 70B having a large surface area. In the roughening process, the roughened surfaces 73R, 74R are formed by the surfaces of the metal film 73 and the metal layer 74. The roughening process is performed so that the surface roughness of the roughened surfaces 73R, 74R is smaller than the wiring layer 22 and have a larger than the non-roughened surfaces (i.e., smooth surfaces 73S, 74S) of the metal film 73 and the metal layer 74. The roughening process performed on the metal film 73 and the metal layer 74 forms the projection 72T in the peripheral portion of the metal film 72 that projects out of the side surfaces (roughened surfaces 73R, 74R) of the metal film 73 and the metal layer 74.

Figure 14:
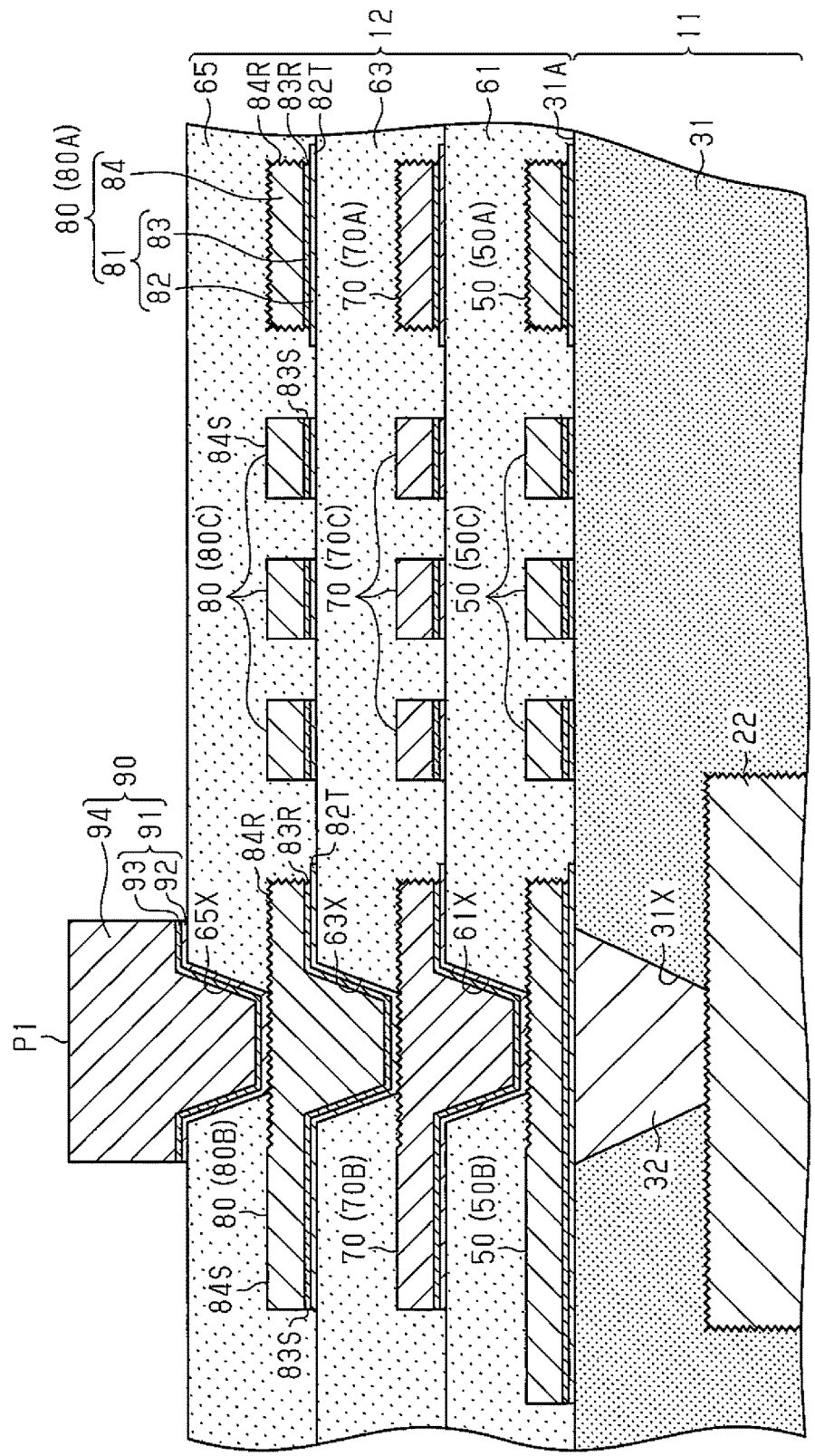

In the same manner as the steps illustrated in FIGS. 11A and 11B, in the step illustrated in FIG. 14, the insulating layer 63 is formed on the insulating layer 61. The insulating layer 63 includes the through holes 63X exposing portions the upper surface of the wiring layer 70. Then, in the same manner as the steps illustrated in FIGS. 6A to 8B, the wiring layer 80 is formed, for example, through a semi-additive process. The wiring layer 80 includes via wirings, which fill the through holes 63X, and wiring patterns, which are electrically connected to the wiring layer 70 by the via wirings and stacked on the upper surface of the insulating layer 63. The wiring layer 80 includes the seed layer 81, which has a double-layer structure of the metal film 82 (metal barrier film) and the metal film 83, and the metal layer 84 (electrolytic copper plating layer), which is formed on the seed layer 81. In the same manner as the steps illustrated in FIGS. 9A to 10B, in the present example, a roughening process is then selectively performed on certain locations of the wiring layer 80, more specifically, on the wiring patterns 80A, 80B of the metal film 83 and the metal layer 84 that have a large surface area. The roughening process forms the roughened surfaces 83R, 84R with the surfaces of the metal film 83 and the metal layer 84. The roughening process is performed so that the surface roughness of the roughened surfaces 83R, 84R is smaller than the wiring layer 22 and larger than the non-roughened surfaces (i.e., smooth surfaces 83S, 84S) of the metal film 83 and the metal layer 84. The roughening process performed on the metal film 83 and the metal layer 84 forms the projection 82T in the peripheral portion of the metal film 82 that projects out of the side surfaces (roughened surfaces 83R, 84R) of the metal film 83 and the metal layer 84.

In the same manner as the steps illustrated in FIGS. 11A and 11B, the insulating layer 65 is formed on the insulating layer 63. The insulating layer 65 includes the through holes 65X exposing portions of the upper surface of the wiring layer 80. Then, in the same manner as the steps illustrated in FIGS. 6A to 8B, the wiring layer 90 is formed, for example, through a semi-additive process. The wiring layer 90 includes via wirings, which fill the through holes 65X, and the pads P1, which are electrically connected to the wiring layer 80 by the via wirings and stacked on the upper surface of the insulating layer 65. The wiring layer 90 includes the seed layer 91, which has a double-layer structure of the metal film 92 and the metal film 93, and a metal layer 94 (electrolytic copper plating layer), which is formed on the seed layer 91. The surface-processed layer may be formed on the surface of each pad P1 of the wiring layer 90 when necessary.

The manufacturing steps described above stack the wiring structure 12 on the upper surface 31A of the uppermost insulating layer 31 of the wiring structure 11.

Figure 15:
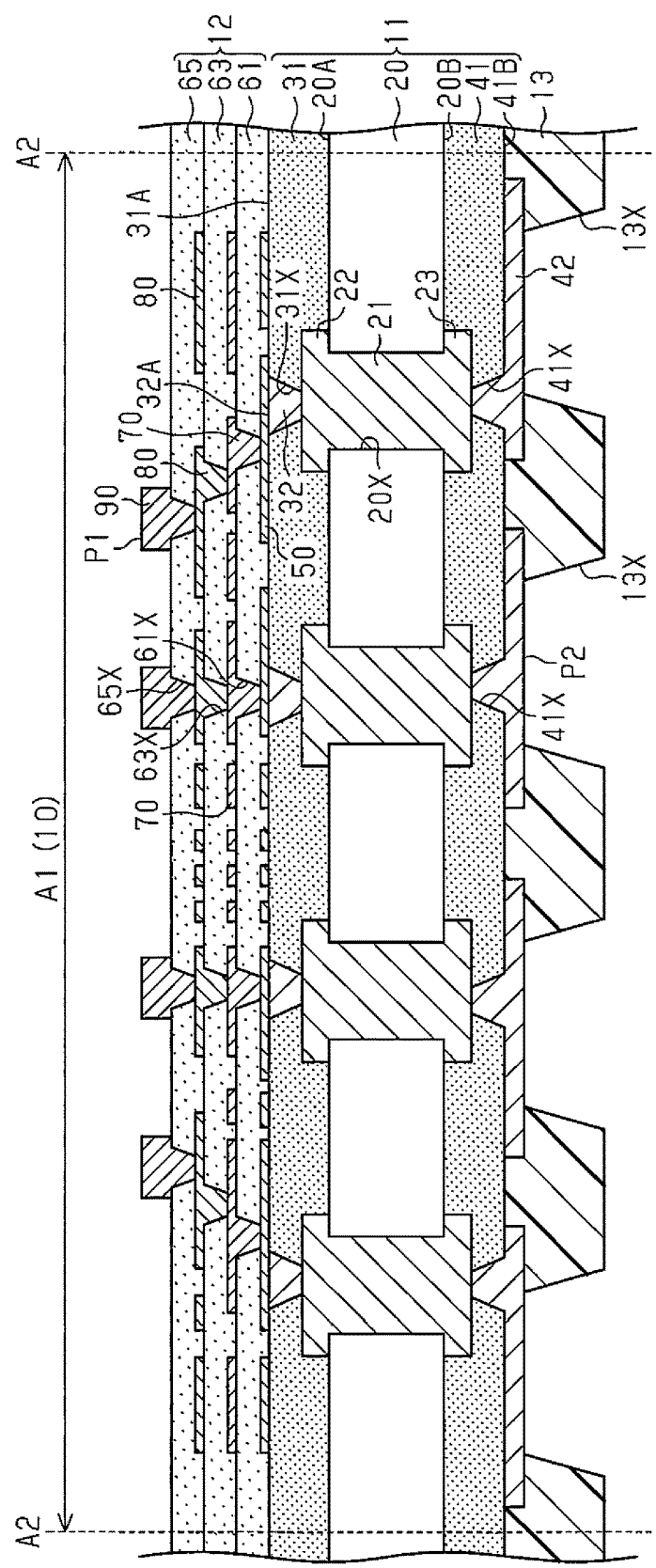

Next, in the step illustrated in FIG. 15, the solder resist layer 13 is stacked on the lower surface 41B of the lowermost insulating layer 41 of the wiring structure 11. The solder resist layer 13 includes the openings 13X exposing certain locations of the lowermost wiring layer 42 of the wiring structure 11 as the external connection pads P2. The thickness of the solder resist layer 13 (thickness from the lower surface 41B of the insulating layer 41 to the lower surface of the solder resist layer 13) is set to be greater than or equal to the thickness of the wiring structure 12 (thickness from upper surface 31A of insulating layer 31 to upper surface of insulating layer 65). The solder resist layer 13 is formed from a photosensitive phenol-based resin or a polyimide-based resin. The solder resist layer 13 may be formed, for example, by laminating a photosensitive solder resist film or applying a liquid solder resist, and patterning the resist to a required shape. As a result, portions of the wiring layer 42 are exposed from the openings 13X of the solder resist layer 13 as the external connection pads P2.

A surface-processed layer may be formed on the external connection pads P2 when necessary. The solder resist layer 13 may be formed at any time after the lowermost wiring layer 42 is formed. For example, the solder resist layer 13 may be formed after the step illustrated in FIG. 5A.

The structure corresponding to the wiring substrate 10 is manufactured in each region A1 through the manufacturing steps described above.

The structure illustrated in FIG. 15 is then cut along the cutting line A2 with a slicer or the like to obtain a plurality of wiring substrates 10.

A method for manufacturing the semiconductor device 100 will now be described.

Figure 16:
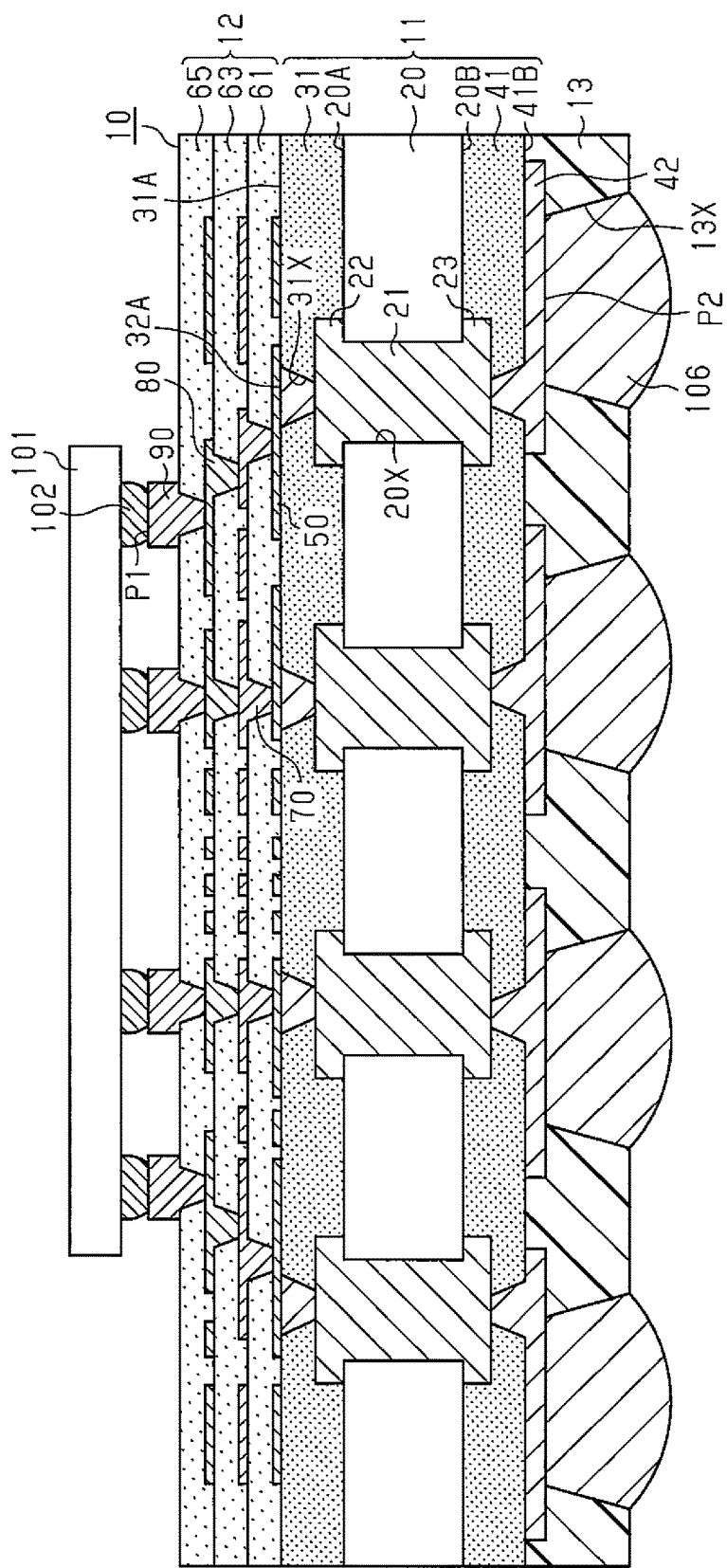

In the step illustrated in FIG. 16, the external connection terminal 106 is formed on each external connection pad P2. For example, the external connection terminal 106 (solder ball herein) is mounted after appropriately applying flux to the external connection pad P2. Thereafter, a reflow process is performed at a temperature of approximately 240° C. to 260° C. to fix the external connection terminal 106 to the pad P2. Subsequently, the flux is removed through a surface washing process.

In the step illustrated in FIG. 16, the semiconductor chip 101 is mounted on the wiring substrate 10. In the present example, the bumps 102 of the semiconductor chip 101 are flip-chip joined with the pads P1 of the wiring substrate 10. Then, the underfill resin 105 (see FIG. 3) is filled between the semiconductor chip 101 and the wiring substrate 10, and the underfill resin 105 is cured. The semiconductor device 100 illustrated in FIG. 3 can be manufactured through the manufacturing steps described above.

The present embodiment has the following advantages.

(1) Roughened surfaces are formed by portions of the surfaces of the wiring layers 50, 70, 80 in the wiring structure 12, which is a high density wiring structure. This increases the adhesion of the wiring layers 50, 70, 80 and the insulating layers 61, 63, 65 as compared to when the entire surface of each of the wiring layers 50, 70, 70 is a smooth surface. The roughened surface of each wiring layer 50, 70, 80 is set to have a smaller surface roughness than the surface of each of the wiring layers 22, 23, 42 in the wiring structure 11, which is a low density wiring structure. This limits increase in the resistance of the wiring layers 50, 70, 80 that would be caused by the roughening process. Furthermore, even if the roughening process is performed, each of the wiring layers 50, 70, 80 is maintained in the desired planar shape.

(2) In the wiring layers 50, 70, 80, roughened surfaces are formed by the surfaces of the metal films 53, 73, 83 and the metal layers 54, 74, 84 of the wiring patterns (solid pattern, wiring pattern including land, etc.) having a large surface area. In other words, in the wiring layers 50, 70, 80, the roughening process is not performed on the fine wirings having a small surface area. Thus, increases in the resistance of the fine wirings of the wiring layers 50, 70, 80 are limited while increasing the adhesion of the wiring layers 50, 70, 80 and the insulating layers 61, 63, 65.

(3) The upper surface 31A of the insulating layer 31 is a surface smoother than the lower surface 41B of the insulating layer 41 and the wall surface of each through hole 31X in the insulating layer 31. Thus, the metal film 52 (seed layer 51) may be uniformly formed on the upper surface 31A of the insulating layer 31 through, for example, a sputtering process. Therefore, the seed layer 51 is thin compared to when the seed layer 51 is formed on the roughened surface. Furthermore, since the upper surface 31A of the insulating layer 31 is a smooth surface including few irregularities, residuals formed when removing the seed layer 51 through etching are reduced compared to when the upper surface 31A of the insulating layer 31 is a roughened surface including large irregularities. This facilitates miniaturization of the wiring layer 50 stacked on the upper surface 31A of the insulating layer 31.

(4) The thickness of the solder resist layer 13 is set to greater than or equal to the total thickness of all the insulating layers in the wiring structure 12. Thus, when viewing the wiring substrate 10 in the vertical direction (thickness-wise direction), physical property values are symmetrically distributed in the vertical direction at opposite sides of the core substrate 20. This balances the physical property values at the upper side and the lower side of the core substrate 20 and reduces warpage and undulation of the wiring substrate 10 caused by thermal contraction or the like.

(5) When warpage and undulation occur in the wiring substrate 10, stress is generated at an interface of the insulating layer 31, of which the main component is the thermosetting resin, and the insulating layer 61, of which the photosensitive resin is the main component. In this case, the adhesion of the insulating layer 31 and the insulating layer 61 would be weak if the upper surface 31A of the insulating layer 31 were a smooth surface. This would easily defoliate the insulating layer 61 from the insulating layer 31 when stress is applied. In the present example, warpage and undulation of the wiring substrate 10 are reduced as described above. This limits defoliation of the insulating layer 61 from the insulating layer 31.

(6) The insulating layers 31, 41 are formed from an insulative resin containing a reinforcement material on the upper surface 20A and the lower surface 20B of the core substrate 20. The insulating layers 31, 41 ensure that the wiring substrate 10 has sufficient rigidity even if the core substrate 20 is thin. Thus, the wiring substrate 10 may be entirely reduced in thickness, and warpage and undulation are reduced in the wiring substrate 10.

Second Embodiment

A second embodiment will now be described with reference to FIGS. 17A to 19. The second embodiment differs from the first embodiment in the structure and manufacturing method of the wiring structure 12. The description hereafter will focus on the differences from the first embodiment. Same reference numerals are given to those components that are the same as the corresponding components illustrated in FIGS. 1 to 16. Such components will not be described in detail.

Figure 17A:
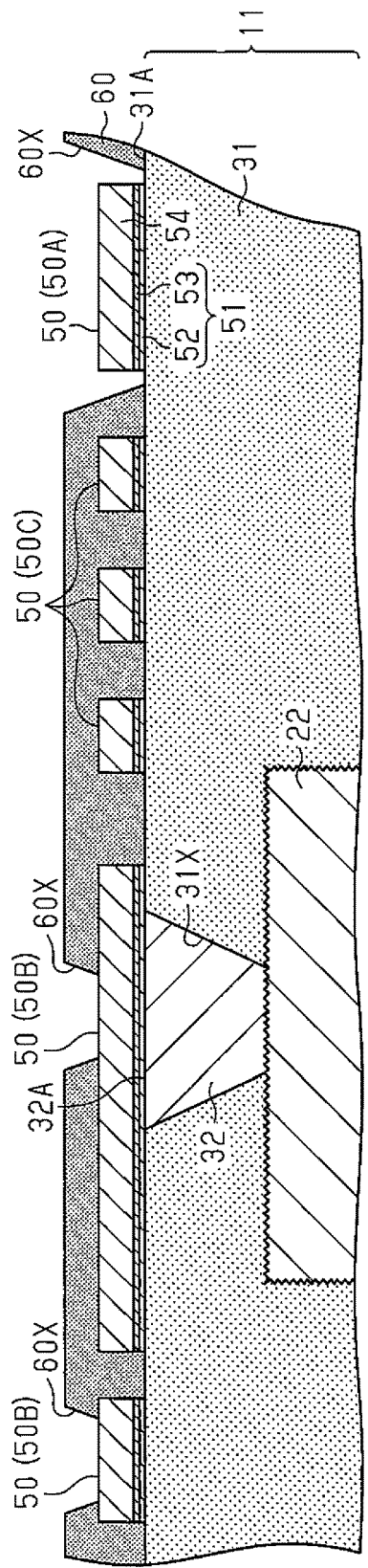
FIGS. 17A, 17B, 18A, 18B, and 19 are enlarged cross-sectional views illustrating a method for manufacturing a wiring substrate in a second embodiment.

In the same manner as the steps illustrated in FIGS. 4A to 8B, in the step illustrated in FIG. 17A, a structure corresponding to the wiring structure 11 is formed, and the wiring layer 50 is formed on the upper surface 31A of the uppermost insulating layer 31 of the wiring structure 11 and the upper end surface 32A of each via wiring 32. Then, an insulating layer 60 is formed on the upper surface 31A of the insulating layer 31. The insulating layer 60 includes through holes 60X at predetermined locations. The through holes 60X partially or entirely expose a wiring pattern having a large upper surface area in the wiring layer 50. In other words, the insulating layer 60 covers the fine wirings in the wiring layer 50. For example, as illustrated in FIG. 17A, the through holes 60X entirely expose the surfaces of the wiring pattern 50A and partially expose the upper surface of the wiring pattern 50B. That is, the insulating layer 60 partially covers the wiring pattern 50B and entirely covers the surface of the wiring pattern 50C. For example, a photosensitive insulative resin, the main component of which is a phenol-based resin, a polyimide-based resin, or the like, may be used as the material of the insulating layer 60. The insulating layer 60 may contain, for example, a filler such as silica, alumina, and the like. The insulating layer 60 including the through holes 60X may be formed through the same process as the insulating layer 61 illustrated in FIGS. 11A and 11B.

Figure 17B:
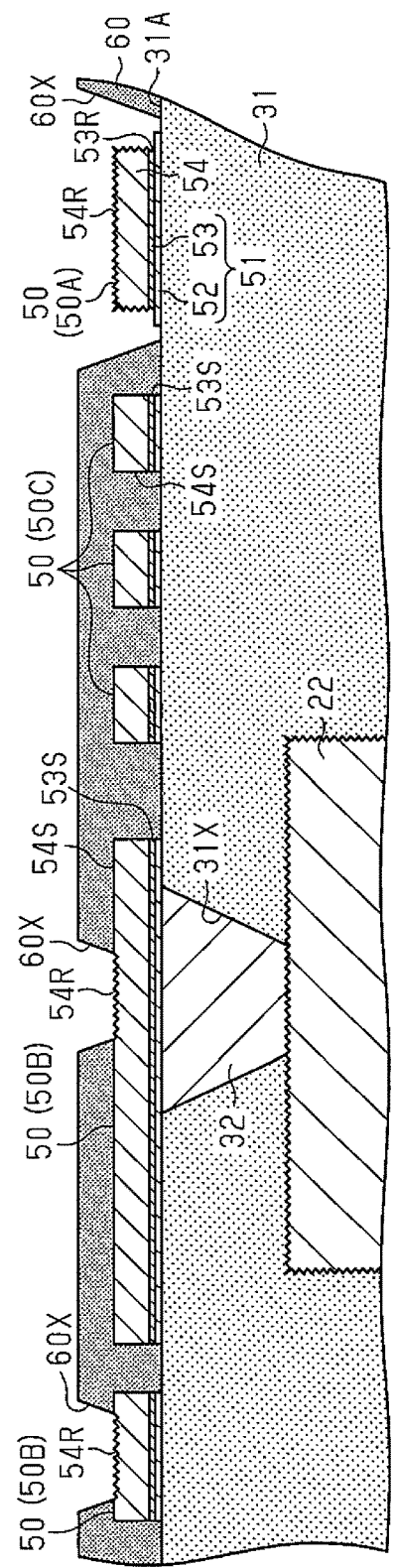

In the same manner as the step illustrated in FIG. 10A, in the step illustrated in FIG. 17B, the roughening process is selectively performed on the Cu layer (metal film 53 and the metal layer 54) of the wiring patterns 50A, 50B using the insulating layer 60 as a mask. The roughening process forms the roughened surface 53R, with the side surface of the metal film 53 exposed from through holes 60X of the insulating layer 60, and the roughened surface 54R, with the surfaces of the metal layer 54 exposed from the through hole 60X. The roughening process is performed so that the surface roughness of the roughened surfaces 53R, 54R is smaller than the wiring layer 22 and larger than the surfaces of the metal film 53 and the metal layer 54 (i.e., smooth surfaces 53S, 54S) covered by the insulating layer 60.

Figure 18A:
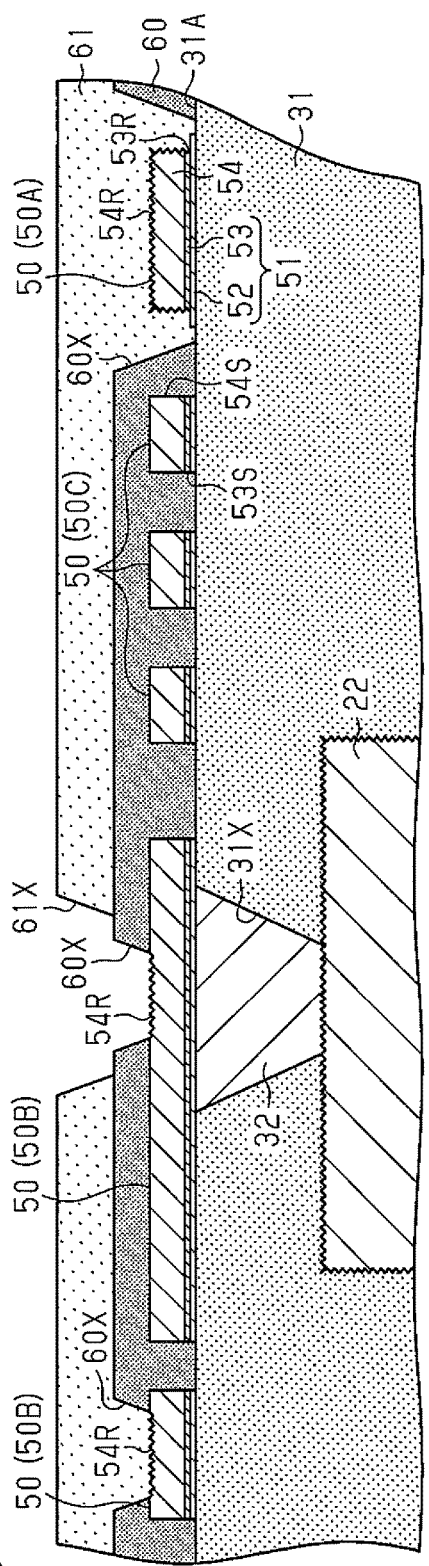

Then, in the same manner as the steps illustrated in FIGS. 11A and 11B, in the step illustrated in FIG. 18A, the insulating layer 61 that covers the wiring layer 50 and the insulating layer 60 is formed on the upper surface 31A of the insulating layer 31. The insulating layer 61 includes the through holes 61X that expose portions of the upper surface of the wiring layer 50. Each through hole 61X is formed on a land of the wiring pattern 50B and exposes the roughened surface 54R exposed at the bottom portion of the through hole 60X. The through hole 61X is formed at a location overlapped with the through hole 60X in a plan view and has a larger planar shape than the through hole 60X. In other words, the diameter of the through hole 61X is set to be larger than the diameter of the through hole 60X. Thus, the upper surface of the insulating layer 60 around the through hole 60X is exposed from the through hole 61X. The wall surface of the through hole 61X, the upper surface of the insulating layer 60 exposed from the through hole 61X, and the wall surface of the through hole 60X form stair-like steps. Each of the through holes 60X, 61X is tapered so that the diameter decreases from the upper side toward the lower side (side closer to the insulating layer 31) in FIG. 18A. For example, each through hole 60X, 61X has the shape of an inverted truncated cone in which the lower open end has a smaller diameter than the upper open end. The insulating layer 60 and the insulating layer 61 may be formed from the same material or different materials.

Thus, in the second embodiment, the insulating layer 60, which is used as a mask in the roughening process, is left and not removed. The insulating layer having a two-step structure of the insulating layer 60 and the insulating layer 61 is formed on the upper surface 31A of the insulating layer 31. In this case, the roughened surfaces 54R, 53R are formed by portions of the surface of the wiring layer 50 (wiring pattern 50B), and the roughened surfaces 54R, 53R of the wiring pattern 50A are covered by the insulating layer 61. Thus, the adhesion of the insulating layer 61 and the wiring layer 50 is increased compared to when the entire surface of the wiring layer 50 is a smooth surface. The insulating layer 60 directly stacked on the upper surface 31A of the insulating layer 31 does not cover the roughened surfaces 54R, 53R of the wiring layer 50. Thus, the adhesion of the wiring layer 50 and the insulating layer 60 is low compared to the adhesion of the wiring layer 50 and the insulating layer 61. However, the insulating layer 60 is covered by the insulating layer 61, which covers the roughened surfaces 54R, 53R. Consequently, the insulating layer 60 may be adhered with the wiring layer 50 in a favorable manner.

Figure 18B:
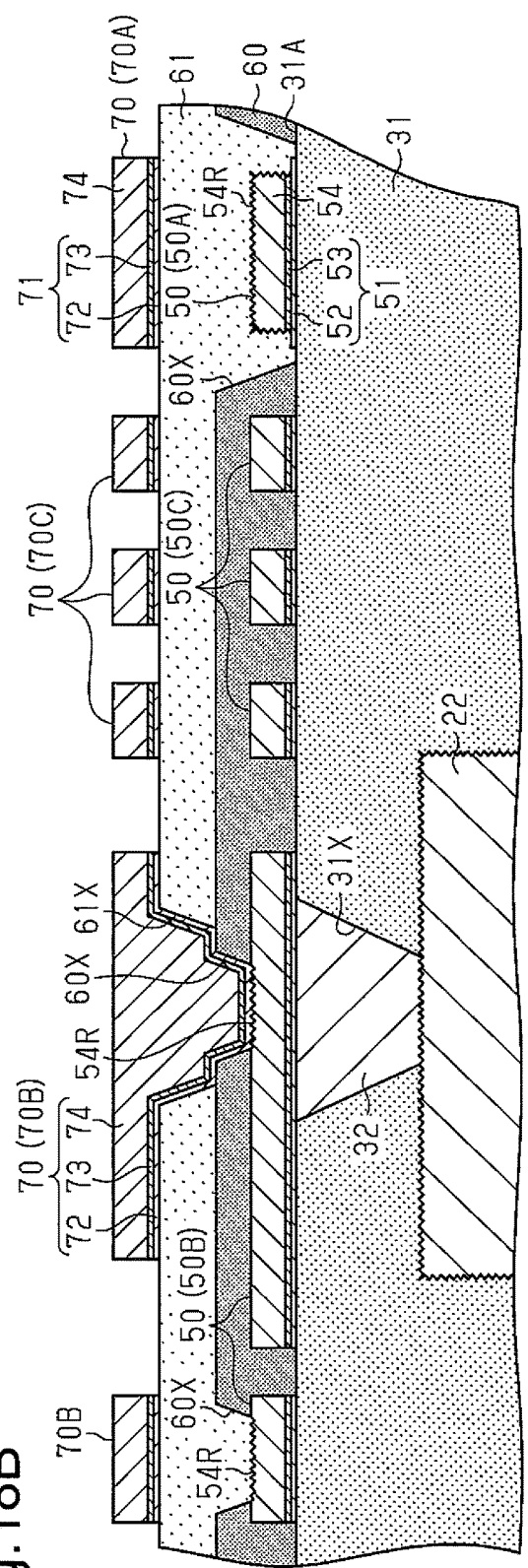

Next, in the same manner as the steps illustrated in FIGS. 6A to 8B, in the step illustrated in FIG. 18B, the wiring layer 70 is formed, for example, through a semi-additive process. The wiring layer 70 includes via wirings, which fill the through holes 60X, 61X, and a plurality of wiring patterns, which are electrically connected to the wiring layer 50 by the via wirings and stacked on the upper surface of the insulating layer 61. Each via wiring that fills the through holes 60X, 61X includes stair-like steps. In the present example, the via wiring of the wiring pattern 70B includes a seed layer 71, which has a double-layer structure of the metal film 72 (metal barrier film) and the metal film 73, and the metal layer 74. The metal film 72 continuously covers the wall surface of the through hole 61X, the upper surface of the insulating layer 60 exposed from the through hole 61X, the wall surface of the through hole 60X, and the upper surface (roughened surface 54R) of the wiring pattern 50B exposed from the through holes 60X, 61X. The metal film 73 covers the entire upper surface of the metal film 72. The metal layer 74 is formed on the metal film 73 and fills the through holes 60X, 61X.

Figure 19:
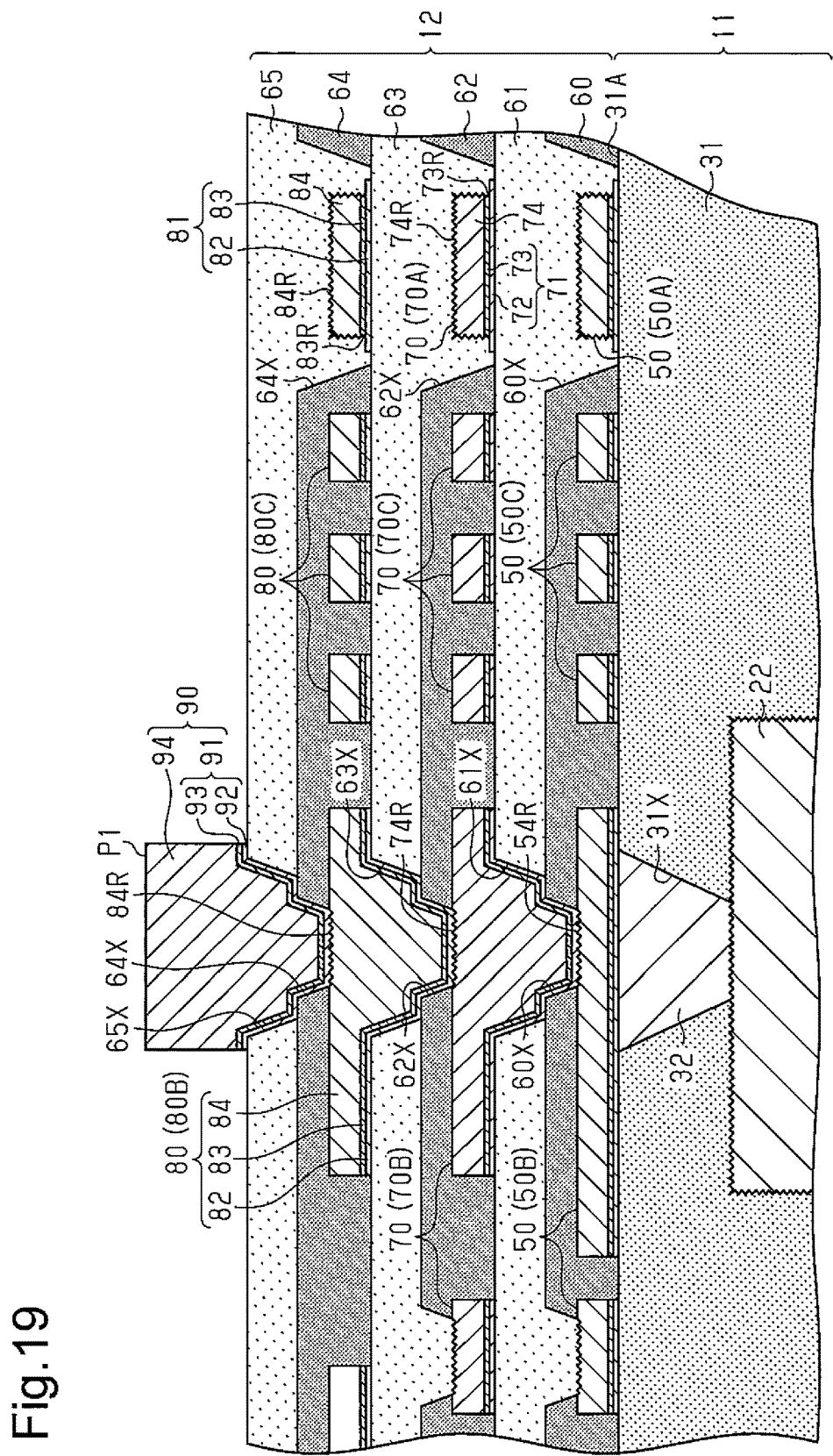

In the same manner as the steps illustrated in FIGS. 17A and 17B, in the step illustrated in FIG. 19, an insulating layer 62 including through holes 62X is formed on the upper surface of the insulating layer 61. A roughening process is performed on the metal film 73 and the metal layer 74 using the insulating layer 62 as a mask. A material similar to the insulating layer 60 may be used as the material of the insulating layer 62. The insulating layer 62 may be formed through the same process as the insulating layer 60. Then, in the same manner as the step illustrated in FIG. 18A, the insulating layer 63 that covers the insulating layer 62 and the wiring layer 70 is formed on the upper surface of the insulating layer 61. The insulating layer 63 includes the through holes 63X exposing portions of the upper surface of the wiring pattern 70B (roughened surface 74R). Then, in the same manner as the step illustrated in FIG. 18B, the wiring layer 80 is formed. The wiring layer 80 includes via wirings, which fill the through holes 62X, 63X and has stair-like steps, and wiring patterns, which are electrically connected to the wiring layer 70 by the via wirings and stacked on the upper surface of the insulating layer 63.

In the same manner as the steps illustrated in FIGS. 17A and 17B, an insulating layer 64 including through holes 64X is formed on the upper surface of the insulating layer 63. A roughening process is performed on the metal film 83 and the metal layer 84 using the insulating layer 64 as a mask. The same material as the insulating layer 60 may be used as the material of the insulating layer 64. The insulating layer 64 may be formed through the same process as the insulating layer 60. Then, in the same manner as the step illustrated in FIG. 18A, the insulating layer 65 that covers the insulating layer 64 and the wiring layer 80 is formed on the upper surface of the insulating layer 63. The insulating layer 65 includes through holes 65X exposing portions (roughened surface 84R) of the upper surface of the wiring pattern 80B. Then, the wiring layer 90 is formed in the same manner as the step illustrated in FIG. 18B. The wiring layer 90 includes via wirings, which fill the through holes 64X, 65X and has stair-like steps, and wiring patterns, which are electrically connected to the wiring layer 80 by the via wirings and stacked on the upper surface of the insulating layer 65.

In the above manufacturing steps, the wiring structure 12 is stacked on the upper surface 31A of the insulating layer 31. In the wiring structure 12, an interlayer insulating layer having a two-step structure of the insulating layer 60 and the insulating layer 61 is formed between the wiring layer 50 and the wiring layer 70. In the same manner, an interlayer insulating layer having a two-step structure of the insulating layer 62 and the insulating layer 63 is formed between the wiring layer 70 and the wiring layer 80. Furthermore, an interlayer insulating layer having a two-step structure of the insulating layer 64 and the insulating layer 65 is formed between the wiring layer 80 and the wiring layer 90. Furthermore, each via wiring of the wiring layers 50, 70, 80 has stair-like steps.

The second embodiment described above has the following advantage in addition to advantages (1) to (6) of the first embodiment.

(7) The via wirings of the wiring layer 70 fill the through holes 60X, 61X with stair-like steps. This increases the area of the wiring layer 70 (via wirings) that contacts the insulating layers 60, 61. Thus, the adhesion of the wiring layer 70 (via wiring) and the insulating layers 60, 61 is improved. The same applies to the via wirings of the wiring layer 80, 90.

The second embodiment may be modified as described below.

In the second embodiment employing the two-step structure of the insulating layers 60, 61, the stair-like steps are formed in the through holes 60X, 61X. This is because the through hole 61X has a larger planar shape than the through hole 60X. However, the shape of the through hole 61X may be changed as described below.

For example, as illustrated in FIG. 20A, each through hole 61X of the insulating layer 61 may have a smaller planar shape than the through hole 60X, and the wall surface of the through hole 60X may be covered by the insulating layer 61. In this case, a portion of the insulating layer 61 is formed in the through hole 60X. Thus, the roughened surface 54R that is exposed at the bottom portion of the through hole 60X is partially exposed at the bottom portion of the through hole 61X. Then, as illustrated in FIG. 20B, the wiring layer 70 is formed after the insulating layers 60, 61 are formed. The wiring layer 70 includes via wirings, which fill the through holes 61X, and wiring patterns, which are electrically connected to the wiring layer 50 by the via wirings and stacked on the upper surface of the insulating layer 61. In FIG. 20B, the via wirings of the wiring pattern 70B includes the seed layer 71, which has a double-layer structure of the metal film 72 and the metal film 73, and a metal layer 74. The metal film 72 continuously covers the wall surface of the through hole 61X and the upper surface (roughened surface 54R) of the wiring pattern 50B exposed from the through hole 61X. The metal film 73 covers the entire upper surface of the metal film 72. The metal layer 74 is formed on the metal film 73 to fill the through hole 61X.

Such a structure also has the same advantages as the second embodiment.

Third Embodiment

A third embodiment will now be described with reference to FIGS. 21A to 23. The third embodiment differs from the first embodiment in the structure and the manufacturing method of the wiring structure 12. The description hereafter will focus on the differences from the first embodiment. Same reference numerals are given to those components that are the same as the corresponding components illustrated in FIGS. 1 to 20B. Such components will not be described in detail.

Figure 21A:
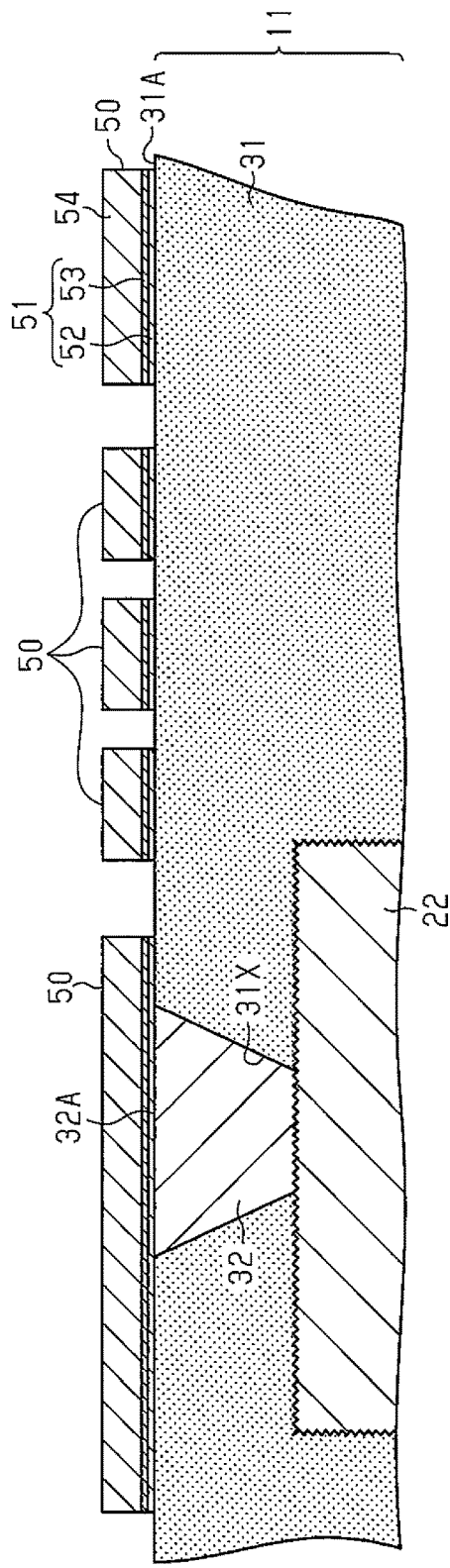
FIGS. 21A, 21B, 22A, 22B, and 23 are enlarged cross-sectional views illustrating a method for manufacturing a wiring substrate in a third embodiment.

In the same manner as the step illustrated in FIGS. 4A to 8B, in the step illustrated in FIG. 21A, a structure corresponding to the wiring structure 11 is formed, and the wiring layer 50 is formed on the upper surface 31A of the uppermost insulating layer 31 of the wiring structure 11 and the upper end surface 32A of the via wiring 32.

Figure 21B:
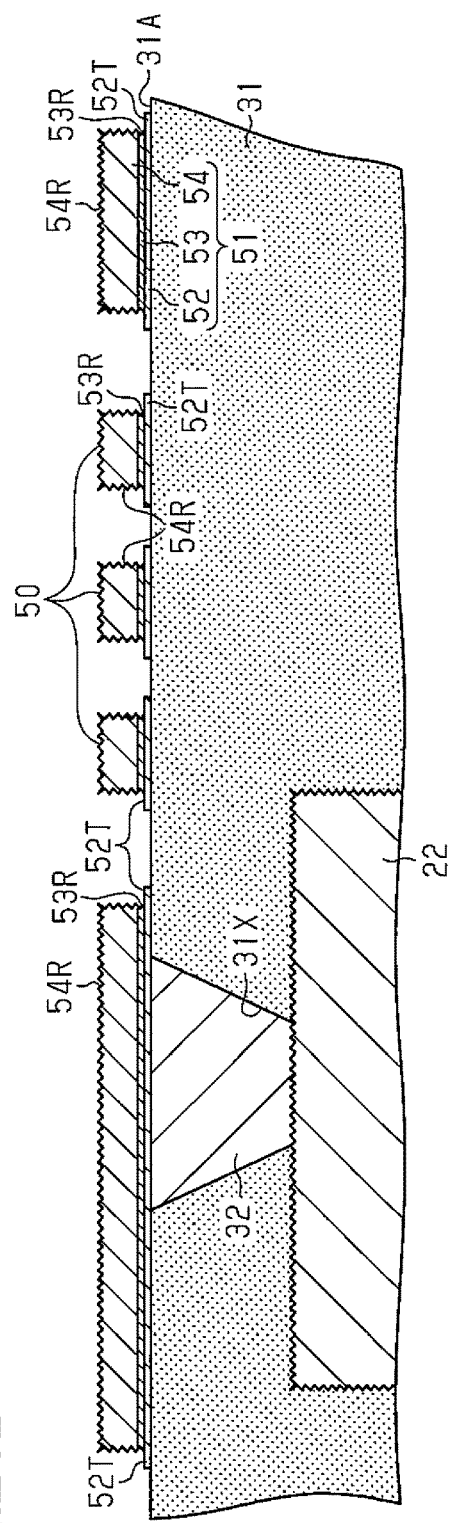

In the step illustrated in FIG. 21B, the roughening process is selectively performed on the metal film 53 and the metal layer 54 (e.g., Cu layer) of the wiring layer 50. The roughening process forms the roughened surface 53R, with the entire side surface of the metal film 53, and the roughened surface 54R, with the entire upper surface and the entire side surface of the metal layer 54. In this case, the metal film 52 is not roughened, and the metal film 53 and the metal layer 54 are roughened. Therefore, when the roughening process etches portions of the surfaces of the metal film 53 and the metal layer 54, the projection 52T is formed by the peripheral portion of the metal film 52. For example, the surfaces of the metal film 53 and the metal layer 54 prior to the roughening have a surface roughness Ra of approximately 1 to 50 nm, whereas the surfaces (i.e., roughened surface 53R, 54R) of the metal film 53 and the metal layer 54 subsequent to the roughening have a surface roughness Ra of approximately 100 to 150 nm. In other words, the surfaces of the metal film 53 and the metal layer 54 are roughened until the surface roughness Ra becomes approximately 100 to 150 nm. However, the roughened surfaces 53R, 54R have a smaller surface roughness than the wiring layer 22. Thus, the roughening process is performed within a range the surface roughness of the metal layer 54 and the metal film 53 becomes smaller than the surface roughness of the wiring layer 22.

Figure 22A:
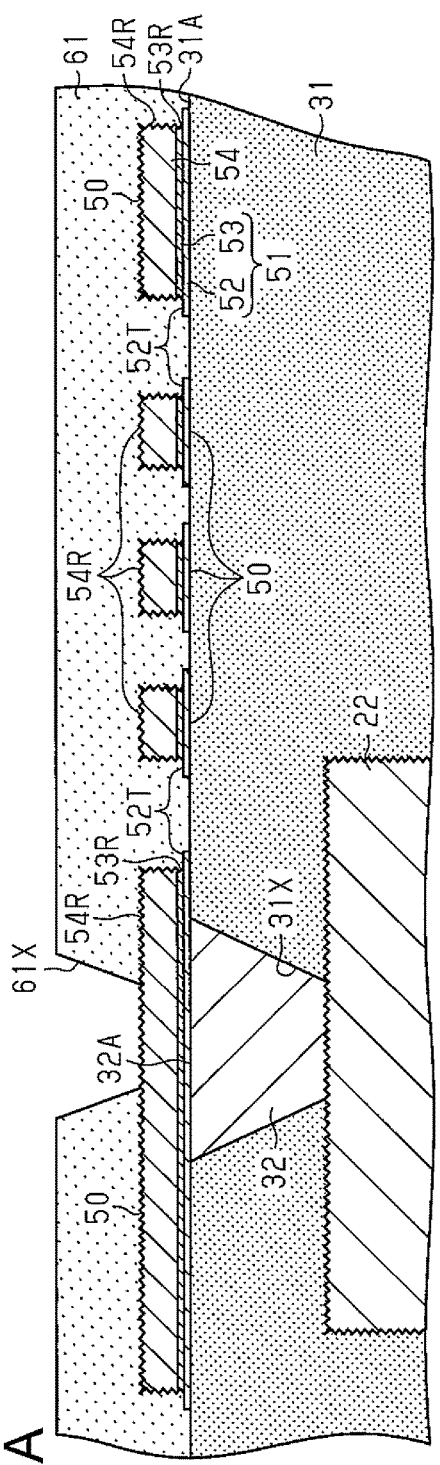

In the step illustrated in FIG. 22A, the insulating layer 61 is formed on the upper surface 31A of the insulating layer 31. The insulating layer 61 includes the through holes 61X, which expose portions of the upper surface of the wiring layer 50. In this case, the surfaces of the metal film 53 and the metal layer 54 entirely form the roughened surfaces 53R, 54R. Thus, the adhesion of the insulating layer 61 and the wiring layer 50 is increased compared to when the entire surface of the wiring layer 50 (metal film 53 and metal layer 54) is a smooth surface.

Figure 22B:
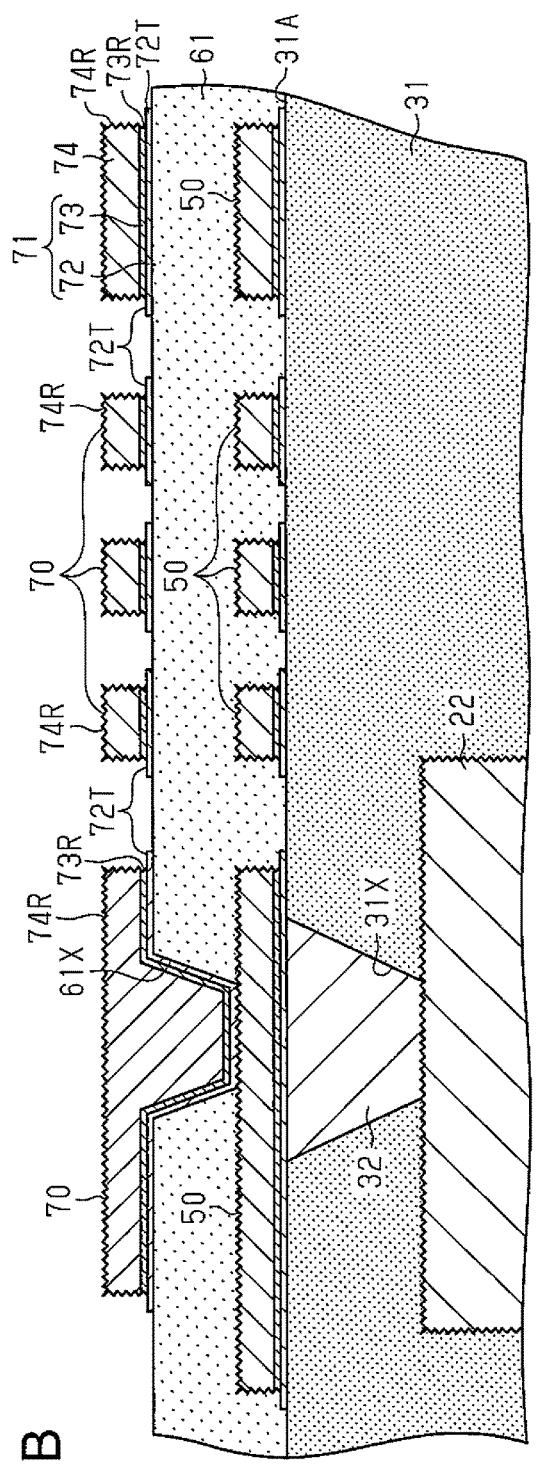

In the same manner as the steps illustrated in FIGS. 6A to 8B, in the step illustrated in FIG. 22B, the wiring layer 70 is formed, for example, through a semi-additive process. The wiring layer 70 includes via wirings, which fill the through holes 61X, and wiring patterns, which are electrically connected to the wiring layer 50 by the via wirings and stacked on the upper surface of the insulating layer 61. Thereafter, a roughening process is selectively performed on the metal film 73 and the metal layer 74 (e.g., Cu layer) of the wiring layer 70 in the same manner as the step illustrated in FIG. 21B. Thus, the entire side surface of the metal film 73 forms the roughened surface 73R, and the entire upper surface and the entire side surface of the metal layer 74 forms the roughened surface 74R. The projection 72T is formed by the peripheral portion of the metal film 72.

Figure 23:
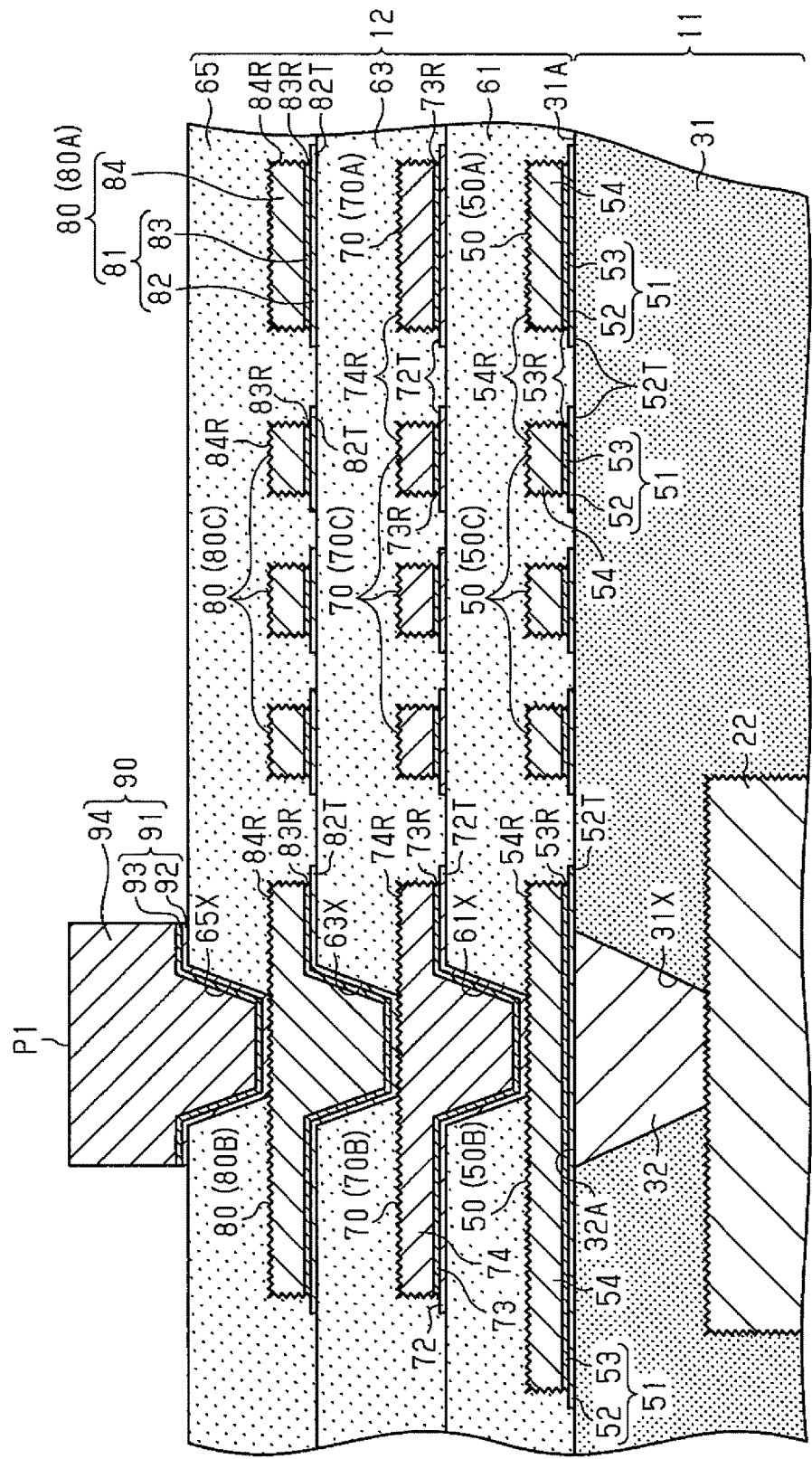

In the step illustrated in FIG. 23, the steps illustrated in FIGS. 22A and 22B are repeatedly executed to stack the insulating layer 63, the wiring layer 80, the insulating layer 65, and the wiring layer 90 in order on the insulating layer 61. In this case, the entire side surface of the metal film 83 forms the roughened surface 83R, the entire surface of the metal layer 84 forms the roughened surface 84R, and the projection 82T is formed by the peripheral portion of the metal film 82 in the wiring layer 80.

In the manufacturing steps described above, the wiring structure 12 is stacked on the upper surface 31A of the insulating layer 31. In the third embodiment, the entire side surfaces of the metal films 53, 73, 83 form the roughened surface 53R, 73R, 83R, the entire surfaces (upper surfaces and side surfaces) of the metal layers 54, 74, 84 form roughened surfaces 54R, 74R, 84R, and the projections 52T, 72T, 82T are formed by the peripheral portions of the metal films 52, 72, 82 in every one of the wiring patterns in each of the wiring layers 50, 70, 80. A metal having higher electro-migration resistance than the metal (e.g., Cu) forming the metal films 53, 73, 83 and the metal layers 54, 74, 84 is preferably used as the material of the metal films 52, 72, 82. For example, titanium (Ti) or Ti alloy may be used as the material of the metal films 52, 72, 82.

When the wiring layers 50, 70, 80 in the wiring structure 12 are further miniaturized, electro-migration has a tendency to occur between adjacent wirings. When the electro-migration occurs, short-circuits occur between the wirings and affects the insulating reliability. Wiring breakage may be caused by electro-migration. Electro-migration occurs at the interface of the wiring layers 50, 70, 80 (in particular, metal films 53, 73, 83 formed from Cu) and the insulating layers 31, 61, 63. In the third embodiment, the wiring layer 50 is formed such that the peripheral portion of the metal film 52, which is formed from Ti that has a high electro-migration resistance, projects toward the outer side from the Cu layer (metal film 53 and metal layer 54). Thus, the metal film 52 is located between the metal film 53 and the insulating layer 31, and electro-migration may be reduced between the metal film 53 and the insulating layer 31. Furthermore, since titanium in the metal film 52 becomes passive more easily than copper, the occurrence of the electro-migration may be reduced at the interface of the metal film 52 and the insulating layer 31 as compared to the interface of the metal film 53 (Cu) and the insulating layer 31. A structure similar to the wiring layer 50 is also employed for the wiring layers 70, 80. Therefore, even if the wiring layers 50, 70, 80 are further miniaturized, problems caused by electro-migration are limited. FIGS. 24A and 24B illustrate an example of an evaluation result of the resistance in relation with electro-migration.

FIG. 24A illustrates the evaluation result obtained by performing a HAST test (unsaturated pressurized vapor test) as an environmental load test on the wiring layer 50 (example sample) including the metal film 52 (Ti), which has the projection 52T, the metal film 53 (Cu), and the metal layer 54 (Cu). Then, the insulating resistance was measured between the adjacent wiring layers 50. FIG. 24B illustrates the evaluation result obtained by performing the HAST test on the wiring layer 50 (comparative example sample), which does not have the projection 52T, and has the side surfaces of the metal film (Ti), the metal film 53 (Cu), and the metal layer 54 (Cu) that are flush with one another in a plan view. Then, the insulating resistance was measured between the adjacent wiring layers 50.

In the evaluation, the insulating resistance between the adjacent wiring layers 50 was measured with an insulating resistance meter for the example sample and the comparative example sample during an initial stage and after the HAST test for a predetermined time (24 hours, 48 hours, 96 hours). The conditions of the HAST test were as follows. The temperature in a furnace was 130°, the humidity was 85%, and the applied voltage was 3.5V.

As apparent from the results illustrated in FIGS. 24A and 24B, the insulating resistance between the wiring layers 50 remained high in the example sample (see FIG. 24A) even when the HAST test was conducted as compared to the comparative example sample (see FIG. 24B). As apparent from this result, electro-migration may be reduced in the wiring layer 50 by the projection 52T arranged in the peripheral portion of the metal film 52.

The third embodiment has the following advantage in addition to the advantages (1) and (3) to (6) of the first embodiment.

(8) In every one of the wiring patterns in each of the wiring layers 50, 70, 80, the projections 52T, 72T, 82T are formed by the peripheral portion of the metal films 52, 72, 82. This reduces electro-migration in the wiring layers 50, 70, 80.

Advantage (8) of the third embodiment may also be obtained in the first and second embodiments.

Fourth Embodiment

A fourth embodiment will now be described with reference to FIGS. 25A to 28. The fourth embodiment differs from the first embodiment in the structure and the manufacturing method of the wiring structure 12. The third embodiment differs from the first embodiment in the structure and the manufacturing method of the wiring structure 12. The description hereafter will focus on the differences from the first embodiment. Same reference numerals are given to those components that are the same as the corresponding components illustrated in FIGS. 1 to 23. Such components will not be described in detail.

Figure 25A:
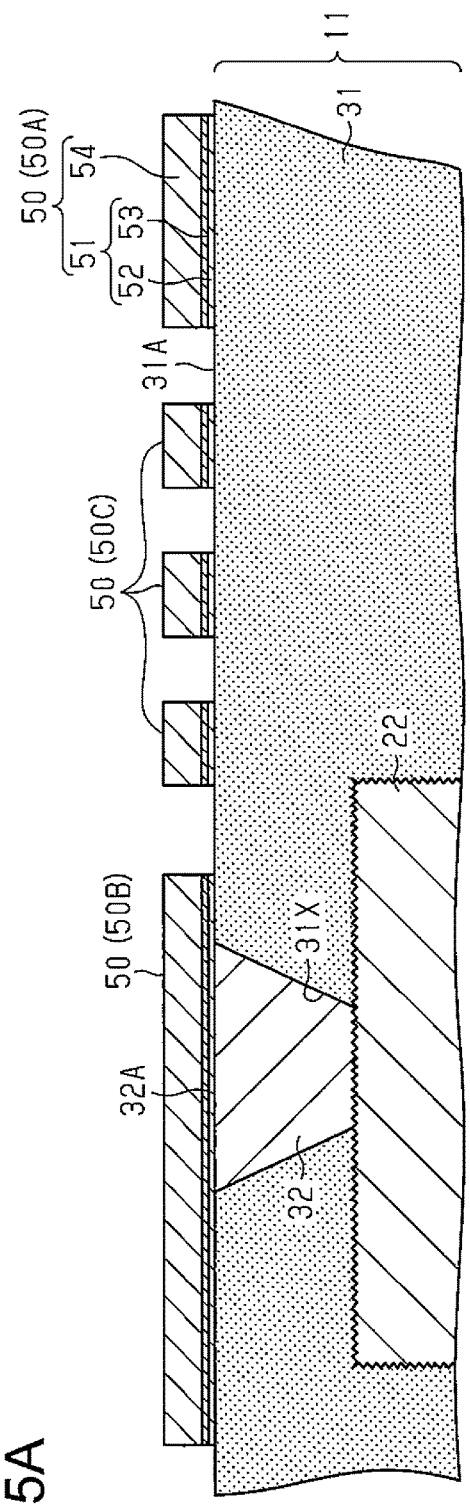

In the same manner as the steps illustrated in FIGS. 4A to 8B, in the step illustrated in FIG. 25A, a structure corresponding to the wiring structure 11 is formed, and the wiring layer 50 is formed on the upper surface 31A of the uppermost insulating layer 31 of the wiring structure 11 and the upper end surface 32A of the via wiring 32.

Figure 25B:
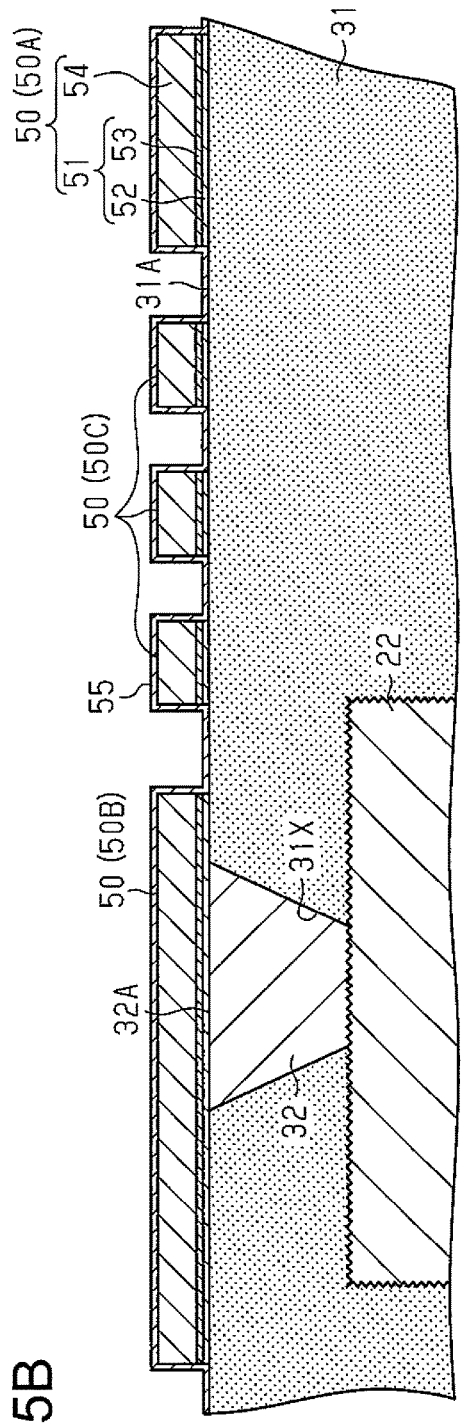

In the step illustrated in FIG. 25B, a protective film 55 is formed. The protective film 55 covers the entire surface (upper surface and side surface) of the wiring layer 50 and the entire upper surface 31A of the insulating layer 31 exposed from the wiring layer 50. The surface of the wiring layer 50, which does not undergo the roughening process, and is a smooth surface having a small surface roughness. The protective film 55 reduces electro-migration, for example, between the wiring layer 50 and the insulating layer 31. For example, a material having a higher electro-migration resistance than the metal (e.g., Cu) forming the metal film 53 and the metal layer 54 is preferably used as the material of the protective film 55. For example, an SiN film (silicon nitride film), an NiP plating film (nickel phosphorus plating film), or an alumina ($Al_2O_3$) film can be used as the protective film 55. The protective film 55 may be formed, for example, through Atomic Layer Deposition (ALD) that obtains a uniform thin film at a molecular level. Alternatively, the protective film 55 may be formed through, for example, Chemical Vapor Deposition (CVD).

Then, in the same manner as the step illustrated in FIG. 8B, in the step illustrated in FIG. 26A, the resist layer 112 is formed on the upper surface 31A of the insulating layer 31. The resist layer 112 includes a plurality of opening patterns 112X at predetermined locations. The opening pattern 112X partially or entirely exposes the protective film 55 covering the wiring pattern having a large upper surface area in the wiring layer 50. For example, the opening pattern 112X exposes the protective film 55 covering the surface of the wiring pattern 50A, which is the solid pattern, and the protective film 55 covering the land of the wiring pattern 50B. Thus, the resist layer 112 covers the protective film 55, which covers the fine wirings of the wiring pattern 50B excluding the land, and the protective film 55, which covers the surface of the wiring pattern 50C. The resist layer 112 also covers the upper surface 31A of the insulating layer 31 located in the periphery of the wiring patterns 50B, 50C, which are the fine wirings.

Then, in the step illustrated in FIG. 26B, the protective film 55 exposed from the resist layer 112 is removed using the resist layer 112 as a mask. The protective film 55 can be removed, for example, through dry etching or wet etching. When etching the protective film 55, the conditions of the etchant and the like are set so that the protective film 55 is selectively etched with respect to the metal films 52, 53 and the metal layer 54. Thus, the resist layer 112 is patterned so that the protective film 55 covers the necessary portion (here, fine wirings).

In the same manner as the step illustrated in FIG. 10A, in the step illustrated in FIG. 27A, the roughening process is performed on the Cu layer (metal layer 54 and metal film 53) of the wiring layer 50 (wiring patterns 50A, 50B) using the resist layer 112 as a mask. The roughening process forms the roughened surface 53R from the entire side surface of the metal film 53 of the wiring layer 50 exposed from the resist layer 112 and the roughened surface 54R form the entire upper surface and the entire side surface of the metal layer 54. Furthermore, partially etching of the surfaces of the metal film 53 and the metal layer 54 during the roughening process forms the projection 52T in the peripheral portion of the metal film 52. In this case, the surface of the resist layer 112 and the surface of the wiring layer (part of wiring pattern 50B and wiring pattern 50C) covered by the protective film 55 remain smooth and are not roughened. For example, the entire side surface of the metal film 53 of the wiring pattern 50C is maintained as the smooth surface 53S, and the entire surface of the metal layer 54 of the wiring pattern 50C is maintained as the smooth surface 54S. This forms the protective film 55 on the surface (smooth surface) of the wiring pattern 50C. The protective film 55 covers the upper surface 31A of the insulating layer 31 located in the periphery of portions of the wiring pattern 50B and the wiring pattern 50C, which are the fine wirings.

In the present example, the resist layer 112 is not removed and used as a mask. However, the roughened process may be performed after removing the resist layer 112. In this case, the protective film 55 is used as the mask.

Thereafter, the resist layer 112 is removed with an alkaline defoliation solution, for example. Then, in the step illustrated in FIG. 27B, the insulating layer 61 including the through holes 61X exposing portions of the upper surface of the wiring layer 50 is formed on the upper surface 31A of the insulating layer 31. The roughened surfaces 54R, 53R are formed in portions of the surface of the wiring layer 50. This increases the adhesion of the insulating layer 61 and the wiring layer 50 as compared to when the entire surface of the wiring layer 50 is a smooth surface.

Figure 28:
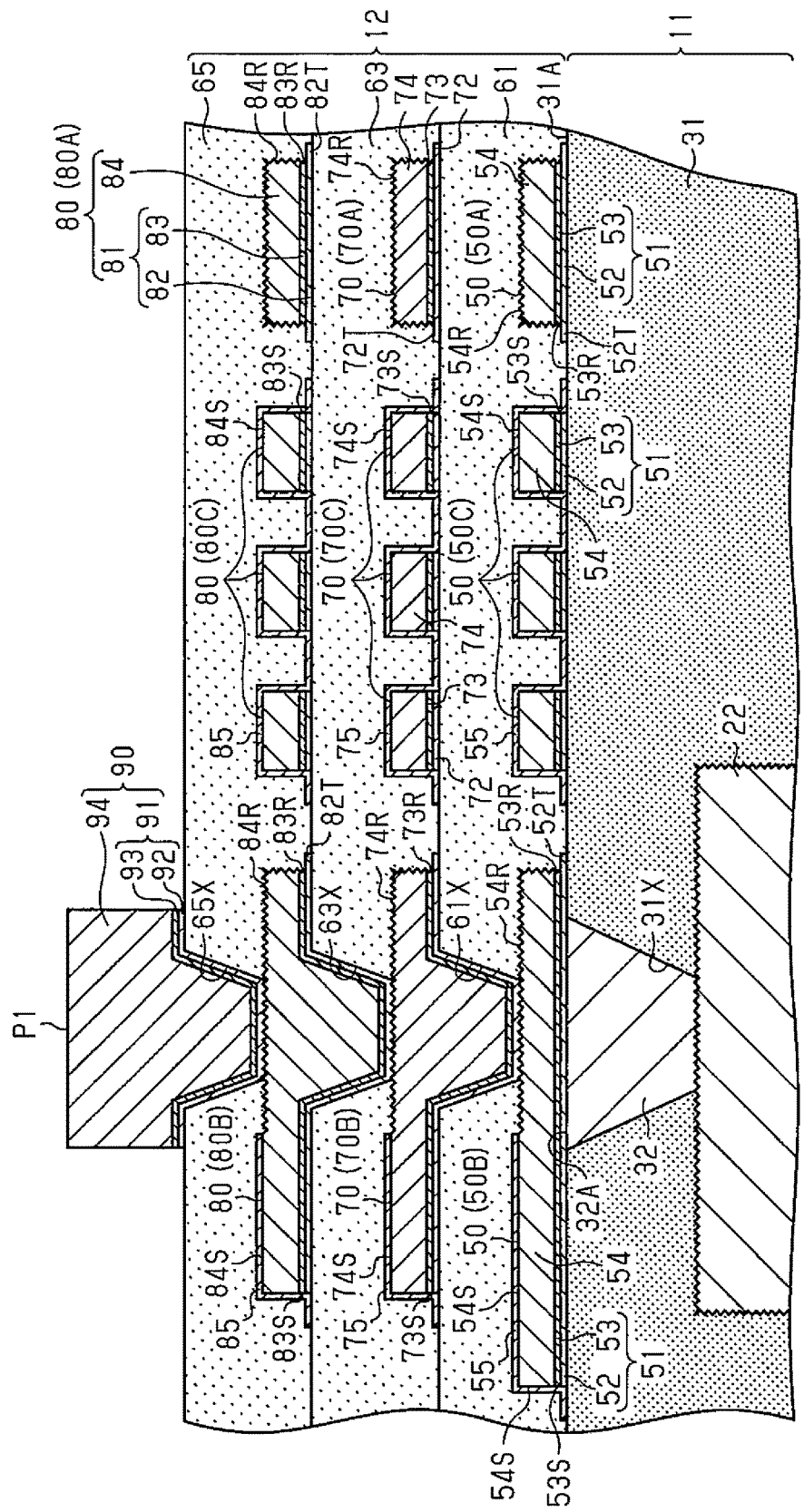

In the same manner as the steps illustrated in FIGS. 6A to 8B, in the step illustrated in FIG. 28, the wiring layer 70 is formed, for example, through a semi-additive process. The wiring layer 70 includes via wirings, which fill the through holes 61X, and wiring patterns, which are electrically connected to the wiring layer 50 by the via wirings and stacked on the upper surface of the insulating layer 61. Then, in the same manner as the steps illustrated in FIGS. 25B to 27B, the protective film 75 is formed on a portion of the wiring pattern 70B and on the surface of the wiring pattern 70C (e.g., smooth surfaces 74S, 73S), which are fine wirings. The roughening process is then performed on the wiring layer 70 exposed from the protective film 75.

Next, the insulating layer 63 including the through holes 63X, which expose portions of the upper surface of the wiring layer 70, are formed on the upper surface of the insulating layer 61. Then, the wiring layer 80 is formed, for example, through a semi-additive process. The wiring layer 80 includes via wirings, which fills the through holes 63X, and wiring patterns, which are electrically connected to the wiring layer 70 by the via wirings and stacked on the upper surface of the insulating layer 63. The protective film 85 is then formed on portions of the wiring pattern 80B and the surface of the wiring pattern 80C (e.g., smooth surfaces 84S, 83S), which are the fine wirings. The roughening process is then performed on the wiring layer 80 exposed from the protective film 85.

The insulating layer 65 including the through holes 65X, which expose portions of the upper surface of the wiring layer 80, are then formed on the upper surface of the insulating layer 63. Then, the wiring layer 90 is formed. The wiring layer 90 includes via wirings, which fill the through holes 65X, and pads P1, electrically connected to the wiring layer 80 by the via wirings and stacked on the upper surface of the insulating layer 65.

The manufacturing steps described above stack the wiring structure 12 on the upper surface 31A of the insulating layer 31.

The fourth embodiment described above has the following advantage in addition to advantages (1) to (6) of the first embodiment.

(9) The surface of the wiring pattern (e.g., wiring pattern 50c) of the fine wirings having a small surface area of the wiring layer 50 is smooth, and the protective film 55 is formed on the smooth surface. The protective film 55 is thus arranged between the metal film 53 and the insulating layer 31, and electro-migration is reduced between the metal film 53 and the insulating layer 31. A structure similar to the wiring layer 50 is also used for the wiring layers 70, 80. Therefore, problems caused electro-migration are limited even when the wiring layers 50, 70, 80 are further miniaturized.

The surfaces of the wiring patterns 50C, 70C, 80C of the fine wirings remain smooth and are not roughened. Roughened surface are formed in the regions of the surfaces of the wiring layers 50, 70, 80 in which the surface area of the solid pattern (power supply plane, GND plane, etc.), the land, and the like. This limits increases in the resistance of the fine wirings in the wiring layers 50, 70, 80, while increasing the adhesion of the wiring layers 50, 70, 80 and the insulating layers 61, 63, 65.

Modifications of First to Fourth Embodiments

The first to fourth embodiments may be modified as described below.

Figure 29:
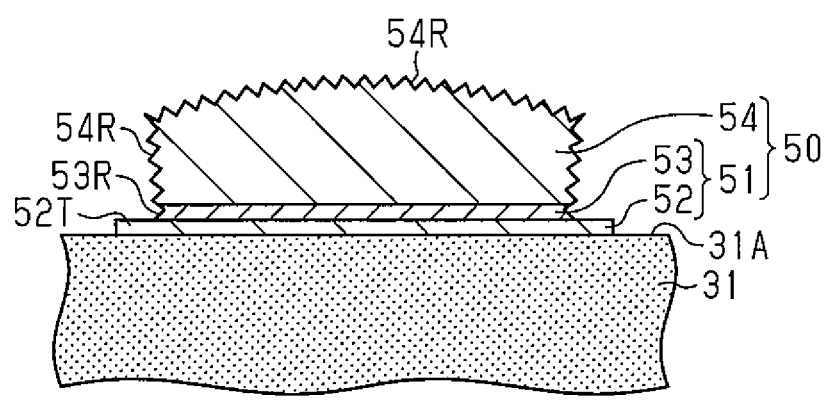
FIG. 29 is an enlarged cross-sectional view illustrating a wiring layer in a modified example.

As illustrated in FIG. 29, the upper surface (roughened surface 54R) of the wiring layer 50 (metal layer 54) in each embodiment described above may be bulged. More specifically, the upper surface (roughened surface 54R) of the wiring layer 50 may be curved and bulged toward the upper side from the peripheral portion toward the central portion. The wiring layers 70, 80 may be modified in the same manner.

In the first embodiment described above, the side surface of the metal film 52 located immediately below the smooth surface 53S is substantially flush with the side surface (smooth surface 53S) of the metal film 53 and the side surface (smooth surface 54S) of the metal layer 54. However, the structure is not limited in such a manner.

Figure 30:
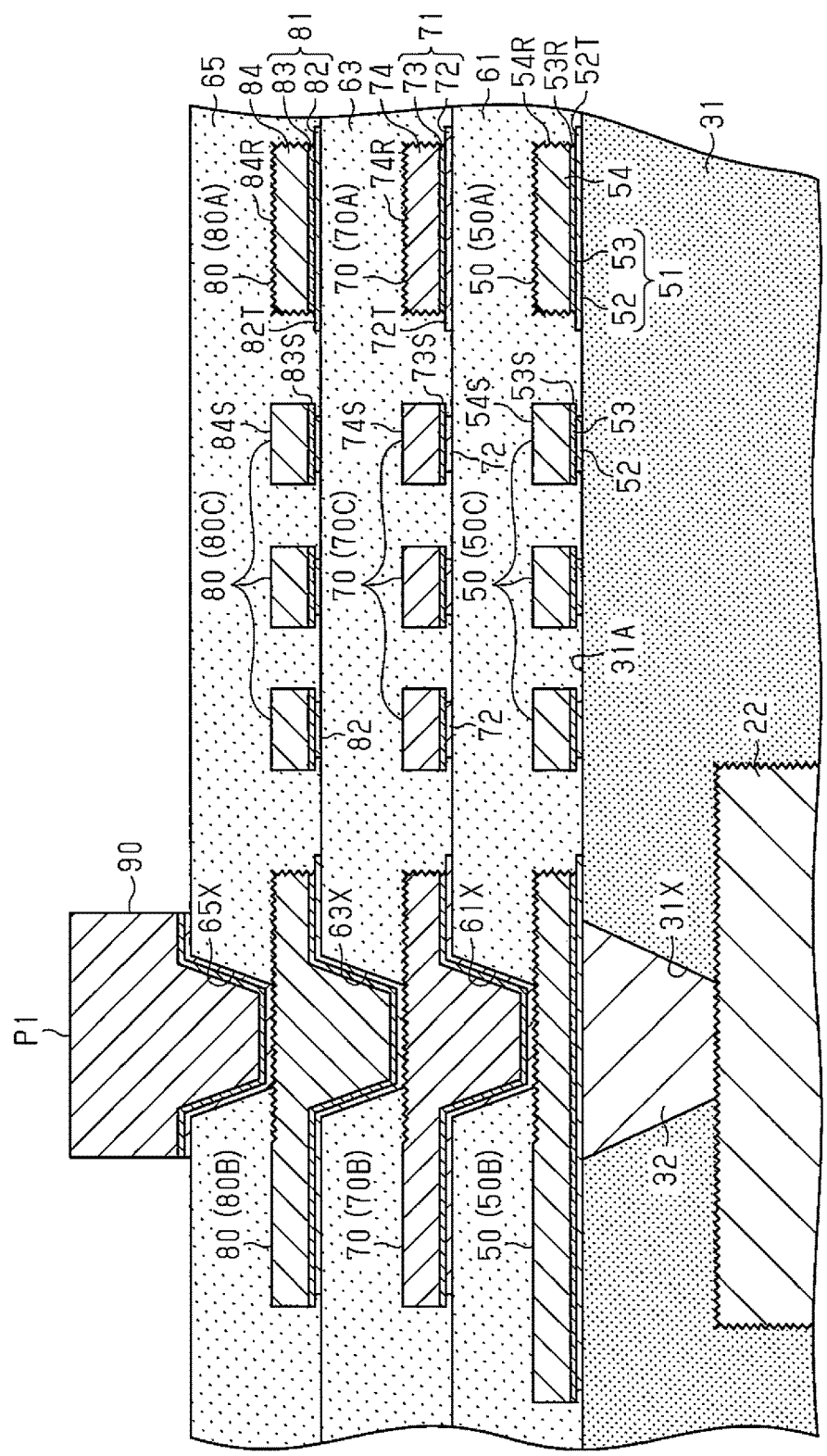
FIG. 30 is a partial enlarged cross-sectional view illustrating a wiring substrate in the modified example.

For example, as illustrated in FIG. 30, the side surface of the metal film 52 located immediately below the smooth surface 53S may be arranged at the inner side of the side surfaces (smooth surfaces 53S, 54S) of the metal film 53 and the metal layer 54. Such structure can be formed, for example, by adjusting the processing time, and the like of when etching the metal film 52 using the metal film 53 and the metal layer 54 as the etching masks. For example, if the unnecessary metal film 52 is removed by wet etching using a mixture of hydrogen peroxide solution and phosphoric acid or the like as the etchant, the masking effect of the metal film 53 and the metal layer 54 cause side etching and undercutting. Thus, the peripheral portion of the metal film 52 can be formed at the inner side of the side surface of the metal film 53. This forms an overhang structure in which the peripheral portion of the metal film 53 extends toward the outer side from the metal film 52. Therefore, the insulating layer 61 enters the lower side of the overhang structure. Thus, the insulating layer 61 is suitably suppressed from being stripped from the wiring layer 50. As illustrated in FIG. 30, the wiring layers 70, 80 may be modified in the same manner. The wiring layers 50, 70, 80 in the wiring structure 12 of the second and fourth embodiments may be modified in the same manner.

In the fourth embodiment described above, the protective film 55 is formed on the smooth surface of the wiring layer 50 that does not undergo the roughening process. However, the location where the protective film 55 is formed is not particularly limited.

For example, as illustrated in FIG. 31A, the roughened surfaces 54R, 53R of the wiring layer 50 may be covered with the protective film 55. In this case, the surface (upper surface and side surface) of the protective film 55 is formed to be the roughened surface 55R in accordance with the irregularities of the roughened surfaces 54R, 53R. The roughened surface 55R has a surface roughness of approximately 100 to 150 nm, for example, like the roughened surfaces 54R, 53R. The adhesion of the insulating layer 61 and the wiring layer 50 can be increased by forming the protective film 55. A method for forming the $Al_2O_3$ film as the protective film 55 on the roughened surfaces 54R, 53R will now be described.

First, in the step illustrated in FIG. 31A, the roughening process is performed on certain locations of the wiring layer 50 to form the roughened surfaces 54R, 53R in the step illustrated in FIG. 10A. Then, the protective film 55 for covering the roughened surfaces 54R, 53R is formed. The protective film 55 can be formed through ALD, for example. Thereafter, the resist layer 112 is removed, for example, with an alkaline defoliation solution.

In the step illustrated in FIG. 31B, the insulating layer 61 is formed on the upper surface 31A of the insulating layer 31. The insulating layer 61 includes through holes 61X, which expose portions of the upper surface of the wiring layer 50 including the protective film 55. A portion of the upper surface of the protective film 55 formed in the land of the wiring pattern 50B is exposed from the through hole 61X. In this case, the roughened surface 55R is formed by a portion of the surface of the wiring layer 50. This increases the adhesion of the insulating layer 61 and the wiring layer 50 as compared to when the entire surface of the wiring layer 50 is smooth.

In the step illustrated in FIG. 31C, the protective film 55 exposed from the through hole 61X is removed, and a portion of the upper surface (roughened surface 54R) of the metal layer 54 is exposed at the bottom portion of the through hole 61X. The protective film 55 may be removed, for example, through plasma processing. Then, the wiring layer 70 is formed, for example, through a semi-additive process in the same manner as the steps illustrated in FIGS. 12A and 12B. The wiring layer 70 includes via wirings, which fill the through holes 61X, and wiring patterns, which are electrically connected to the wiring layer 50 by the via wirings and stacked on the upper surface of the insulating layer 61. In the same manner as the wiring layers 70, 80, the protective film 75 may be formed on the roughened surfaces 74R, 73R of the wiring layer 70. In the same manner, the protective film 85 may be formed on the roughened surface 84R, 83R of the wiring layer 80.

Alternatively, the protective film 55, which covers the smooth surfaces 53S, 54S may be formed, in addition to the protective film 55, which covers the roughened surfaces 53R, 54R. In the same manner, the protective film 75, which covers the smooth surfaces 73S, 74S may be formed, in addition to the protective film 75, which covers the roughened surfaces 73R, 74R. In the same manner, the protective film 85, which covers the smooth surfaces 83S, 84S may be formed, in addition to the protective film 85, which covers the roughened surfaces 83R, 84R.

Figure 32:
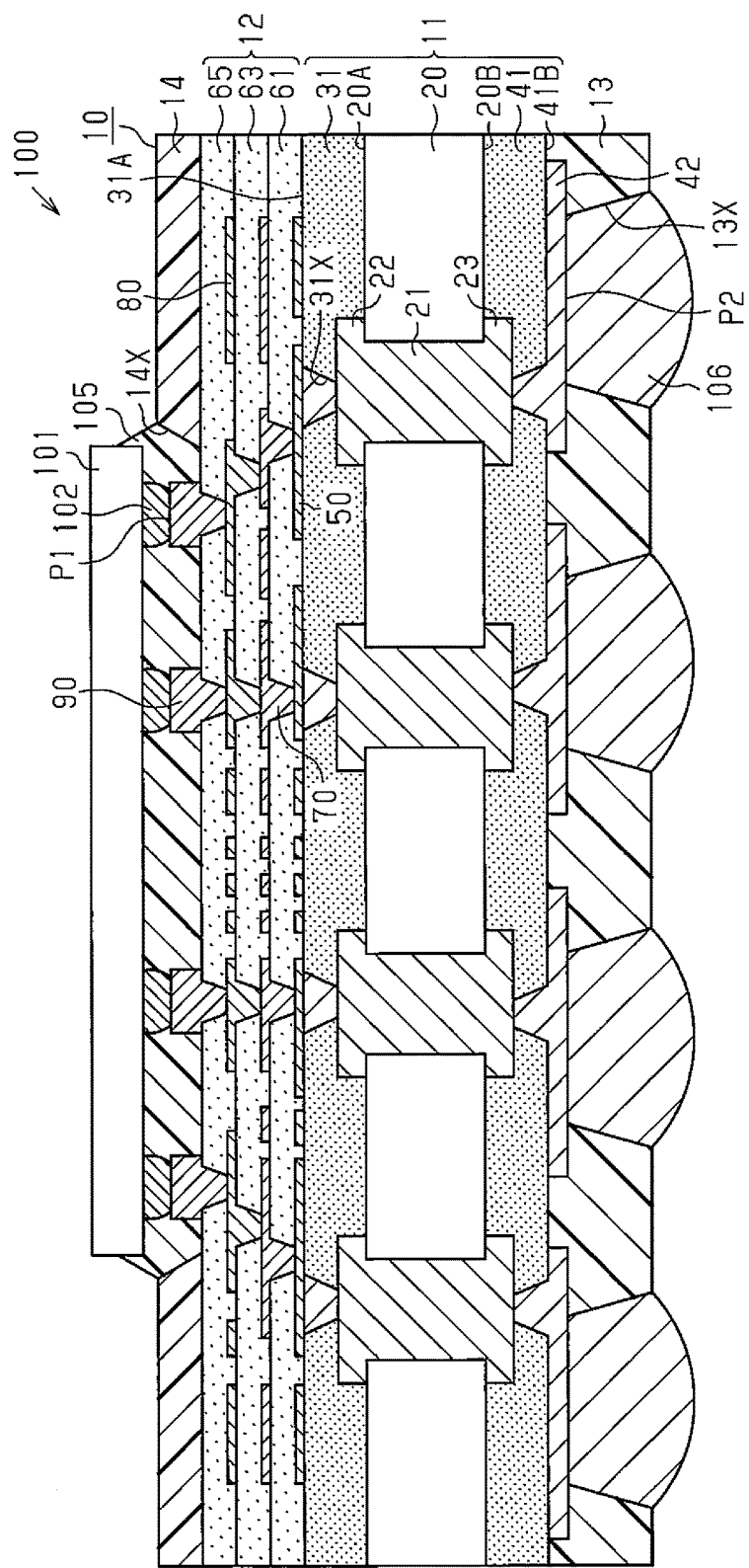
FIG. 32 is a schematic cross-sectional view illustrating a semiconductor device in the modified example (cross-sectional view taken along line 32-32 in FIG. 33)

As illustrated in FIG. 32, the solder resist layer 14 may be formed on the upper surface of the uppermost insulating layer 65 of the wiring substrate 10. In other words, the solder resist layer 14 may also be formed on the insulating layer 65 on the chip mounting surface where the semiconductor chip 101 is mounted.

Figure 33:
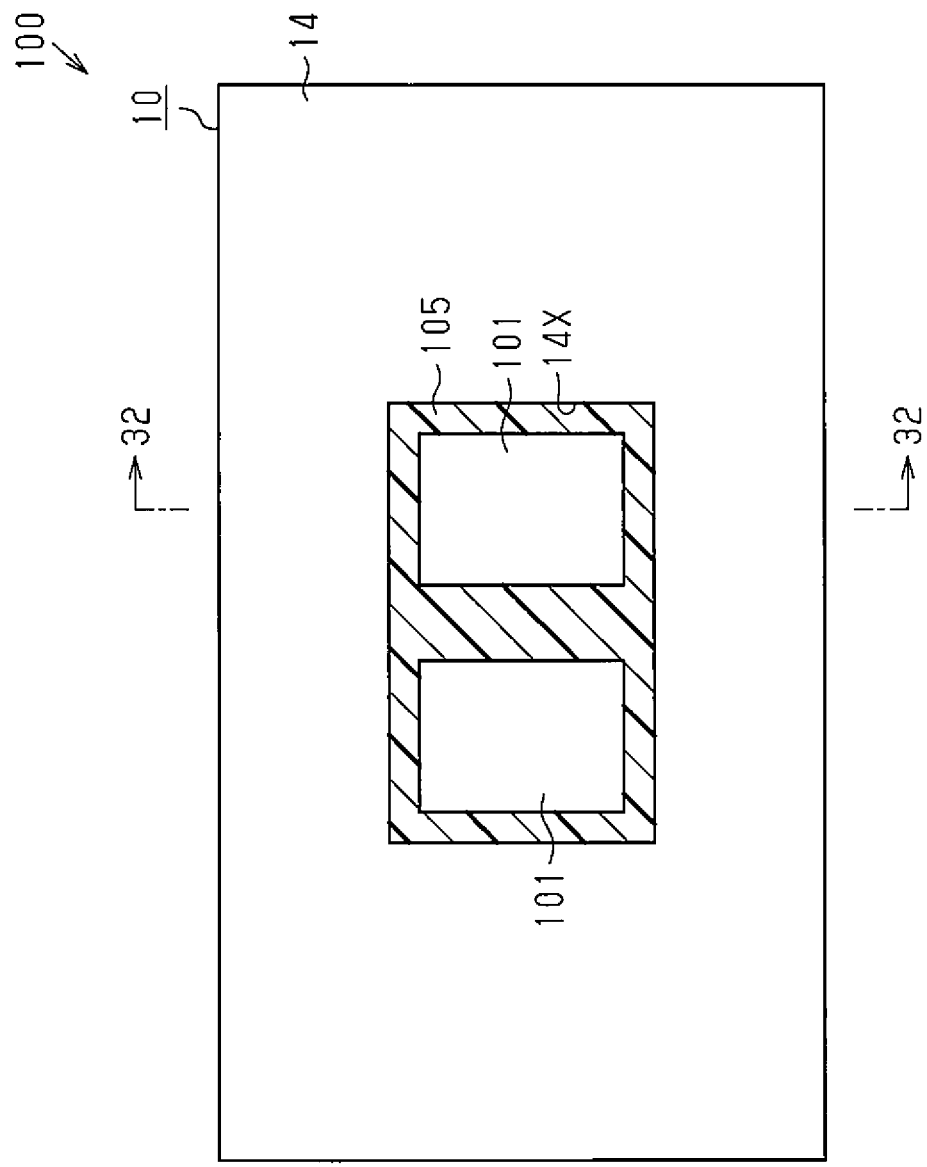
FIG. 33 is a schematic plan view of the semiconductor device illustrated in FIG. 32.

As illustrated in FIG. 33, the solder resist layer 14 is frame-shaped and surrounds a chip mounting region where, for example, one or more (two in FIG. 33) semiconductor chips 101 are mounted.

In the wiring layer 50 of the first to fourth embodiments, the wiring patterns 50A, 50B, 50C are formed on the same plane. Instead, the wiring layer 50 may include, for example, only the wiring patterns 50C, 50A or only the wiring patterns 50C, 50B. In other words, one of the wiring patterns 50A, 50B may be omitted.

Fifth Embodiment

A fifth embodiment will now be described with reference to FIG. 34. A wiring substrate 10A of the fifth embodiment differs from the first embodiment in that the wiring structure 11 is replaced by a wiring structure 11A. The description hereafter will focus on the differences from the first embodiment. Same reference numerals are given to those components that are the same as the corresponding components illustrated in FIGS. 1 to 32. Such components will not be described in detail.

Figure 34:
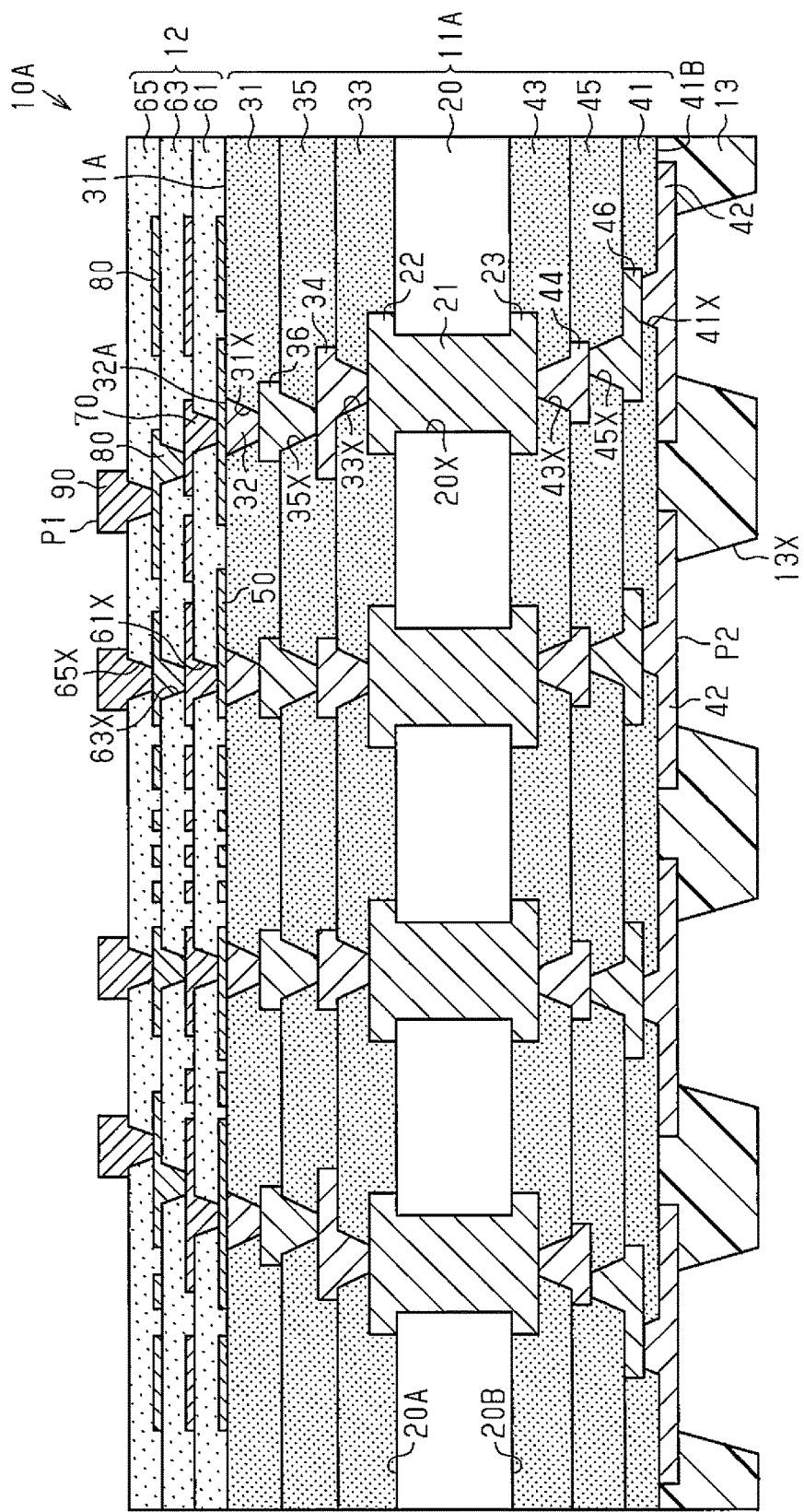
FIG. 34 is a schematic cross-sectional view illustrating a wiring substrate in a fifth embodiment.

As illustrated in FIG. 34, the wiring substrate 10A includes the wiring structure 11A (first wiring structure), the wiring structure 12 stacked on the upper side of the wiring structure 11A, and the solder resist layer 13 stacked on the lower side of the wiring structure 11A.

The wiring structure 11A includes a low density wiring layer having a lower wiring density than the wiring structure 12. The insulating layer 33, the wiring layer 34, the insulating layer 35, the wiring layer 36, the insulating layer 31, and the via wirings 32 are sequentially stacked on the upper surface 20A of the core substrate 20. The insulating layer 33 covers the wiring layer 22. The insulating layer 43, the wiring layer 44, the insulating layer 45, the wiring layer 46, the insulating layer 41, and the wiring layer 42 are sequentially stacked on the lower surface 20B of the core substrate 20. The insulating layer 43 covers the wiring layer 23.

a non-photosensitive insulative resin, the main component of which is a thermosetting resin such as epoxy-based resin, polyimide-based resin, or the like, may be used as the material of the insulating layers 33, 35, 31, 43, 45, 41. The insulating layers 33, 35, 31, 43, 45, 41 may contain, for example, a filler such as silica, alumina, or the like. Copper or copper alloy, for example, may be used as the material of the wiring layers 34, 36, 44, 46, 42 and the via wiring 32. Each of the insulating layers 33, 35, 31, 43, 45, 41 has, for example, a thickness of approximately 20 to 45 µm. Each of the wiring layers 34, 36, 55, 46, 42 has, for example, a thickness of approximately 15 to 35 µm. Each of the wiring layers 34, 36, 44, 46, 42 is formed, for example, to have a line and space (L/S) of approximately 20 µm/20 µm. The surface of each of the wiring layer 34, 36, 44, 46, 42 has, for example, a surface roughness Ra of greater than or equal to 200 nm.

Through holes 33X are formed at certain locations in the insulating layer 33. Each through hole 33X extends through the insulating layer 33 in the thickness-wise direction and exposes a portion of the upper surface of the wiring layer 22. Through holes 35X are formed at the certain location of the insulating layer 35. Each through hole 35X extends through the insulating layer 35 in the thickness-wise direction and exposes a portion of the upper surface of the wiring layer 34. Through holes 31X are formed at certain location of the insulating layer 31. Each through hole 31X extends through the insulating layer 31 in the thickness-wise direction and exposes a portion of the upper surface of the wiring layer 36. Each of the through holes 33X, 35X, 31X is tapered so that the diameter decreases from the upper side (side closer to wiring structure 12) toward the lower side (side closer to core substrate 20) in FIG. 34. In the wiring layer 34, each through hole 33X is filled with a via wiring electrically connected to the wiring layer 22. In the wiring layer 36, each through hole 35X is filled with a via wiring electrically connected to the wiring layer 34. The through hole 31X is filled with the via wiring 32 electrically connected to the wiring layer 36.

The wiring structure 12 is stacked on the upper surface 31A of the insulating layer 31 and the upper end surface 32A of each via wiring 32. Like the first embodiment, the upper surface 31A and the upper end surface 32A are polished surfaces.

Through holes 43X are formed at certain location in the insulating layer 43. Each through hole 43X extends through the insulating layer 43 in the thickness-wise direction and exposes a portion of the lower surface of the wiring layer 23. Through holes 45X are formed at certain locations in the insulating layer 45. Each through hole 45X extends through the insulating layer 45 in the thickness-wise direction and exposes a portion of the lower surface of the wiring layer 44. Through holes 41X are formed at certain location of the insulating layer 41. Each through hole 41X extends through the insulating layer 41 in the thickness-wise direction and exposes a portion of the lower surface of the wiring layer 46. Each through hole 43X, 45X, 41X is tapered so that the diameter decreases from the lower side (side closer to solder resist layer 13) toward the upper side (side closer to core substrate 20) in FIG. 34. In the wiring layer 44, each through hole 43X is filled with a via wiring and is electrically connected to the wiring layer 23. In the wiring layer 46, each through hole 45X is filled with a via wiring that is electrically connected to the wiring layer 44. In the wiring layer 42, each through hole 41X is filled with a via wiring that is electrically connected to the wiring layer 46.

Advantages (1) to (5) of the first embodiment are obtained even if a plurality of insulating layers and a plurality of wiring layers are stacked on the upper surface 20A and the lower surface 20B of the core substrate 20.

Sixth Embodiment

A sixth embodiment will now be described with reference to FIG. 35. A wiring substrate 10B of the sixth embodiment differs from the first embodiment in that the wiring structure 11 is replaced by a wiring structure 11B and the wiring structure 12 is replaced by a wiring structure 12B. The description hereafter will focus on the differences from the first embodiment. Same reference numerals are given to those components that are the same as the corresponding components illustrated in FIGS. 1 to 34. Such components will not be described in detail.

Figure 35:
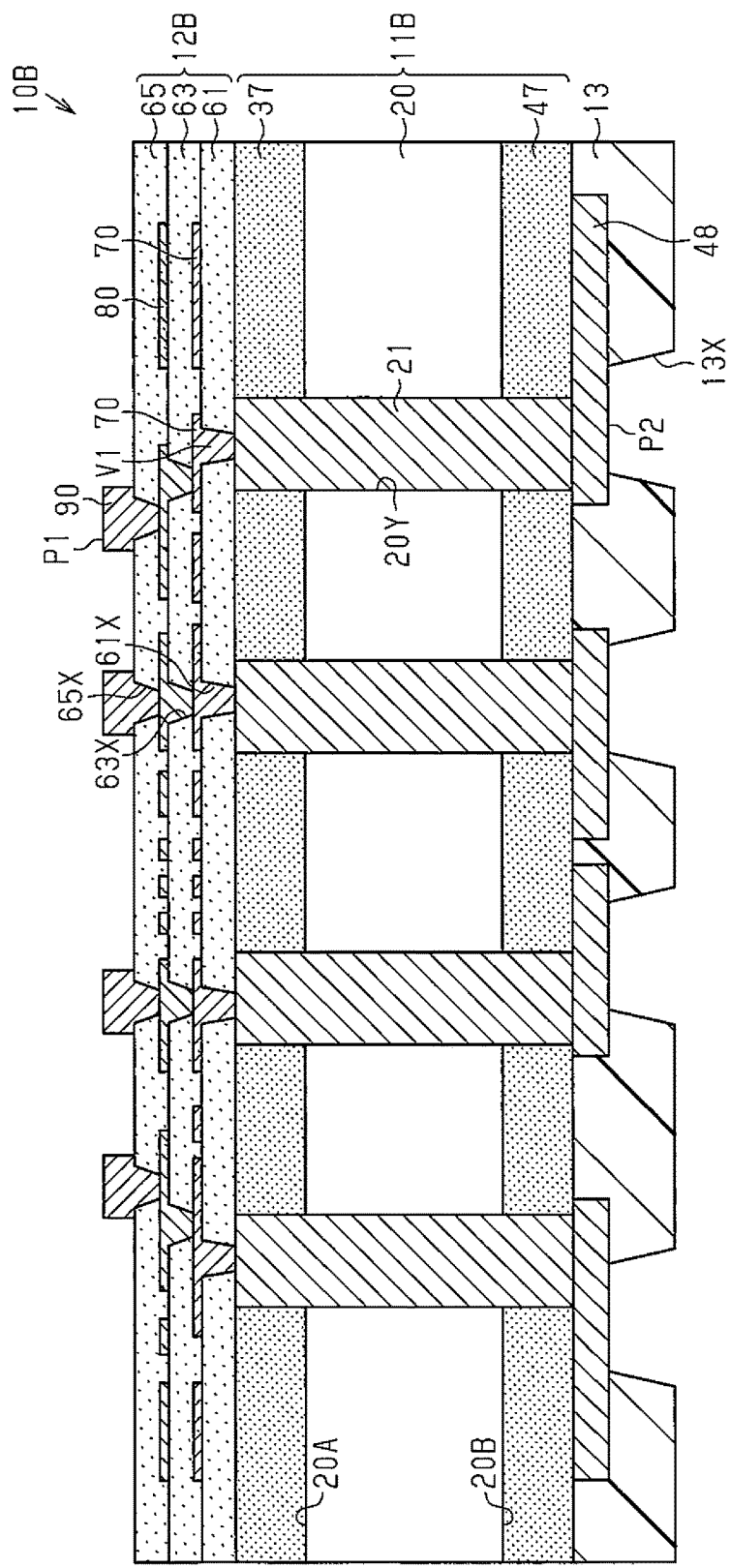
FIG. 35 is a schematic cross-sectional view illustrating a wiring substrate in a sixth embodiment.

As illustrated in FIG. 35, the wiring substrate 10B includes a wiring structure 11B (first wiring structure), a wiring structure 12B (second wiring structure) stacked on the upper side of the wiring structure 11B, and the solder resist layer 13 stacked on the lower side of the wiring structure 11B.

The wiring structure 11B has a multi-layer stacked structure in which insulating layers and wiring layer are stacked in multiple layers. The wiring structure 11B includes a low density wiring layer having a lower wiring density than the wiring structure 12B. In the wiring structure 11B, only the insulating layer 37 is stacked on the upper surface 20A of the core substrate 20, and the insulating layer 47 and the wiring layer 48 are stacked on the lower surface 20B of the core substrate 20. For example, a non-photosensitive insulative resin, the main component of which is a thermosetting resin such as an epoxy-based resin, a polyimide-based resin, or the like may be used as the material of the insulating layers 37, 47. The insulating layers 37, 47 contain, for example, a filler such as silica, alumina, and the like. Copper or copper alloy, for example, may be used as the material of the wiring layer 48. The insulating layer 37 has the same thickness as the insulating layer 47. Each of the insulating layers 37, 47 has, for example, a thickness of approximately 20 to 45 µm. The wiring layer 48 has, for example, a thickness of approximately 15 to 35 µm.

The wiring structure 11B includes through holes 20Y that extend through the core substrate 20 and the insulating layers 37, 47 in the thickness-wise direction. The through electrode 21 is formed in each through hole 20Y. In the present example, the through hole 20Y is filled with the through electrode 21. The upper end surface of the through electrode 21 is exposed from the upper surface of the insulating layer 37, and the lower end surface of the through electrode 21 is exposed from the lower surface of the insulating layer 47. For example, the upper end surface of the through electrode 21 is substantially flush with the upper surface of the insulating layer 37, and the lower end surface of the through electrode 21 is substantially flush with the lower surface of the insulating layer 47. The upper end surface of the through electrode 21 is directly joined with the via wiring V1 of the wiring layer 70 in the wiring structure 12B. The lower end surface of the through electrode 21 is directly joined with the wiring layer 48.

The wiring structure 12B does not include the wiring layer 50, and the lower end surface of the via wiring V1 is directly joined with the upper end surface of the through electrode 21. The insulating layer 61 covers the entire upper surface of the insulating layer 37. The wiring layer 70 including the via wiring V1 is stacked on the upper surface of the insulating layer 61.

The solder resist layer 13 is formed on the lower surface of the insulating layer 47 to cover the lowermost wiring layer 48. The solder resist layer 13 includes openings 13X exposing portions of the lowermost wiring layer 48 as the external connection pads P2. The thickness of the solder resist layer 13 (thickness from lower surface of insulating layer 47 to lower surface of solder resist layer 13) is set to be greater than or equal to the thickness of the wiring structure 12 (thickness from upper surface of insulating layer 37 to upper surface of insulating layer 65).

Advantages (1) to (5) of the first embodiment are obtained even if the wiring structure 11B does not have the multi-layer stacked structure.

Seventh Embodiment

A seventh embodiment will now be described with reference to FIG. 36. A wiring substrate 10C of the seventh embodiment differs from the fifth embodiment in the structure of the uppermost wiring layer. The difference with the fifth embodiment will be centrally described below. The description hereafter will focus on the differences from the first embodiment. Same reference numerals are given to those components that are the same as the corresponding components illustrated in FIGS. 1 to 35. Such components will not be described in detail.

Figure 36:
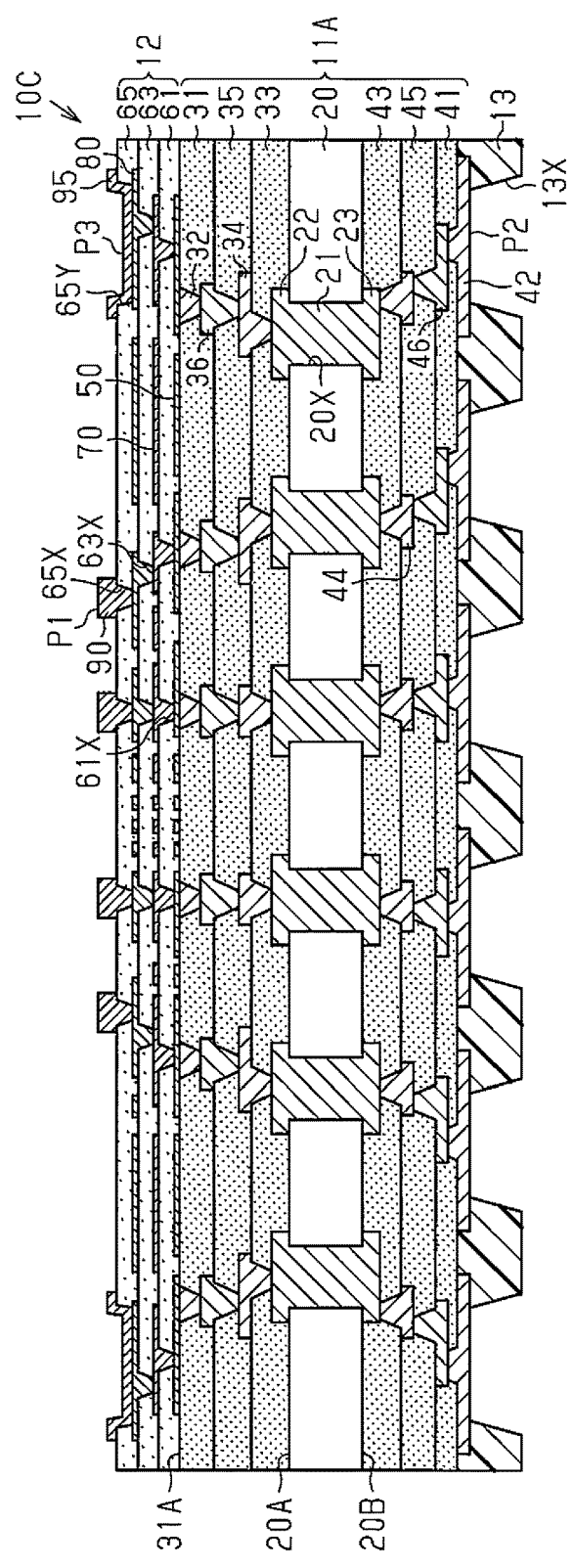
FIG. 36 is a schematic cross-sectional view illustrating a wiring substrate in a seventh embodiment.

As illustrated in FIG. 36, in the wiring substrate 10C, a wiring layer 95 including a connection pad P3 electrically connected with other wiring substrates and other semiconductor devices along with the wiring layer 90 including the pad P1 is arranged at the position of the uppermost layer of the wiring substrate 10A illustrated in FIG. 34.

The wiring layer 95 is formed in a plurality of through holes 65Y. Each through hole 65Y extends through the insulating layer 65 in the thickness-wise direction and exposes a portion of the upper surface of the wiring layer 80. Each through hole 65Y is formed in a region at an outer side of the through hole 65X. Each through hole 65Y has the shape of an inverted truncated cone, for example, in which the upper open end has a larger open diameter than the lower open end. The through hole 65Y has a smaller aspect ratio than the through hole 65X. The aspect ratio of the through hole 65X is, for example, approximately 0.05 to 0.1, and the aspect ratio of the through hole 65Y is, for example, approximately 0.01 to 0.02.

The wiring layer 95 is formed along the inner side surface and the bottom surface of each through hole 65Y, which has a small aspect ratio and extends to the upper surface of the insulating layer 65 from the through hole 65Y. In other words, the wiring layer 95 includes a recess-shaped connection pad P3 formed in the through hole 65Y.

Each connection pad P3 is, for example, formed in a region at the outer side of the pad P1. For example, the connection pads P3 are arranged along the peripheral portion in a plan view on the upper surface of the uppermost insulating layer 65. Each connection pad P3 may have any shape and any size. The planar shape of each connection pad P3 is, for example, formed to be greater than the planar shape of the pad P1. For example, the planar shape of each connection pad P3 is circular and has a diameter of approximately 120 to 170 μm.

Advantages (1) to (5) of the first embodiment are obtained even if the connection pad P3 is arranged on the uppermost wiring layer.

Figure 37:
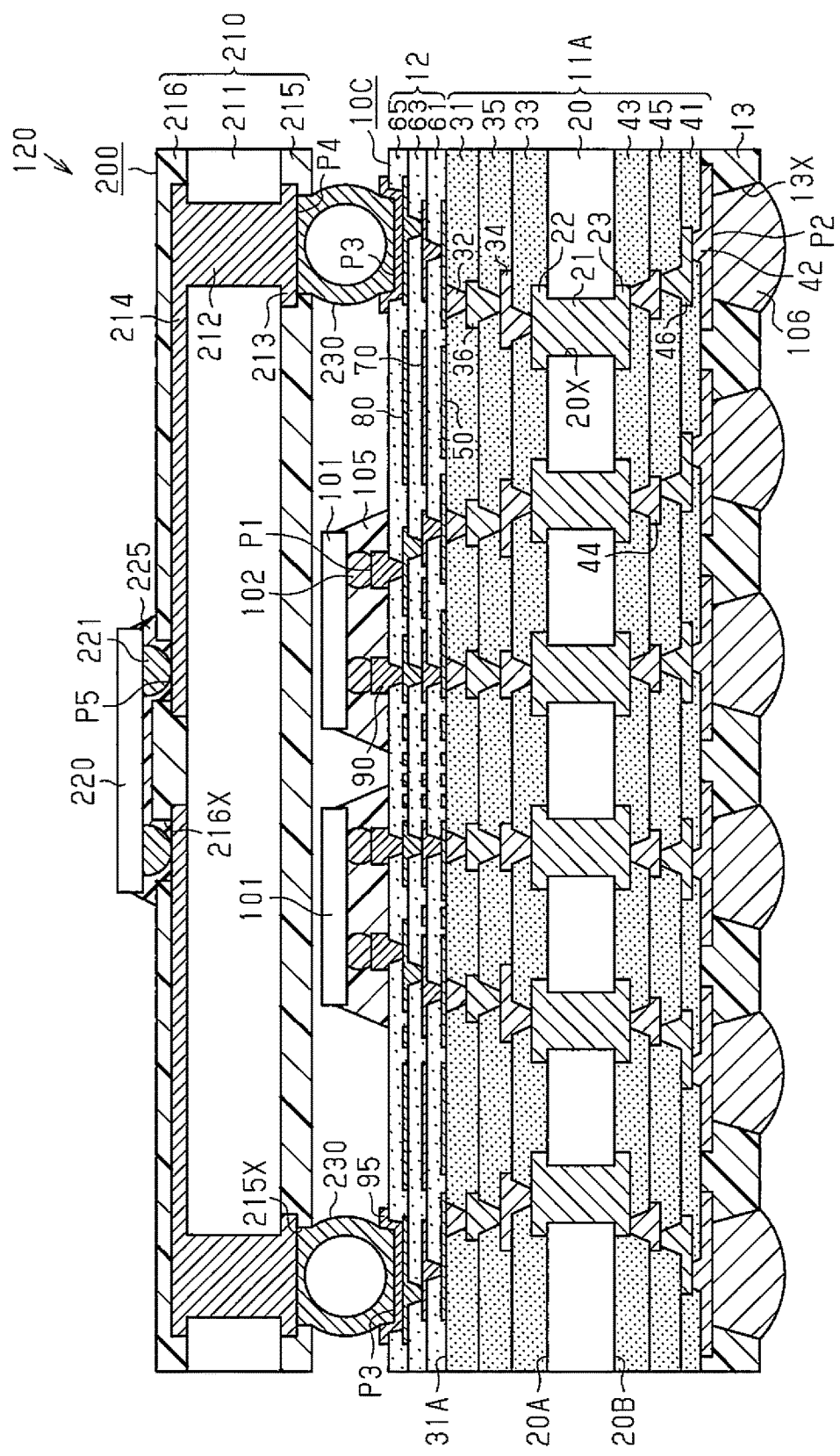
FIGS. 37 to 39 are schematic cross-sectional views illustrating various application examples of the wiring substrate in the seventh embodiment.
Figure 38:
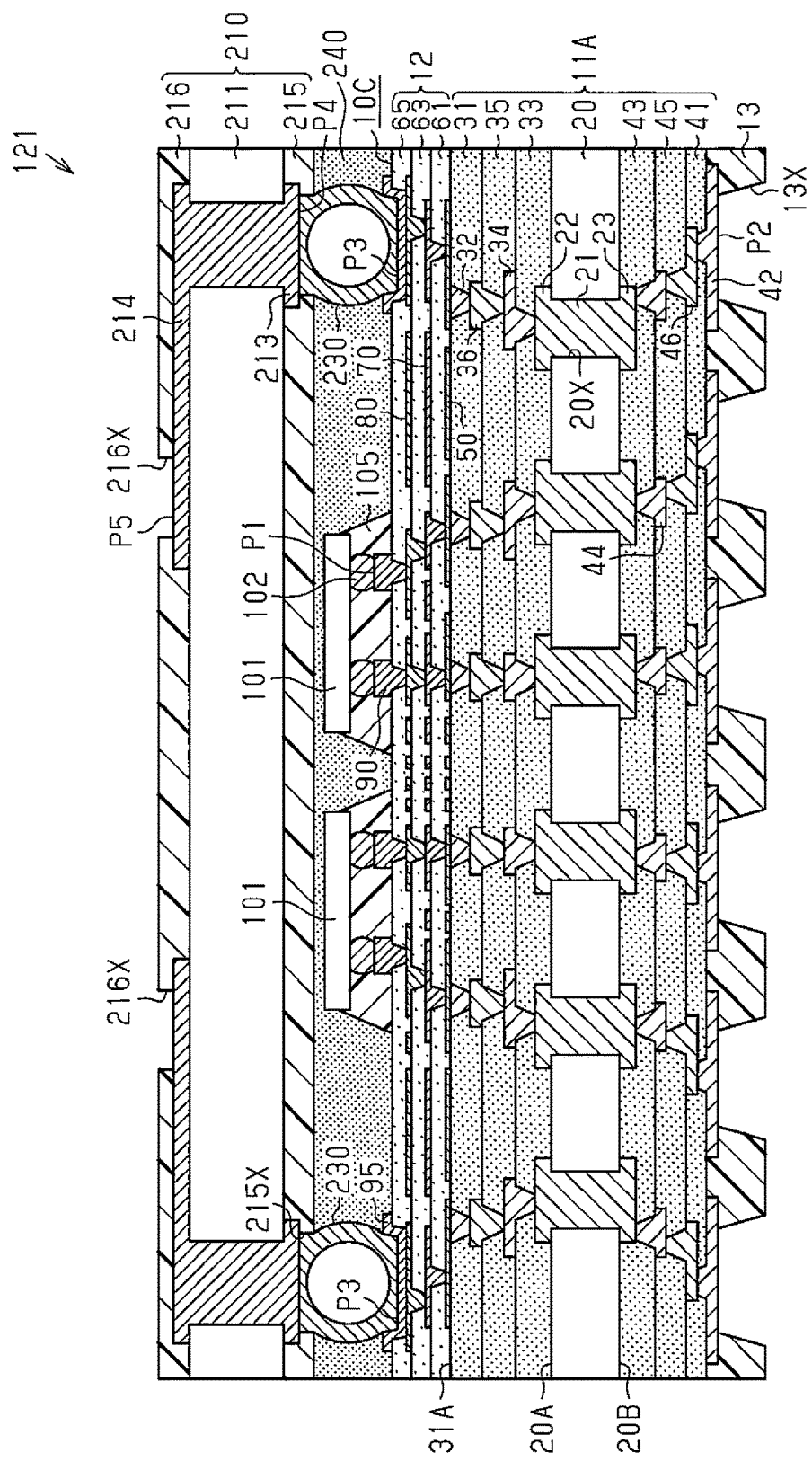
Figure 39:
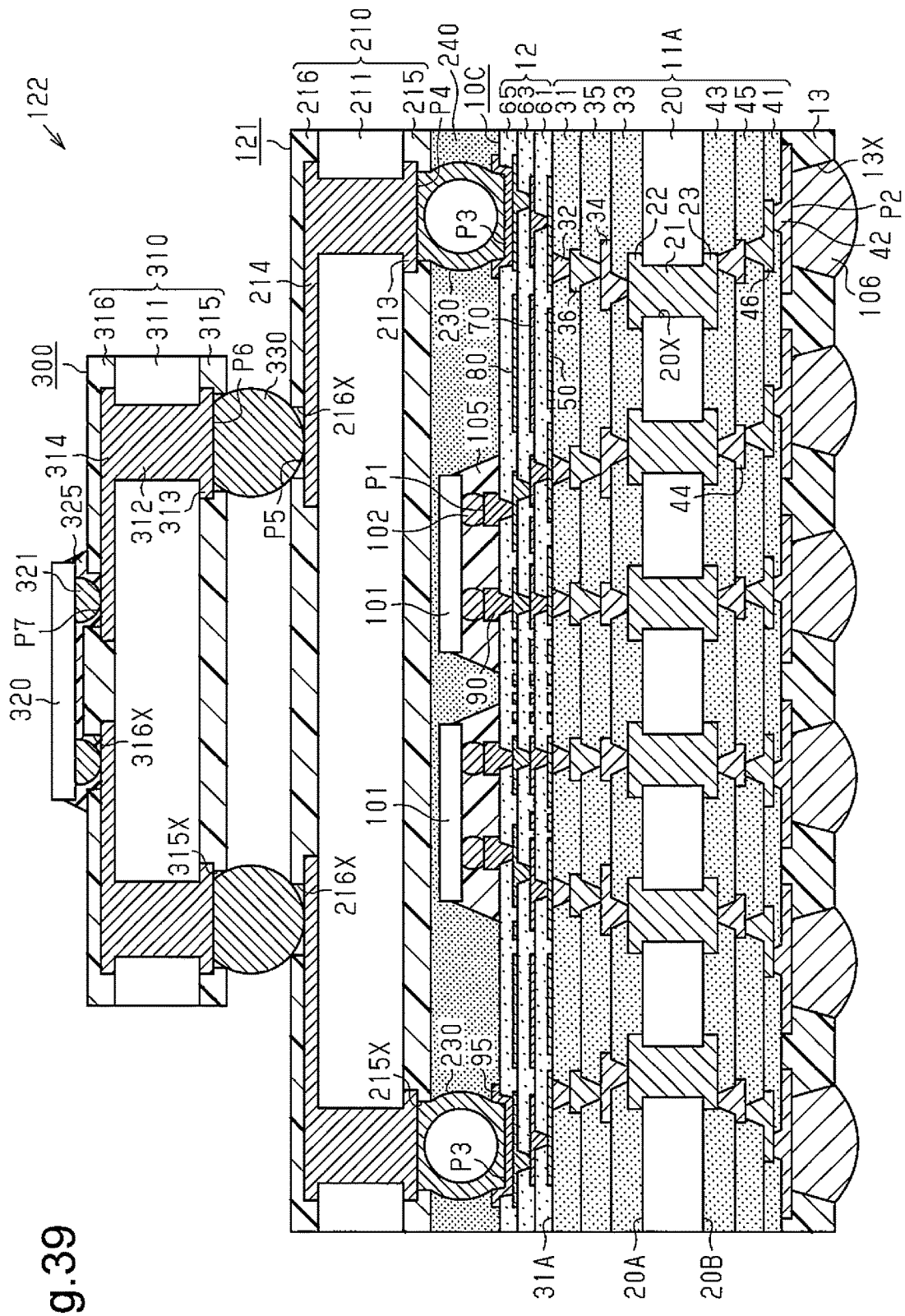

An application example of the wiring substrate 10C will now be described with reference to FIGS. 37 to 39.

First Application Example

First, a semiconductor device 120 in which another semiconductor package 200 is mounted on the wiring substrate 10C will be described with reference to FIG. 37.

The semiconductor device 120 includes the wiring substrate 10C, one or more (two in FIG. 37) semiconductor chips 101 mounted on the wiring substrate 10C, the semiconductor package 200 stacked and joined on the wiring substrate 10C, and the external connection terminal 106.

A structure of the semiconductor package 200 will now be briefly described.

The semiconductor package 200 includes a wiring substrate 210, one or more semiconductor chips 220 mounted on the wiring substrate 210, and an underfill resin 225 formed between the wiring substrate 210 and the semiconductor chip 220.

The wiring substrate 210 includes a core substrate 211, a through electrode 212 arranged in the core substrate 211, a lowermost wiring layer 213 formed on the lower surface of the core substrate 211, an uppermost wiring layer 214 formed on the upper surface of the core substrate 211, and solder resist layers 215, 216. The wiring layers 213, 214 are electrically connected to each other by the through electrode 212.

The solder resist layer 215 is stacked on the lower surface of the core substrate 211 to cover a part of the wiring layer 213. The solder resist layer 215 includes an opening 215X exposing a portion of the wiring layer 213 as a connection pad P4. The connection pad P4 is arranged to face the connection pad P3 of the wiring substrate 10C and is electrically connected to the connection pad P3.

The solder resist layer 216 is stacked on the upper surface of the core substrate 211 to cover a portion of the wiring layer 214. The solder resist layer 216 includes an opening 216X exposing a portion of the wiring layer 214 as a pad P5. The pad P5 functions as an electronic component mounting pad electrically connected to an electronic component such as a semiconductor chip, a passive element, and the like.

The wiring substrate 210 is not limited to the wiring substrate including the core substrate 211 and may be a coreless wiring substrate that does not include the core substrate 211.

The semiconductor chip 220 is flip-chip mounted on the wiring substrate 210. Bumps 221 arranged on a circuit formation surface (lower surface in FIG. 37) of the semiconductor chip 220 are joined to the pad P5 so that the semiconductor chip 220 is electrically connected to the wiring layer 214 by the bumps 221. The underfill resin 225 is formed in a gap between the flip-chip joined wiring substrate 210 and semiconductor chip 220.

Solder balls 230 are joined with the connection pad P3 of the wiring substrate 10C. The solder balls 230 are arranged between the wiring substrate 10C and the semiconductor package 200 and are joined with the connection pads P3, P4. Each solder ball 230 may be, for example, a conductive core ball (copper core ball, etc.) or a solder ball, in which the circumference of a resin core ball is covered with solder. Furthermore, a solder ball that does not include a core ball such as a conductive core ball, a resin core ball, and the like may be used as the solder ball 230.

Thus, the semiconductor device 120 has a POP (Package on Package) structure in which the wiring substrate 10C and the semiconductor package 200 are stacked and joined by the solder balls 230.

Second Application Example

An example in which the wiring substrate 10C is applied to an electronic component-incorporated substrate 121 will be described below according to FIG. 38.

The electronic component-incorporated substrate 121 includes the wiring substrate 10C, one or more (two in FIG. 38) semiconductor chips 101 mounted on the wiring substrate 10C, another wiring substrate 210 mounted on the wiring substrate 10C, and an encapsulation resin 240 formed between the wiring substrate 10C and the wiring substrate 210.

In the electronic component-incorporated substrate 121, the wiring substrate 10C and the wiring substrate 210 are stacked and joined by the solder balls 230. The space between the wiring substrate 10C and the wiring substrate 210 is filled by the encapsulation resin 240. The encapsulation resin 240, which fixes the wiring substrate 210 to the wiring substrate 10C, encapsulates the semiconductor chip 101 mounted on the wiring substrate 10C. In other words, the encapsulation resin 240 functions as an adhesive for adhering the wiring substrate 10C and the wiring substrate 210C. The encapsulation resin 240 also functions as a protective layer for protecting the semiconductor chip 101.

Therefore, in the electronic component-incorporated substrate 121, the semiconductor chip 101, which is the electronic component, is incorporated in the space between the wiring substrate 10C and the wiring substrate 210.

Third Application Example

A semiconductor device 122 in which another semiconductor package 300 is mounted on the electronic component-incorporated substrate 121 will now be described with reference to FIG. 39.

The semiconductor device 122 includes the electronic component-incorporated substrate 121 including the wiring substrate 10C, the semiconductor package 300 stacked and joined on the electronic component-incorporated substrate 121, and the external connection terminals 106. The pads P5 formed on the wiring substrate 210 of the electronic component-incorporated substrate 121 are electrically connected to other wiring substrates and other semiconductor devices.

The structure of the semiconductor package 300 will now be described.

The semiconductor package 300 includes a wiring substrate 310, one or more semiconductor chips 320 mounted on the wiring substrate 310, and an underfill resin 325 formed between the wiring substrate 310 and the semiconductor chip 320.

The wiring substrate 310 includes a core substrate 311, through electrodes 312 arranged in the core substrate 311, a lowermost wiring layer 313 formed on the lower surface of the core substrate 311, an uppermost wiring layer 314 formed on the upper surface of the core substrate 311, and solder resist layers 315, 316. The wiring layers 313, 314 are electrically connected to each other by the through electrodes 312.

The solder resist layer 315 is stacked on the lower surface of the core substrate 311 to cover a portion of the wiring layer 313. The solder resist layer 315 includes openings 315X exposing portions of the wiring layer 313 as connection pads P6. The connection pads P6 are arranged to face the pads P5 of the electronic component-incorporated substrate 121. The connection pads P6 are electrically connected to the pads P5.

The solder resist layer 316 is stacked on the upper surface of the core substrate 311 to cover a portion of the wiring layer 314. The solder resist layer 316 includes openings 316X for exposing portions of the wiring layer 314 as pads P7. The pads P7 function as electronic component mounting pads electrically connected to an electronic component such as a semiconductor chip, a passive element, or the like.

The wiring substrate 310 is not limited to the wiring substrate including the core substrate 311, and may be a coreless wiring substrate that does not include the core substrate 311.

The semiconductor chip 320 is flip-chip mounted on the wiring substrate 310. Bumps 321 arranged on a circuit formation surface (lower surface in FIG. 39) of the semiconductor chip 320 are joined with the pads P7 so that the semiconductor chip 320 is electrically connected to the wiring layer 314 by the bumps 321. The underfill resin 325 is formed in a gap between the flip-chip joined wiring substrate 310 and semiconductor chip 320.

The semiconductor package 300 is stacked and joined on the electronic component-incorporated substrate 121 by the solder balls 330. The solder balls 330 are arranged between the electronic component-incorporated substrate 121 and the semiconductor package 300. Further, the solder balls 330 are joined with the pads P5 of the electronic component-incorporated substrate 121 and with the connection pads P6.

It should be apparent to those skilled in the art that the present invention may be embodied in many other specific forms without departing from the spirit or scope of the invention. Particularly, it should be understood that the present invention may be embodied in the following forms.

The embodiments and the modifications described above may be combined. For example, the wiring structure 12 of the second to fourth embodiments may be stacked on the wiring structure 11A of the fifth embodiment. Furthermore, in the same manner as the wiring substrate 10C of the seventh embodiment, the connection pads P3 may be arranged on the uppermost wiring layer of the wiring substrate 10 in the first to fourth embodiments and its modifications or on the uppermost wiring layer of the wiring substrate 10B of the sixth embodiment.

In each embodiment described above, the thickness of the solder resist layer 13 is set to be greater than or equal to the thickness of the wiring structure 12. Instead, for example, the solder resist layer 13 may be thinner than the wiring structure 12.

In each embodiment described above, the upper end surface 32A of each via wiring 32 is flush with the upper surface 31A of the insulating layer 31. Instead, for example, the upper end surface 32A of the via wiring 32 may be recessed downward from the upper surface 31A of the insulating layer 31. Furthermore, the upper end surface 32A of the via wiring 32 may be projected upward from the upper surface 31A of the insulating layer 31.

The cross-sectional shape of the through hole formed in the wiring substrate 10, 10A to 10C of each embodiment and each modification described above is not particularly limited. For example, the through hole formed in the wiring substrate 10, 10A to 10C may be formed to be straight (substantially tetragonal in cross-sectional view).

The number of wiring layers and the number of insulating layers in the wiring structure 11, 11A, 11B in each embodiment and each modification described above may be changed. Further, the wiring method of the wiring layers and the like may be modified and changed in a variety of manners.

The number of wiring layers 50, 70, 80, 90 and the number of insulating layers 60 to 65 in the wiring structure 12, 12B in each embodiment and each modification described above my be changed. Further, the wiring method of the wiring layers 50, 70, 80, 90 and the like may be modified and changed in a variety of manners.

In the first embodiment and the application examples of the seventh embodiment, the semiconductor chip 101 is mounted on the wiring substrate 10, 10C. Instead of the semiconductor chip 101, for example, a chip component such as a chip capacitor, a chip resistor, a chip inductor may be mounted on the wiring substrate 10, 10C. Alternatively, an electronic component other than a semiconductor chip such as a crystal oscillator may be mounted on the wiring substrate 10, 10C. Furthermore, the electronic component such as the semiconductor chip 101 or the like may be mounted on each of the wiring substrates 10, 10A, 10B of the second to sixth embodiments.

The mounting technique (e.g., flip-chip mounting, wiring bonding mounting, solder mounting, or combination thereof) of the electronic component such as the semiconductor chip 101, the chip component, the crystal oscillator, and the like may be modified and changed in a variety of manners.

In each embodiment described above, the wiring layers arranged on the upper and lower surfaces of the core substrate 20 are electrically connected to each other by the through electrode 21 formed in the through hole 20X (or 20Y) of the core substrate 20. Instead, for example, a through hole plating layer may be applied to the wall of the through hole 20X (or 20Y) to serve as a through electrode, and the wiring layers on the upper and lower surfaces of the core substrate 20 may be electrically connected to each other by the through hole plating layer. In this case, the through hole plating layer defines a cavity in the through hole 20X (or 20Y), and the cavity may be filled with resin.

CLAUSES

This disclosure further encompasses various embodiments described below.

1. A method for manufacturing a wiring substrate, the method including:
   forming a first wiring structure; and
   stacking a second wiring structure on an upper surface of the first wiring structure, the second wiring structure having a higher wiring density than the first wiring structure;
   wherein the forming a first wiring structure includes
   forming a first insulating layer that covers a first wiring layer,
   forming a first through hole that extends through the first insulating layer in a thickness-wise direction and exposes an upper surface of the first wiring layer,
   forming a conductive layer that covers the upper surface of the first insulating layer, wherein the first through hole is filled with the conductive layer, and
   polishing the conductive layer and the upper surface of the first insulating layer to smoothen the upper surface of the first insulating layer and form a via wiring including an upper end surface exposed from the first insulating layer; and
   the stacking a second wiring structure includes
   forming a second wiring layer on the upper surface of the first insulating layer and the upper end surface of the via wiring by sequentially stacking a metal barrier film, a metal film, and a metal layer,
   roughening surfaces of the metal film and the metal layer selectively on the metal barrier film, and
   forming a second insulating layer on the upper surface of the first insulating layer to cover the second wiring layer; and
   the roughening includes roughening the surfaces of the metal film and the metal layer so that the surfaces of the metal film and the metal layer have a smaller surface roughness than the first wiring layer.

2. The method according to clause 1, wherein the roughening includes
   forming a resist layer on the first insulating layer, wherein the resist layer includes an opening pattern that exposes the second wiring layer in a region including a land and a solid pattern,
   roughening the surfaces of the metal film and the metal layer exposed from the opening pattern, and
   removing the resist layer.

3. The method according to clause 1, wherein
   the roughening includes
   forming a third insulating layer on the first insulating layer, wherein the third insulating layer includes a second through hole that exposes the second wiring layer in a region including a land and a solid pattern, and
   roughening the surfaces of the metal film and the metal layer exposed from the second through hole;
   the forming a second insulating layer includes forming the second insulating layer on the first insulating layer to cover the third insulating layer and the second wiring layer, wherein the second insulating layer includes a third through hole having a larger planar shape than the second through hole at a location overlapping the second through hole in a plan view; and
   the method further includes forming a third wiring layer after forming the second insulating layer, wherein the third wiring layer is electrically connected to the second wiring layer and includes a via wiring that fills the second through hole and the third through hole.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
   a first wiring structure; and
   a second wiring structure stacked on the first wiring structure,
   wherein the first wiring structure includes:
      a first wiring layer;
      a first insulating layer covering the first wiring layer, wherein the first insulating layer includes a first through hole that extends through the first insulating layer in a thickness-wise direction to expose an upper surface of the first wiring layer; and
      a via wiring including an upper end surface exposed from an upper surface of the first insulating layer, wherein the first through hole of the first insulating layer is filled with the via wiring,
   the second wiring structure includes:
      a protective film formed on the upper surface of the first insulating layer;
      a second wiring layer including a first wiring pattern, wherein the first wiring pattern is formed on the upper surface of the first insulating layer and the upper end surface of the via wiring; and
      a second insulating layer stacked on the upper surface of the first insulating layer and covering the second wiring layer,
   the second wiring structure has a wiring density that is higher than a wiring density of the first wiring structure, and the first wiring pattern of the second wiring layer comprises:
  a first metal barrier film formed on the upper surface of the first insulating layer and the upper end surface of the via wiring;
  a first metal film formed on the first metal barrier film; and
  a first metal layer formed on the first metal film,
  wherein the first metal layer includes an entirely roughened side surface and an entirely smooth side surface, and includes an upper surface comprising a partially roughened upper surface and a partially smooth upper surface,
the protective film is formed on the entirely smooth side surface of the first metal layer and the partially smooth upper surface of the first metal layer, and the partially roughened upper surface is partially attached to the second insulating layer,
each of the roughened side surface and the roughened upper surface of the first metal layer has a surface roughness that is smaller than a surface roughness of the first wiring layer, and
the first metal barrier film includes a peripheral portion that projects toward an outer side from the roughened side surface of the first metal layer.

2. The wiring substrate according to claim 1, wherein:
the first metal film includes an entirely roughened side surface and an entirely smooth side surface;
the roughened side surface of the first metal film has a surface roughness that is smaller than the surface roughness of the first wiring layer; and
the peripheral portion of the first metal barrier film projects toward the outer side from the roughened side surface of the first metal layer and the roughened side surface of the first metal film.

3. The wiring substrate according to claim 2, wherein the protective film is further formed along the smooth side surface of the first metal film and a side surface of the first metal barrier film.

4. The wiring substrate according to claim 1, wherein:
the second wiring layer further includes a second wiring pattern, the second wiring pattern comprising:
  a second metal barrier film formed on the upper surface of the first insulating layer;
  a second metal film formed on the second metal barrier film and including a roughened side surface; and
  a second metal layer formed on the second metal film and including a roughened side surface and a roughened upper surface,
  wherein each of the roughened side surface of the second metal layer and the roughened side surface of the second metal film has a surface roughness that is smaller than the surface roughness of the first wiring layer, and
  the second metal barrier film includes a peripheral portion that projects toward an outer side from the roughened side surface of the second metal layer and the roughened side surface of the second metal film.

5. The wiring substrate according to claim 4, wherein the second wiring pattern is a solid pattern formed as a power supply plane or a ground plane.

6. The wiring substrate according to claim 1, wherein:
the second wiring layer further includes a third wiring pattern, the third wiring pattern comprising:
  a third metal barrier film formed on the upper surface of the first insulating layer;
  a third metal film formed on the third metal barrier film and including a smooth side surface; and
  a third metal layer formed on the third metal film and including a smooth side surface and a smooth upper surface.

7. The wiring substrate according to claim 6, wherein the third metal barrier film includes a side surface that is flush with the smooth side surface of the third metal film and the smooth side surface of the third metal layer.

8. The wiring substrate according to claim 6, wherein the third wiring pattern is finer than the first wiring pattern.

9. The wiring substrate according to claim 6, wherein a second protective film is further formed along the smooth upper surface of the third metal layer, the smooth side surface of the third metal layer, the smooth side surface of the third metal film, and a side surface of the third metal barrier film to cover the third wiring pattern.

10. The wiring substrate according to claim 1, wherein the second wiring structure includes:
  a third insulating layer stacked on the upper surface of the first insulating layer to cover the second wiring layer, wherein the third insulating layer includes a second through hole that exposes a part of the second wiring layer;
  the second insulating layer stacked on the upper surface of the first insulating layer to cover the third insulating layer and the second wiring layer, wherein the second insulating layer includes a third through hole having a larger planar shape than the second through hole at a location overlapping the second through hole in a plan view; and
  a third wiring layer including a via wiring to fill the second through hole and the third through hole, wherein the third wiring layer is electrically connected to the second wiring layer and stacked on the second insulating layer.

11. The wiring substrate according to claim 1, wherein
the first insulating layer is a non-photosensitive insulative resin layer of which a main component is a thermosetting resin; and
the second insulating layer contains a photosensitive resin as a main component and is thinner than the first insulating layer.

12. A semiconductor device comprising:
a wiring substrate according to claim 1; and
a semiconductor chip mounted on the wiring substrate.

* * * * *